(12) United States Patent
Vayanos et al.

(10) Patent No.: US 8,175,090 B2
(45) Date of Patent: *May 8, 2012

(54) OUTER CODING METHODS FOR BROADCAST/MULTICAST CONTENT AND RELATED APPARATUS

(75) Inventors: Alkinoos Hector Vayanos, San Diego, CA (US); Francesco Grilli, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 998 days.

This patent is subject to a terminal disclaimer.

(21) Appl. No.: 11/947,642

(22) Filed: Nov. 29, 2007

(65) Prior Publication Data

US 2008/0151805 A1 Jun. 26, 2008

Related U.S. Application Data

(62) Division of application No. 10/922,424, filed on Aug. 19, 2004, now Pat. No. 7,318,187.

(60) Provisional application No. 60/497,457, filed on Aug. 21, 2003, provisional application No. 60/497,456, filed on Aug. 21, 2003.

(51) Int. Cl.
    *H04L 12/28* (2006.01)
(52) U.S. Cl. ........ 370/389; 370/312; 370/331; 370/394; 714/752; 455/436; 455/439
(58) Field of Classification Search ............... 370/312, 370/328, 331, 389, 394; 714/752–776; 455/436, 455/439
See application file for complete search history.

(56) References Cited

U.S. PATENT DOCUMENTS

| 4,901,307 | A | 2/1990 | Gilhousen et al. |
| 4,907,307 | A | 3/1990 | Weitzler |
| 5,103,459 | A | 4/1992 | Gilhousen et al. |
| 5,257,399 | A | 10/1993 | Kallin et al. |
| 5,305,311 | A | 4/1994 | Lyles |

(Continued)

FOREIGN PATENT DOCUMENTS

CN 1311613 A 9/2001

(Continued)

OTHER PUBLICATIONS

Agashe P: "CDMA2000 High Rate Broadcast Packet Data Air Interface Simultation Results" 3GPP2 TSG-C CDMA2000 Meeting, Jul. 9, 2002, p. 9.

(Continued)

*Primary Examiner* — Christopher Grey
(74) *Attorney, Agent, or Firm* — Roberta A. Young; John J. Ketchum

(57) ABSTRACT

Transmission techniques are provided that improve service continuity and reduce interruptions in delivery of content that can be caused by transitions that occur when the User Equipment (UE) moves from one cell to the other, or when the delivery of content changes from a Point-to-Point (PTP) connection to a Point-to-Multipoint (PTM) connection in the same serving cell, and vice-versa. Such transmission techniques enable seamless delivery of content across cell borders and/or between different transmission schemes such as Point-to-Multipoint (PTM) and Point-to-Point (PTP). Mechanisms for adjusting different streams and for recovering content from each data block during such transitions are also provided so that data is not lost during a transition. In addition, mechanisms for realigning data during decoding at a receiving terminal are also provided.

9 Claims, 24 Drawing Sheets

U.S. PATENT DOCUMENTS

| | | | |
|---|---|---|---|
| 5,371,734 A | 12/1994 | Fischer | |
| 5,432,800 A | 7/1995 | Kuroda et al. | |
| 5,504,773 A | 4/1996 | Padovani et al. | |
| 5,557,614 A | 9/1996 | Sandler et al. | |
| 5,563,895 A | 10/1996 | Malkamaki et al. | |
| 5,574,979 A | 11/1996 | West | |
| 5,602,833 A | 2/1997 | Zehavi | |
| 5,608,722 A | 3/1997 | Miller | |
| 5,640,420 A | 6/1997 | Jung | |
| 5,691,974 A | 11/1997 | Zehavi et al. | |
| 5,709,541 A | 1/1998 | Gensler et al. | |
| 5,734,962 A | 3/1998 | Hladik et al. | |
| 5,751,725 A | 5/1998 | Chen | |
| 5,754,605 A | 5/1998 | Chong et al. | |
| 5,757,767 A | 5/1998 | Zehavi | |
| 5,774,496 A | 6/1998 | Butler et al. | |
| 5,790,541 A | 8/1998 | Patrick et al. | |
| 5,844,918 A | 12/1998 | Kato | |
| 5,883,888 A | 3/1999 | St-Pierre | |
| 5,886,654 A | 3/1999 | Ichikawa et al. | |
| 5,920,817 A | 7/1999 | Umeda et al. | |
| 5,995,517 A | 11/1999 | Tomida et al. | |
| 5,999,816 A | 12/1999 | Tiedemann, Jr. et al. | |
| 6,009,086 A | 12/1999 | Freeburg et al. | |
| 6,012,088 A | 1/2000 | Li et al. | |
| 6,091,777 A | 7/2000 | Guetz et al. | |
| 6,128,287 A | 10/2000 | Freeburg et al. | |
| 6,128,528 A | 10/2000 | Ericksen et al. | |
| 6,134,440 A | 10/2000 | Black | |
| 6,202,189 B1 | 3/2001 | Hinedi et al. | |
| 6,208,873 B1 | 3/2001 | Black et al. | |
| 6,233,439 B1 | 5/2001 | Jalali | |
| 6,240,288 B1 | 5/2001 | Wan et al. | |
| 6,256,300 B1 | 7/2001 | Ahmed et al. | |
| 6,263,204 B1 | 7/2001 | Kusaki et al. | |
| 6,278,716 B1 | 8/2001 | Rubenstein et al. | |
| 6,300,864 B1 | 10/2001 | Willey | |
| 6,307,844 B1 | 10/2001 | Tsunehara et al. | |
| 6,308,079 B1 | 10/2001 | Pan et al. | |
| 6,353,637 B1 | 3/2002 | Mansour et al. | |
| 6,359,874 B1 | 3/2002 | Dent | |
| 6,405,039 B1 | 6/2002 | Koorapaty et al. | |
| 6,414,945 B1 | 7/2002 | Chennakeshu et al. | |
| 6,414,946 B1 | 7/2002 | Satou et al. | |
| 6,484,283 B2 | 11/2002 | Stephen et al. | |
| 6,498,936 B1 | 12/2002 | Raith | |
| 6,516,435 B1 | 2/2003 | Tsunoda | |
| 6,532,562 B1 | 3/2003 | Chou et al. | |
| 6,574,211 B2 | 6/2003 | Padovani et al. | |
| 6,601,208 B2 | 7/2003 | Wu | |
| 6,606,037 B2 | 8/2003 | Ekstrand et al. | |
| 6,611,690 B1 | 8/2003 | Moulsley et al. | |
| 6,628,924 B1 | 9/2003 | Miyamoto | |
| 6,658,005 B2 | 12/2003 | Seidel et al. | |
| 6,665,522 B1 | 12/2003 | Lundstrom et al. | |
| 6,677,864 B2 | 1/2004 | Khayrallah | |
| 6,690,659 B1 | 2/2004 | Ahmed et al. | |
| 6,694,474 B2 | 2/2004 | Ramprashad et al. | |
| 6,707,801 B2 | 3/2004 | Hsu | |
| 6,718,160 B2 | 4/2004 | Schmutz | |
| 6,718,180 B1 | 4/2004 | Lundh et al. | |
| 6,725,043 B2 | 4/2004 | Bonta et al. | |
| 6,728,226 B1 | 4/2004 | Naito | |
| 6,728,514 B2 | 4/2004 | Bandeira et al. | |
| 6,731,936 B2 | 5/2004 | Chen et al. | |
| 6,751,209 B1 | 6/2004 | Hamiti et al. | |
| 6,754,495 B2 | 6/2004 | Kusaki et al. | |
| 6,765,896 B1 | 7/2004 | Ahmed et al. | |
| 6,771,670 B1 | 8/2004 | Pfahler et al. | |
| 6,778,558 B2 | 8/2004 | Balachandran et al. | |
| 6,781,976 B1 | 8/2004 | Sonning et al. | |
| 6,791,963 B1 * | 9/2004 | Hwang et al. | 370/342 |
| 6,804,223 B2 | 10/2004 | Hoffmann et al. | |
| 6,839,356 B2 | 1/2005 | Barany et al. | |
| 6,873,621 B2 | 3/2005 | Kamoi et al. | |
| 6,895,019 B2 | 5/2005 | Gibson et al. | |
| 6,901,083 B2 | 5/2005 | Wei et al. | |
| 6,909,702 B2 | 6/2005 | Leung et al. | |
| 6,947,407 B2 | 9/2005 | Ayyagari et al. | |
| 6,959,199 B2 | 10/2005 | Ohkubo et al. | |
| 6,963,540 B2 | 11/2005 | Choi et al. | |
| 6,980,820 B2 | 12/2005 | Sinnarajah et al. | |
| 6,983,166 B2 | 1/2006 | Shiu et al. | |
| 6,986,092 B2 | 1/2006 | Butler et al. | |
| 6,996,069 B2 | 2/2006 | Willenegger | |
| 7,000,174 B2 | 2/2006 | Mantha et al. | |
| 7,016,327 B2 | 3/2006 | Grilli et al. | |
| 7,016,686 B2 | 3/2006 | Spaling et al. | |
| 7,020,109 B2 | 3/2006 | Grilli et al. | |
| 7,061,327 B2 | 6/2006 | Doy | |
| 7,103,279 B1 | 9/2006 | Koh et al. | |
| 7,164,650 B2 | 1/2007 | Kim et al. | |
| 7,177,658 B2 | 2/2007 | Willenegger et al. | |
| 7,197,317 B2 | 3/2007 | Parkvall et al. | |
| 7,233,572 B2 | 6/2007 | Kim et al. | |
| 7,242,922 B2 | 7/2007 | Fieldhouse et al. | |
| 7,242,933 B1 | 7/2007 | Ahmavaara | |
| 7,317,697 B2 | 1/2008 | Lewis et al. | |
| 7,318,187 B2 * | 1/2008 | Vayanos et al. | 714/776 |
| 7,376,438 B2 * | 5/2008 | Shiu et al. | 455/522 |
| 7,436,857 B2 | 10/2008 | Fong et al. | |
| 7,460,562 B2 | 12/2008 | Dupuy et al. | |
| 7,509,127 B2 * | 3/2009 | Wang et al. | 455/439 |
| 7,583,977 B2 * | 9/2009 | Willenegger et al. | 455/522 |
| 7,593,746 B2 * | 9/2009 | Willenegger et al. | 455/522 |
| 7,702,990 B2 | 4/2010 | Rhee et al. | |
| 2001/0027112 A1 | 10/2001 | Voyer | |
| 2001/0046262 A1 | 11/2001 | Freda | |
| 2002/0155839 A1 | 10/2002 | Nisbet | |
| 2002/0159482 A1 | 10/2002 | Hans et al. | |
| 2003/0035389 A1 | 2/2003 | Chen et al. | |
| 2003/0072384 A1 | 4/2003 | Chen et al. | |
| 2003/0100269 A1 | 5/2003 | Lehtinen et al. | |
| 2003/0123389 A1 | 7/2003 | Russell et al. | |
| 2003/0134655 A1 | 7/2003 | Chen et al. | |
| 2003/0139140 A1 | 7/2003 | Chen et al. | |
| 2005/0195760 A1 | 9/2005 | Lee et al. | |
| 2008/0098283 A1* | 4/2008 | Vayanos et al. | 714/774 |
| 2008/0141094 A1* | 6/2008 | Vayanos et al. | 714/751 |
| 2008/0141097 A1* | 6/2008 | Vayanos et al. | 714/755 |
| 2010/0172279 A1* | 7/2010 | Chen et al. | 370/312 |

FOREIGN PATENT DOCUMENTS

| | | |
|---|---|---|
| CN | 1329799 | 1/2002 |
| EP | 0938207 | 8/1999 |
| EP | 0996292 A1 | 4/2000 |
| EP | 1067704 | 1/2001 |
| JP | 2145038 A | 6/1990 |
| JP | 5167616 A | 7/1993 |
| JP | 07087099 | 3/1995 |
| JP | 9102745 | 4/1997 |
| JP | 10098507 A | 4/1998 |
| JP | 10200595 | 7/1998 |
| JP | 2000115138 A | 4/2000 |
| JP | 2000224226 A | 8/2000 |
| JP | 2002016502 | 1/2002 |
| JP | 2002064474 | 2/2002 |
| JP | 2002101136 | 4/2002 |
| JP | 2002237864 A | 8/2002 |
| JP | 2003204336 A | 7/2003 |
| JP | 2005515697 T | 5/2005 |
| JP | 2006501696 A | 1/2006 |
| KR | 1020000038863 | 7/2000 |
| KR | 100365613 | 8/2001 |
| KR | 200191910 | 10/2001 |
| TW | 492262 | 6/2002 |
| TW | 556414 | 10/2003 |
| WO | WO9950963 | 10/1999 |
| WO | WO0021316 A2 | 4/2000 |
| WO | WO0049748 A1 | 8/2000 |
| WO | WO0077948 A1 | 12/2000 |
| WO | WO0105059 A1 | 1/2001 |
| WO | WO03030473 | 4/2003 |
| WO | WO03049294 | 6/2003 |
| WO | 03096149 | 11/2003 |

OTHER PUBLICATIONS

Boyce, Jill M.: "Packet loss resilient transmission of MPEG video over the Internet" Signal Processing: Image Communication, Elsevier Science Publishers, Amsterdam, NL, vol. 15, No. 1-2, Sep. 1999, pp. 7-24, XP004180635.

Enderle N et al: "Radio Link Control-Acknowledged Mode Protocol Performance Modeling in Units" MWCN 2002, 4th IEEE Conference on Mobile and Wireless Communications, Sep. 9, 2002 pp. 332-336.

Ericsson "Bit rate and retransmission aspects for p-t-m MBMS in GERAN" 3GPP TSG GERAN-15 Jun. 27, 2003, XP002312408.

International Preliminary Report on Patentability PCT/US04/027223, IPEA/US—Apr. 28, 2006.

International Search Report—PCT/US04/027223, International Search Authority—European Patent Office—Jan. 27, 2005.

Kalliokulju, J: "User plane architecture of 3rd generation mobile telecommunication network" IEEE International Conference on Networks. ICON. Proceedings of ICON, XX, XX, Sep. 28, 1999, pp. 270-278, XP010354980.

McCauley, Anthony J. "Reliable Broadband Communication Using a Burst Erasure Correcting Code" Computer Communication Review, Association for Computing Machinery, New York, U.S. vol. 20, No. 4, Sep. 1, 1990, pp. 297-306, XP000168063.

Qualcomm "Transition between PtP and PtM in MBMS" 3GPP TSG-RAN2-37 Aug. 29, 2003, XP002312407.

Qualcomm: "MBMS design considerations" 3GPP TSG RAN WG1-28, Aug. 22, 2002, XP002312411.

Qualcomm: "On support for Outer coding" 3GPP TSG-RAN 1-29 Nov. 8, 2002. XP002312410.

Siemens: "Threshold for p-t-m MBMS delivery" 3GPP TSG GERAN-14 Apr. 11, 2003, XP002312409.

Wang, Guijin, et al. Error Protection for Scalable mage Over 3G-IP Network, Proceedings 2002 International Conference on Image Processing, ICIP 2002 Rochester, NY, Sep. 22-25, 2002, IEEE, US, vol. 2 of 3, pp. 733-736, XP010608076.

Written Opinion—PCT/US04/027223, International Search Authority—European Patent Office—Jan. 27, 2005.

3GPP TSG-RAN2 Meeting #37 "Transition between PtP and PtM in MBMS" R2-031805, Budapest, Hungary, Aug. 25-29, 2003, pp. 1-6.

3GPP2 C.S000-2-C. "Physical Layer Standard for cdma2000 Spread Spectrum Systems", version 1.0, Release C, May 28, 2002.

3rd Generation Partnership Project; Technical Specification 25.11 V.5.0.0, Group Radio Access Network, Mar. 2002.

Aikawa et al: "Forward Error Correction Schemes for Wireless ATM Systems" 1996 IEEE International Conference on Communications (ICC). Converging Technologies for Tomorrow's Applications. Dallas, Jun. 23-27, 1996, pp. 454-458, XP000625714, ISBN:0-7803-3.

Cheung et al: "Combined Framing and Error Correction Coding for DS3 Signal Format" IEEE Transactions on Communications, IEEE Inc. New York, NY USA, vol. 43, No. 2/4, Part 3, (Feb. 1, 1995), pp. 1365-1374, XP000505632 ISSN:0090-6778.

"Comparative Evaluations on Multicast Error Recovery Methods over Wireless LAN" Docomo, Year 2003, pp. 229 to 232.

ETSI TS 125 211 v 5.1.0; "Universal Mobile Telecommunications System (UMTS); Physical channels and mapping of transport channels onto physical channels (FDD)", 3GPP TS 25.211, version 5.1.0 Release 5 (Jun. 2002).

ETSI TS 125 212 v5.1.0; "Universal Mobile Telecommunications System (UMTS); Multiplexing and channel coding (FDD)", 3G TS 25.212 version 5.1.0 Release 5 (Jun. 2002).

ETSI TS 125 213 v5.1.0; "Universal Mobile Telecommunications System (UMTS); Spreading and modulation (FDD)", 3G TS 25.213, version 5.1.0 Release 5 (Jun. 2002).

ETSI TS 125 214 v5.1.0; "Universal Mobile Telecommunications System (UMTS); Physical layer procedures (FDD)", 3G TS 25.214, version 5.1.0 Release 5 (Jun. 2002).

Kinoshita S., "A Survey of Reliable Multicast Technology", The Transactions Of The Institute Of Electronics, Information And Communication Engineers, 2002, vol. J85-B No. 11 pp. 1819 to 1842.

Kinoshita S., "A Survey of Reliable Multicast", The Institute Of Electronics, Information And Communication Engineers, Technical Report Of IEICE, IN2000-20(May 2000), pp. 25-32.

Telecommunications Industry Association, "Mobile Station-Base Station Compatibility Standard for Dual-Mode Wideband Spread Spectrum Cellular System," TIA/EIA-95, Jul. 1993.

The Special Interest Group Notes of IPSJ (IPSJ SIG Notes), 2001-QAI-1-23.

TIA/EIA/IS-856-A, cdma2000 High Rate Packet Data Air Interface Specification, (Revision of TIA/EIA/IS-856), Apr. 2004.

Xu Bo, "Throughput Performance Analysis for GPRS," Tianjin Communications Technology, CN, No. 3, Sep. 2001, pp. 18-24.

3GPP TSG-RAN WG2 meeting #37, R2-031812, "FEC Layer Proposal", Aug. 25-29, 2003, Sophia Antipolis, France.

* cited by examiner

(12) United States Patent

OUTER CODING METHODS FOR BROADCAST/MULTICAST CONTENT AND RELATED APPARATUS

CLAIM OF PRIORITY UNDER 35 U.S.A. §119

The present Application for Patent is a divisional of patent application Ser. No. 10/922,424 entitled "Outer Coding Methods For Broadcast/Multicast Content and Related Apparatus" filed Aug. 18, 2004, pending, which claims priority to Provisional Application No. 60/497,457 entitled "Method and Apparatus for Seamless Delivery of Broadcast and Multicast Content Across Cell Borders and/or Between Different Transmission Schemes" filed Aug. 21, 2003 and Provisional Application No. 60/497,456 entitled "L2 Design for Outer Coding Scheme" filed Aug. 21, 2003, both of which can be assigned to the assignee hereof and hereby expressly incorporated by reference herein.

REFERENCE TO CO-PENDING APPLICATIONS FOR PATENT

The present Application for Patent is related to the following co-pending U.S. Patent Applications:

"Outer Coding Methods For Broadcast/Multicast Content and Related Apparatus" by Alkinoos Hector Vayanos and Francesco Grilli, application Ser. No. 11/947,611, filed concurrently herewith, assigned to the assignee hereof, and expressly incorporated by reference herein;

"Outer Coding Methods For Broadcast/Multicast Content and Related Apparatus" application Ser. No. 11/947,665, filed concurrently herewith, assigned to the assignee hereof, and expressly incorporated by reference herein; and "Outer Coding Methods For Broadcast/Multicast Content and Related Apparatus" application Ser. No. 11/947,699, filed concurrently herewith, assigned to the assignee hereof, and expressly incorporated by reference herein.

BACKGROUND

1. Field

The present invention relates generally to communication systems, and more specifically to delivery of broadcast and multicast content.

2. Background

Wireless communication systems have traditionally been used to carry voice traffic and low data rate non-voice traffic. Today wireless communication systems are being implemented that also carry high data rate (HDR) multimedia traffic, such as video, data, and other types of traffic. Multimedia Broadcast and Multicast Service (MBMS) channels may be used to transmit streaming applications based on voice, audio and video data sources such as, radio broadcasts, television broadcasts, movies, and other types of audio or video content. Streaming data sources can tolerate delay and a certain amount of loss or bit errors, since these sources are sometimes intermittent and typically compressed. As such, the data-rate of transmissions arriving at the Radio Access Network (RAN) can be highly variable. Because application buffers are typically finite, the MBMS transmission mechanisms are needed that support variable source data-rates.

Base stations typically provide such multimedia traffic services to the subscriber stations by transmitting an information signal that can be often organized into a plurality of packets. A packet may be a group of bytes, including data (payload) and control elements, that are arranged into a specific format. The control elements may comprise, for example, a preamble and a quality metric that can include a cyclical redundancy check (CRC), parity bit(s), and other types of metrics. The packets are usually formatted into a message in accordance with a communication channel structure. The message travels between the origination terminal and the destination terminal, and can be affected by characteristics of the communication channel, such as, signal-to-noise ratio, fading, time variance, and other such characteristics. Such characteristics can affect the modulated signal differently in different communication channels. Among other considerations, transmission of a modulated information signal over a wireless communication channel requires selection of appropriate methods for protecting the information in the modulated signal. Such methods may comprise, for example, encoding, symbol repetition, interleaving, and other methods known to one of ordinary skill in the art. However, these methods increase overhead. Therefore, an engineering compromise between reliability of message delivery and the amount of overhead must be made.

The operator typically selects either a Point-to-Point (PTP) connection or a Point-to-Multipoint (PTM) connection on a cell by cell basis depending on the number of subscriber stations or User Equipment (UE) interested in receiving the MBMS content.

Point-to-Point (PTP) transmission uses dedicated channels to send the service to selected users in the coverage area. A "dedicated" channel carries information to/from a single subscriber station. In Point-to-Point (PTP) transmissions a separate channel can be used for transmission to each mobile station. Dedicated user traffic for one user service in the forward link or downlink direction can be sent, for example, through a logical channel called the Dedicated Traffic Channel (DTCH). Point-to-Point (PTP) communication services are typically most efficient, for example, if there are not enough users demanding a specific Multimedia Broadcast and Multicast Service (MBMS) in the coverage area. In such cases, Point-to-Point (PTP) transmission may be used in which the base station transmits the service only to the specific users who have requested the service. For example, in WCDMA systems it can be more efficient to use a dedicated channel or Point-to-Point (PTP) transmission until there are more than a predetermined number of mobile stations.

A "broadcast communication" or "Point-to-Multipoint (PTM) communication" is a communication over a common communication channel to a plurality of mobile stations. A "common" channel carries information to/from multiple subscriber stations, and may be simultaneously used by several terminals. In a Point-to-Multipoint (PTM) communication service, a cellular base station may broadcast multimedia traffic service on a common channel if, for example, the number of users demanding the service exceeds a predetermined threshold number within the coverage area of the base station. In CDMA 2000 systems, broadcast or Point-to-Multipoint (PTM) transmission is typically used in lieu of the PtP transmission, since the PtM radio bearer is almost as efficient as the PtP radio bearer. Common channel transmissions from a particular base station may not necessarily be synchronized with common channel transmissions from other base stations. In a typical broadcast system one or more central stations serve content to a (broadcast net of users). The central station(s) can transmit information to either all subscriber stations or to a specific group of subscriber stations. Each subscriber station interested in a broadcast service monitors a common forward link signal. Point-to-Multipoint (PTM) transmissions can be sent on a downlink or forward common channel. This common broadcast forward link signal is typically broadcast on a unidirectional channel, such as the Common Traffic Channel (CTCH) that exists in the forward link or "downlink" direction. Because this channel is unidirectional, the subscriber station generally does not communicate with the base station since allowing all subscriber units to communicate back to the base station might overload the communication system. Thus, in the context of Point-to-Multipoint (PTM) communication services, when there is an error in the information received by the subscriber stations, the subscriber stations may not be able to communicate back to the base station. Consequently, other means of information protection can be desirable.

In CDMA 2000 systems, the subscriber station can soft combine in Point-to-Multipoint (PTM) transmission. Even when steps are taken to protect the information signal, the conditions of the communication channel can degrade such that the destination station cannot decode some of the packets transferred over dedicated channels. In such cases, one approach can be to simply re-transmit the non-decoded packets using an Automatic Retransmission reQuest (ARQ) made by the destination (subscriber) station to the origination (base) station. Retransmission helps ensure delivery of the data packet. In the event the data can not be delivered correctly, the user of RLC at the transmitting side can be notified.

The subscriber station typically undergoes transitions in a number of scenarios. These transitions can be classified in different ways. For example, transitions may be classified as "cross transitions" and "direct transitions." Transitions can also be classified as "inter-cell" transitions and "intra-cell" transitions.

Transitions between cells or transmission schemes can result in service interruption that can be undesirable to users. Problems may arise when the subscriber station or User Equipment (UE) moves from one cell to the other or when the delivery of Multimedia Broadcast and Multicast Service (MBMS) content changes from one mode to another mode in the serving cell. Transmissions from neighboring cells may be time-shifted with respect to one another by an amount $\Delta t1$. Moreover, additional delay can be introduced during a transition since the mobile station needs to determine system information in the target cell, which requires a certain amount of processing time $\Delta t2$. The data streams transmitted from different cells (or different transport channel types Point-to-Point (PTP)/Point-to-Multipoint (PTM)) may be offset relative to one another. Therefore, during Point-to-Multipoint (PTM) transmissions from different cells, the mobile station may receive the same block of content twice or some blocks of content may be lost, which can be undesirable in terms of Quality of Service. Transitions between cells and/or between Point-to-Point (PTP) transmission and Point-to-Multipoint (PTM) transmission could cause an interruption in service, depending on the duration of the transition and on the delay or misalignment between transmissions.

There is therefore a need in the art for transmission techniques that will provide service continuity and reduce interruptions in delivery of content that can be caused by transitions that occur when the User Equipment (UE) moves from one cell to the other, or caused by transitions that occur when the delivery of content changes from a Point-to-Point (PTP) connection to a Point-to-Multipoint (PTM) connection in the same serving cell, and vice-versa. Such transmission techniques would preferably enable seamless delivery of content across cell borders and/or between different transmission schemes such as Point-to-Multipoint (PTM) and Point-to-point (PTP). Mechanisms for adjusting different streams and for recovering content from each data block during such transitions are also desirable so that data is not lost during a transition. It would also be desirable to provide mechanisms for realigning data during decoding at a receiving terminal.

DETAILED DESCRIPTION

Figure 1:
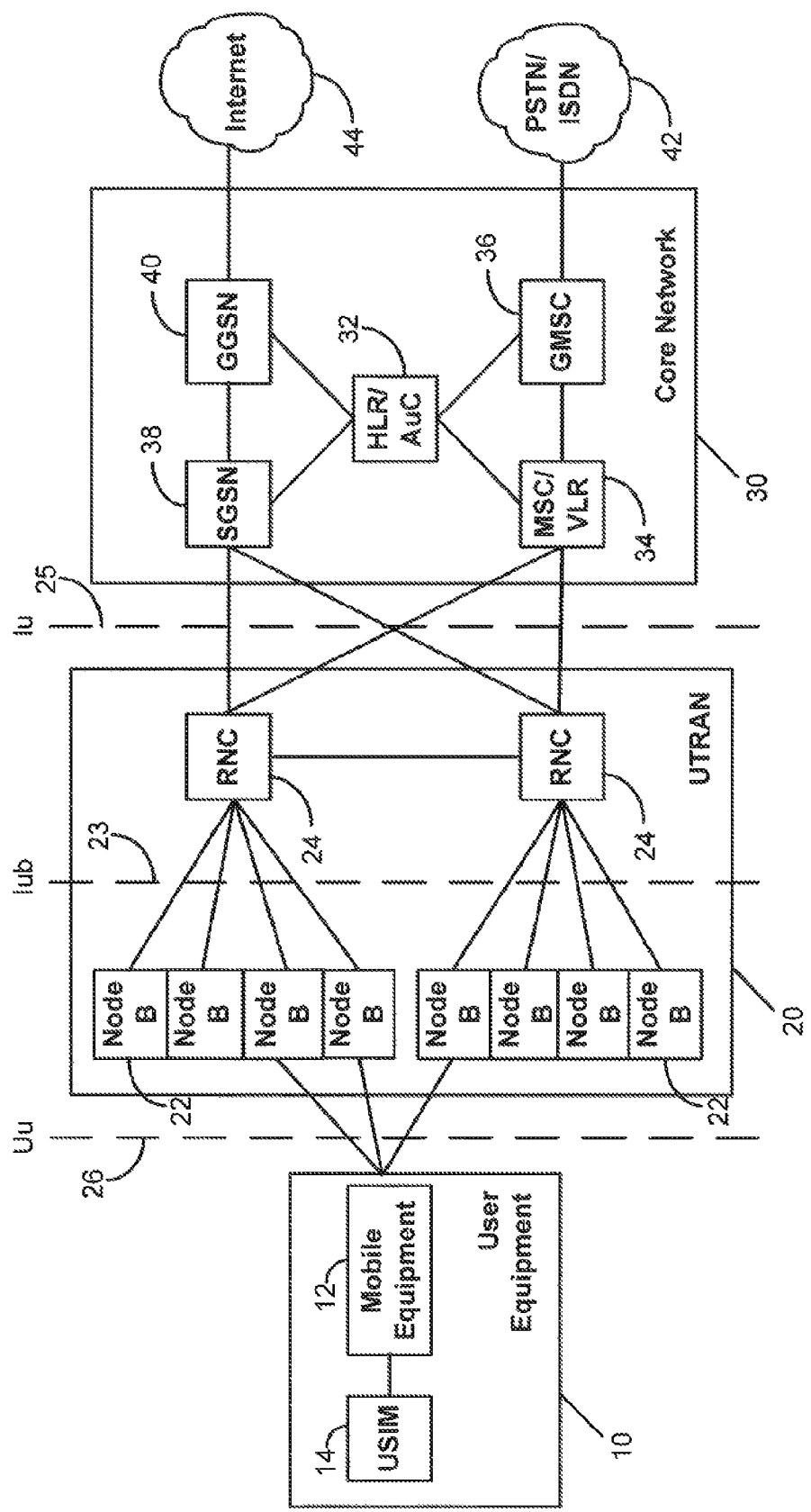
FIG. 1 is a diagram of a communication system.

The word "exemplary" is used herein to mean "serving as an example, instance, or illustration." Any embodiment described herein as "exemplary" is not necessarily to be construed as preferred or advantageous over other embodiments.

The term "mobile station" is used herein interchangeably with the terms "destination station," "subscriber station," "subscriber unit," "terminal" and "User Equipment (UE)," and is used herein to refer to the hardware, such as a base station, with which an access network, such as the UMTS Terrestrial Radio Access Network (UTRAN), communicates. In UMTS systems, the User Equipment (UE) is a device that allows a user to access UMTS network services and also preferably includes a USIM that contains all of a user's subscription information. A mobile station may be mobile or stationary, and can generally include any communicator, data device or terminal that communicates through a wireless channel or through a wired channel, for example, using fiber optic or coaxial cables. Mobile stations may be embodied in devices that include but that are not limited to PC card, compact flash, external or internal modem, or wireless or wireline phone.

The term "connection setup state" refers to the state in which a mobile station is in the process of establishing an active traffic channel connection with a base station.

The term "traffic state" refers to the state in which a mobile station has established an active traffic channel connection with a base station.

The term "communication channel" is used herein to mean a physical channel or a logical channel in accordance with the context.

The term "physical channel" is used herein to refer to a channel that carries user data or control information over the air interface. Physical channels are the "transmission media" that provide the radio platform through which the information is actually transferred, and serve to carry signaling and user data over the radio link. A physical channel typically comprises the combination of frequency scrambling code and channelization code. In the uplink direction, relative phase can be also included. A number of different physical channels can be used in the uplink direction based upon what the mobile station is attempting to do. In a UMTS system, the term physical channel may also refer to the different kinds of bandwidth allocated for different purposes over a Uu interface. The physical channels form the physical existence of the Uu interface between the User Equipment (UE) domain and the network access domain. Physical channels can be defined by physical mappings and attributes used to transfer data over the air interface.

The term "transport channel" is used herein to refer to a communication route for data transport between peer physical layer entities. Transport channels relate to the manner in which information is transmitted. Generally, there can be two types of transport channels known as Common Transport Channels and Dedicated Transport Channels. A transport channel can be defined by how and with what characteristics data can be transferred over the air interface on the physical layer, for example, whether using dedicated or common physical channels, or multiplexing of logical channels. Transport channels may serve as service access points (SAPs) for the physical layer. In a UMTS system, the transport channel describes how the logical channels can be transferred and maps these information flows to physical channels. Transport channels can be used to carry signaling and user data between the Medium Access Control (MAC) layer and the Physical Layer (L1). The Radio Network Controller (RNC) sees transport channels. Information passes to the physical layer from the MAC layer over any one of a number of transport channels that can be mapped to physical channels.

The term "logical channels" is used herein to refer to an information stream dedicated to the transfer of a specific type of information or the radio interface. Logical channels relate to the information being transmitted. A logical channel can be defined by what type of information is transferred, for example, signaling or user data, and can be understood as different tasks the network and terminal should perform at different point in time. Logical channels can be mapped into transport channels performing actual information transfer between the mobile station domain and the access domain. Information passes via logical channels that can be mapped through transport channels which can be mapped to physical channels.

The term "dedicated channel" is used herein to refer to a channel that is typically dedicated to, or reserved for, a specific user, and that carries information to or from a specific mobile station, subscriber unit, or user equipment. A dedicated channel typically carries information intended for a given user, including data for the actual service as well as higher layer control information. A dedicated channel can be identified by a certain code on a certain frequency. A dedicated channel can be bi-directional to potentially allow for feedback.

The term "common channel" is used herein to refer to a transport channel that carries information to/from multiple mobile stations. In a common channel information may be shared among all mobile stations. A common channel can be divided between all users or a group of users in a cell.

The term "Point-to-Point (PTP) communication" is used herein to mean a communication transmitted over a dedicated, physical communication channel to a single mobile station.

The terms "broadcast communication" or "Point-to-Multipoint (PTM) communication" can be used herein to refer to a communication over a common communication channel to a plurality of mobile stations.

The term "reverse link or uplink channel" is used herein to refer to a communication channel/link through which the mobile station sends signals to a base station in the radio access network. This channel may also be used to transmit signals from a mobile station to a mobile base station or from a mobile base station to a base station.

The term "forward link or downlink channel" is used herein to mean a communication channel/link through which a radio access network sends signals to a mobile station.

The term "Transmission Timing Interval" (TTI) is used herein to refer to how often data arrives from higher layers to the physical layer. A Transmission Timing Interval (TTI) may refer to the inter-arrival time of a Transport Block Set (TBS), and is approximately equal to the periodicity at which a TBS is transferred by the physical layer on the radio interface. Data sent on a Transport Channel during a TTI can be coded and interleaved together. A TTI can span multiple radio frames, and can be a multiple of the minimum interleaving period. The start positions of the TTIs for different transport channels that can be multiplexed together for a single connection are time aligned. TTIs have a common starting point. The Medium Access Control delivers one Transport Block Set to the physical layer every TTI. Different transport channels mapped on the same physical channel can have different Transmission Timing Interval (TTI) durations. Multiple PDUs can be sent in one TTI.

The term "packet" is used herein to mean a group of bits, including data or payload and control elements, arranged into a specific format. The control elements may comprise, for example, a preamble, a quality metric, and others known to one skilled in the art. Quality metric comprises, for example, a cyclical redundancy check (CRC), a parity bit, and others known to one skilled in the art.

The term "access network" is used herein to mean equipment necessary for accessing the network. The access network may comprise a collection or network of base stations (BS) and one or more base station controllers (BSC). The access network transports data packets between multiple subscriber stations. The access network may be further connected to additional networks outside the access network, such as a corporate intranet or the Internet, and may transport data packets between access terminals and such outside networks. In the UMTS system the access network can be referred to as the UMTS Terrestrial Radio Access Network (UTRAN).

The term "core network" is used herein to refer to the switching and routing capability for connecting to either the Public Switched Telephone Network (PSTN), for circuit switched calls in the circuit switched (CS) domain, or the Packet Data Network (PSDN) for packet-switched calls in the packet switched (PS) domain. The term "core network" also refers to the routing capability for mobility and subscriber location management and for authentication services. The core network includes network elements needed for switching and subscriber control.

The term "base station" is used herein to refer to an "origination station" that includes the hardware with which mobile station communicates. In the UMTS system, the term "node B" can be used interchangeably with the term "base station." A base station may be fixed or mobile.

The term "cell" is used herein to refer to either hardware or a geographic coverage area depending on the context in which the term is used.

The term "Service Data Unit (SDU)" is used herein to refer to a data unit exchanged with the protocol sitting above the protocol of interest.

The term "Payload Data Unit (PDU)" is used herein to refer to a data unit exchanged with the protocol sitting below the protocol of interest. If the identity of the protocol of interest is ambiguous, then a specific mention will be made in the name. For example, FEC-PDUs are the PDUs of the FEC layer.

The term "soft handoff" is used herein to mean a communication between a subscriber station and two or more sectors, wherein each sector belongs to a different cell. The reverse link communication can be received by both sectors, and the forward link communication can be simultaneously carried on the two or more sectors' forward links.

The term "softer handoff" is used herein to mean a communication between a subscriber station and two or more sectors, wherein each sector belongs to the same cell. The reverse link communication can be received by both sectors, and the forward link communication can be simultaneously carried on one of the two or more sectors' forward links.

The term "erasure" is used herein to mean failure to recognize a message and can also be used to refer to a set of bits which can be missing at the time of decoding.

The term "cross transition" may be defined as a transition from Point-to-Point (PTP) transmission to Point-to-Multipoint (PTM) transmission, or vice-versa. The four possible cross transitions are from Point-to-Point (PTP) transmission in cell A to Point-to-Multipoint (PTM) transmission in cell B, from Point-to-Multipoint (PTM) transmission in cell A to Point-to-Point (PTP) transmission in cell B, from Point-to-Point (PTP) transmission in cell A to Point-to-Multipoint (PTM) transmission in cell A, and from Point-to-Multipoint (PTM) transmission in cell A to Point-to-Point (PTP) transmission in cell A.

The term "direct transition" may be defined as transitions from one Point-to-Point transmission to another Point-to-Point transmission and transitions from Point-to-Multipoint transmission to Point-to-Multipoint transmission. The two possible direct transitions are from Point-to-Point (PTP) in cell A to Point-to-Point (PTP) transmission in cell B, and from Point-to-Multipoint (PTM) transmission in cell A to Point-to-Multipoint (PTM) transmission in cell B.

The term "inter-cell transition" is used to refer to a transition across cell boundaries. The four possible inter-cell transitions are from Point-to-Point (PTP) transmission in cell A to Point-to-Point (PTP) transmission in cell B, from Point-to-Multipoint (PTM) transmission in cell A to Point-to-Multipoint (PTM) transmission in cell B, from Point-to-Point (PTP) transmission in cell A to Point-to-Multipoint (PTM) transmission in cell B, and from Point-to-Multipoint (PTM) transmission in cell A to Point-to-Point (PTP) transmission in cell B. Generally, the most frequent transition is the Point-to-Multipoint (PTM) transmission to Point-to-Multipoint (PTM) transmission across cell boundaries.

The term "intra-cell transition" is used to refer to transitions within a cell from one mode to another mode. The two possible intra-cell transitions are from Point-to-Point (PTP) transmission in cell A to Point-to-Multipoint (PTM) transmission in cell A, and from Point-to-Multipoint (PTM) transmission in cell A to Point-to-point (PTP) transmission in cell A.

The term "radio bearer" is used to refer to a service provided by Layer 2 for transfer of user data between User Equipment (UE) and the UMTS Terrestrial Radio Access Network (UTRAN).

Embodiments of the invention will now be discussed in which aspects discussed above are implemented in a WCDMA or UMTS communications system. FIGS. 1-5C explain some aspects of a conventional UMTS or WCDMA system in which aspects of the inventions described herein could be applied in this description is provided only for purposes of illustration and limitation. It should be appreciated that aspects of the invention can also be applicable in other systems carrying both voice and data such as GSM systems and CDMA 2000 systems conforming to the "3rd Generation Partnership Project" (3GPP), embodied in a set of documents including Document Nos. 3G TS 25.211, 3G TS 25.212, 3G TS 25.213, and 3G TS 25.214 (the W-CDMA standard), or "TR-45.5 Physical Layer Standard for cdma2000 Spread Spectrum Systems" (the IS-2000 standard), and GSM specifications such as TS 04.08 (the Mobile radio interface layer 3 specification), TS 05.08 (Radio Subsystem Link Control), and TS 05.01 (Physical Layer on the Radio Path (General Description)).

For example, although the description specifies that the radio access network 20 can be implemented using the Universal Terrestrial Radio Access Network (UTRAN) air interface, alternatively, in a GSM/GPRS system, the access network 20 could be a GSM/EDGE Radio Access Network (GERAN), or in an inter-system case it could be comprise cells of a UTRAN air interface and cells of a GSM/EDGE air interface.

UMTS Network Topology

FIG. 1 is a block diagram of a communication system according to the UMTS network topology. A UMTS system includes User Equipment (UE) 10, an access network 20, and a core network 30. The UE 10 is coupled to the access network which is coupled to the core network 30 which can be coupled to an external network.

The UE 10 includes mobile equipment 12 and a Universal Subscriber Identity Module (USIM) 14 that contains a user's subscription information. The Cu interface not shown) is the electrical interface between the USIM 14 and the mobile equipment 12. The UE 10 is generally a device that allows a user to access UMTS network services. The UE 10 may be a mobile such as a cellular telephone, a fixed station, or other data terminal. The mobile equipment may be, for an example, a radio terminal used for radio communications over an air interface (Uu). The Uu interface is the interface through which the UE accesses the fixed part of the system. The USIM is generally an application that resides on a "smartcard" or other logic card that includes a microprocessor. The smart card holds the subscriber identity, performs authentication algorithms, and stores authentication in encryption keys and subscription information needed at the terminal.

The access network 20 includes the radio equipment for accessing the network. In a WCDMA system, the access network 20 is the Universal Terrestrial Radio Access Network (UTRAN) air interface. The UTRAN includes at least one Radio Network Subsystem (RNS) that includes at least one base station or "node B" 22 coupled to at least one Radio Network Controller (RNC) 24.

The RNC controls the radio resources of the UTRAN. The RNCs 24 of the access network 20 communicate with the core network 30 via the Iu interface. The Uu interface, Iu interface 25, Iub interface, and Iur interface allow for internetworking between equipment from different vendors and are specified in the 3GPP standards. Implementation of the Radio Network Controller (RNC) varies from vendor to vendor, and therefore will be described in general terms below.

The Radio Network Controller (RNC) 24 serves as the switching and controlling element of the UMTS Terrestrial Radio Access Network (UTRAN), and is located between the Iub interface and Iu interface 25. The RNC acts as a service access point for all services the UTRAN provides to the core network 30, for example, management of connections to the user equipment. The Iub interface 23 connects a node B 22 and an Radio Network Controller (RNC) 24. The Iu interface connects the UTRAN to the core network. The Radio Network Controller (RNC) provides a switching point between the Iu bearer and the base stations. The User Equipment (UE) 10 may have several radio bearers between itself and the Radio Network Controller (RNC) 24. The radio bearer is related to the User Equipment (UE) context which is a set of definitions required by the Iub in order to enrage common connections and dedicated connections between the User Equipment (UE) and Radio Network Controller (RNC). The respective RNCs 24 may communicate with each other over an optional Iur interface that allows soft handover between cells connected to different nodes 22. The Iur interface thus allows for inter-RNC connections. In such cases, a serving RNC maintains the Iu connection 25 to the core network 30 and performs selector and outer loop power control functions, while a drift RNC transfers frames that can be exchanged over the Iur interface to mobile station 10 via one or more base stations 22.

The RNC that controls one node B 22 can be referred to as the controlling RNC of the node B, and controls the load and congestion of its own cells, and also executes admission control and code allocations for new radio links to be established in those cells.

RNCs and base stations (or node Bs) can be connected via and communicate over the Iub interface 23. The RNCs control use of the radio resources by each base station 22 coupled to a particular RNC 24. Each base station 22 controls one or more cells and provides a radio link to the mobile station 10. The base station may perform interface processing such as channel coding and interleaving, rate adaptation and spreading. The base station also performs basic radio resource management operations such as the interloop power control. The base station 22 converts the data flow between the Iub and Uu interfaces 23, 26. The base station 22 also participates in radio resources management. An over-the air interface Uu 26 couples each base station 22 to the mobile station 10. The base stations can be responsible for radio transmission in one or more cells to the mobile station 10, and for radio reception in one or more cells from the mobile station 10.

The core network 30 includes all of the switching and routing capability for (1) connecting to either the PSTN 42 if a circuit switched call is present or to a Packet Data Network (PDN) is a packet-switched call is present, (2) mobility and subscriber location management, and (3) authentication services. The core network 30 can include a home location register (HLR) 32, a mobile switching services center/visitor location register (MSC/VLR) 34, a gateway mobile switching center (GMSC) 36, a serving general packet radio service support node (SGSN) 38, and a gateway GPRS support node (GGSN) 40.

The core network 30 may be coupled to an external circuit-switched (CS) network 42 that provides circuit-switched connections, such as Public Switched Telephone Network (PSTN) or (ISDN), if a packet switched call is present, or may be coupled to a PS network 44, such as the Internet, that provides connections for packet data services if a packet switched call is present.

UMTS Signaling Protocol Stack

Figure 2:
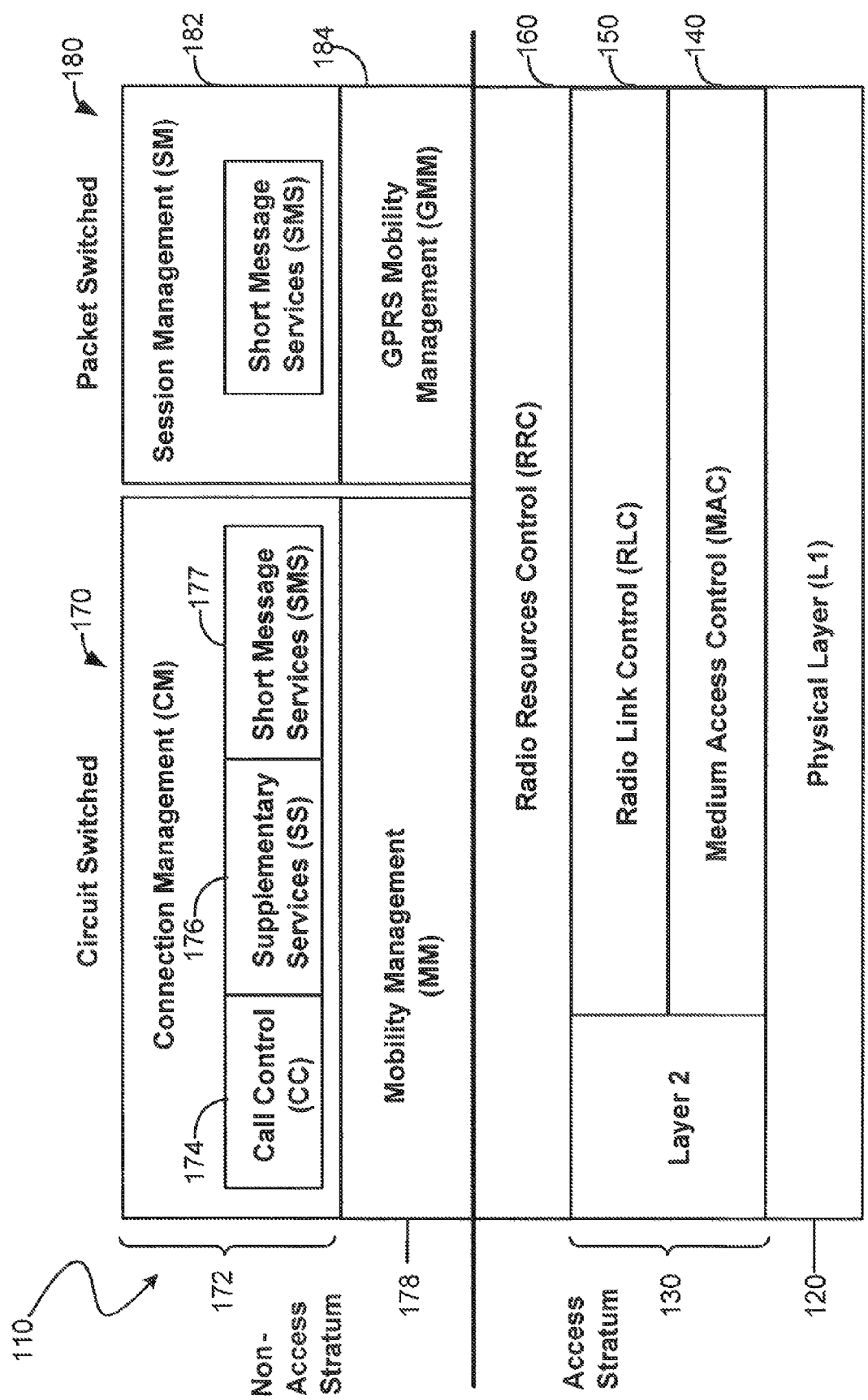
FIG. 2 is a block diagram of the UMTS signaling protocol stack.

FIG. 2 is a block diagram of the UMTS signaling protocol stack 110. The UMTS signaling protocol stack 110 includes an access stratum and a non-access stratum (NAS).

The access stratum typically includes a physical layer 120, layer 2 130 which includes a medium access control (MAC) layer 140 and a radio link control (RLC) layer 150, and a radio resource control (RRC) layer 160. The various layers of the access stratum will be described in greater detail below.

The UMTS non-access stratum layer is essentially the same as GSM upper layers and can be divided into a circuit switched portion 170 and a packet switched portion 180. The circuit switched portion 170 includes a connection management (CM) layer 172 and a mobility management (MM) layer 178. The CM layer 172 handles circuit-switched calls and includes various sublayers. The call control (CC) sublayer 174 executes functions such as establish and release. The supplementary services (SS) sublayer 176 executes functions such as call forwarding and three-way calling. A short message-services (SMS) sublayer 177 executes short message services. The MM layer 178 handles location updating and authentication for circuit-switched calls. The packet switched portion 180 includes a session management (SM) sublayer 182 and a GPRS mobility management (GMM) sublayer 184. The session management (SM) sublayer 182 handles packet-switched calls by executing functions such as establish and release, and also includes a short message services (SMS) section 183. The GMM sublayer 184 handles location updating and authentication for packet-switched calls.

Figure 3:
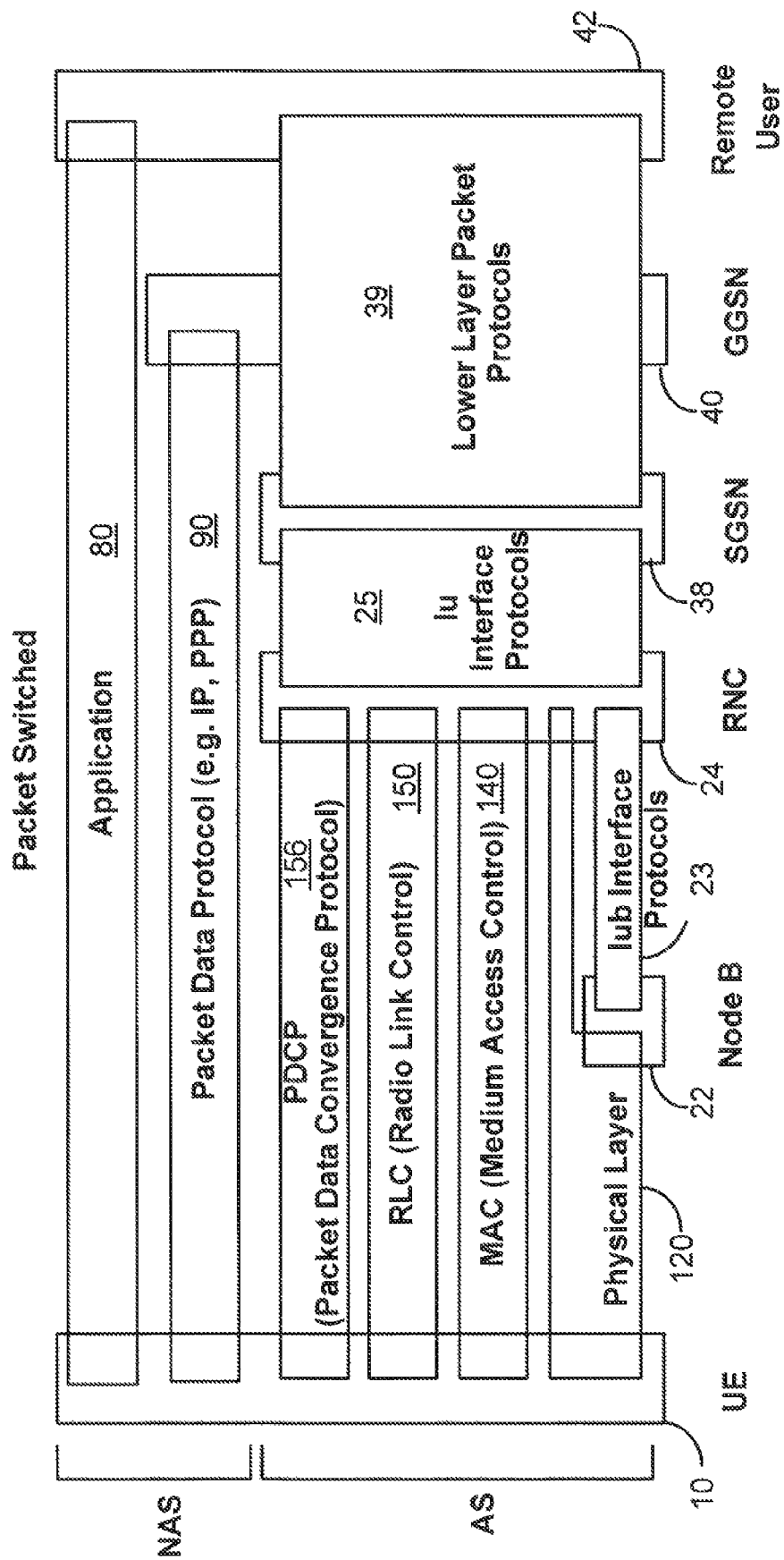
FIG. 3 is a block diagram of a packet switched user plane of the UMTS protocol stack.

FIG. 3 is a block diagram of a packet switched user plane of the UMTS protocol stack. The stack includes an access stratum (AS) layer and a non-access stratum (NAS) layer. The NAS layer includes the application layer 80 and the Packet Data Protocol (PDP) layer 90. The application layer 80 is provided between the User Equipment (UE) 10 and the remote user 42. The PDP layer 90, such as IP or PPP, is provided between the GGSN 40 and the User Equipment (UE) 10. Lower layer packet protocols (LLPP) 39 are provided between the remote user 42 and the SGSN 38. Iu interface protocols 25 are provided between the Radio Network Controller (RNC) 24 and the SGSN 38, and Iub interface protocols are provided between the Radio Network Controller (RNC) 24 and node B 22. Other portions of the AS layer will be described below.

Access Stratum (AS) Layer

Figure 4:
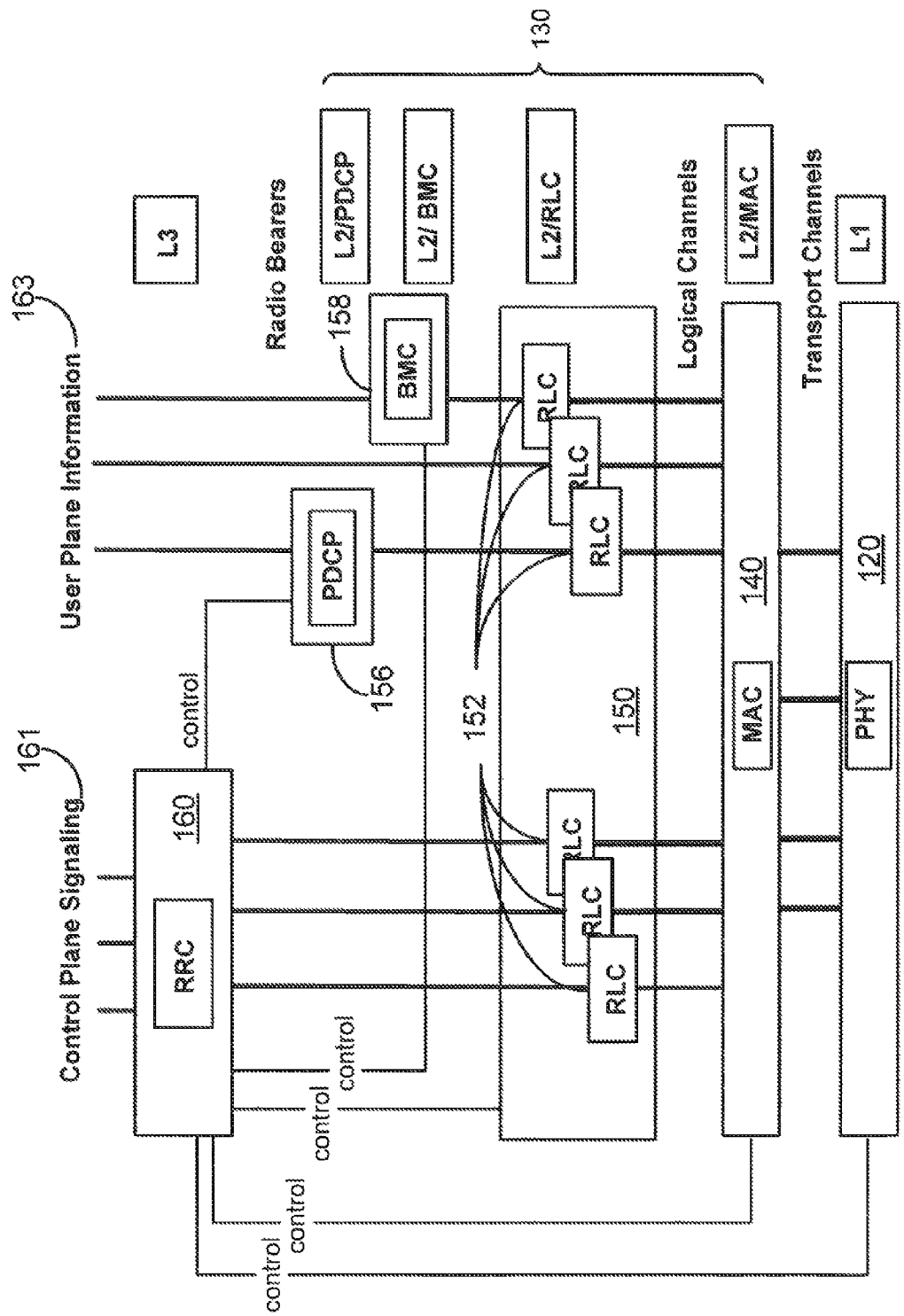
FIG. 4 is a block diagram of an access stratum portion of the UMTS signaling protocol stack.

FIG. 4 is a block diagram of the access stratum portion of the UMTS signaling protocol stack. The conventional access stratum includes the physical layer (L1) 120, the data link layer (L2) 130 having sublayers including Medium Access Control (MAC) layer 140, Radio Link Control (RLC) layer 150, Packet Data Convergence Protocol (PDCP) layer 156, Broadcast/Multicast Control (BMC) layer 158, and a Radio Resource Control (RRC) layer 160. These layers will be further described below.

Radio bearers carry user data 163 between application layers and layer two (L2) 130. The control plane signaling 161 can be used for all UMTS specific control signaling, and includes the application protocol in the signaling bearer for transporting the application protocol messages. The application protocol can be used for setting up bearers to the UE 10. The user plane transports all user plane information 163 sent and received by the user such as a coded voice in a voice call or the packets in an internet connection. The user plane information 163 carries the data stream and the data bearers for those data streams. Each data stream can be characterized by one or more frame protocols specified for that interface.

The Radio Resource Control (RRC) layer 160 functions as the overall controller of the access stratum, and configures all other layers in the access stratum. The RRC layer 160 generates control plane signaling 161 that controls the Radio Link Control Units 152, the physical layer (L1) 120, the Medium Access Control (MAC) layer 140, the Radio Link Control (RLC) layer 150, the Packet Data Convergence Protocol (PDCP) layer 156, and the Broadcast/Multicast Control (BMC) layer 158. The Radio Resource Control (RRC) layer 160 determines the types of measurements to make, and reports those measurements. The RRC layer 160 also serves as the control and signaling interface to the non-access stratum.

More specifically, the RRC layer 160 broadcasts system information messages that include both access stratum and non-access stratum information elements to all User Equipment (UE) 10. The RRC layer 160 establishes, maintains, and releases a Radio Resource Control (RRC) connection between the UTRAN 20 and the UE 10. The UE RRC requests the connection, whereas the UTRAN RRC sets up and releases the connection. The RRC layer 160 also establishes, reconfigures, and releases Radio Bearers between the UTRAN 20 and the UE 10, with the UTRAN 20 initiating these operations.

The RRC layer 160 also handles various aspects of User Equipment (UE) 10 mobility. These procedures depend on the UE State, whether the call is a circuit switched or packet switched call, and the Radio Access Technology (RAT) of the new cell. The RRC layer 160 also pages the UE 10. The UTRAN RRC pages the UE regardless of whether the UE is listening to the paging channel or the paging indicator channel. The UE's RRC notifies the upper layers of the core network (CN) 30.

Data link layer (L2) 130 includes a Medium Access Control (MAC) sublayer 40, a Radio Link Control (RLC) sublayer 150, a Packet Data Convergence Protocol (PDCP) sublayer 156, and a Broadcast/Multicast Control (BMC) sublayer 158.

The broadcast and multicast control protocol (BMC) 158 conveys, over the radio interface, messages originating from the cell broadcast center by adapting broadcast/multicast service originating from the broadcast domain on the radio interface. The BMC protocol 158 offers a service called "a radio bearer," and exists in the user plane. The BMC protocol 158 and RNC store the cell broadcast messages received over the CBC-RNC interface for scheduled transmission. On the UTRAN side, the BMC 158 calculates the required transmission rate for the cell broadcast service based on the messages that can be received over the CBC-RNC interface (not shown) and requests appropriate CTCH/FACH resources from the RRC. The BMC protocol 158 also receives scheduling information together with each cell broadcast message over the CBC-RNC interface. Based on this scheduling information, on the UTRAN side the BMC generates scheduled messages and scheduled BMC message sequences accordingly. On the user equipment side, the BMC evaluates the schedule messages and indicates the scheduling parameters to the RRC which can be then used by the RRC to configure the lower layers for discontinuous reception. The BMC also transmits the BMC messages, such as scheduling and cell broadcast messages according to a schedule. Non-corrupted cell broadcast messages can be delivered to the upper layer. Part of the control signaling between the UE 10 and the UTRAN 20 can be Radio Resource Control (RRC) 160 messages that carry all parameters required to set up, modify and release layer 2 protocol 130 and layer 1 protocol 120 entities. RRC messages carry in their payload all of the higher layer signaling. The Radio Resource Control (RRC) controls the mobility of user equipment in the connected mode by signaling such as measurements, handovers and cell updates.

The Packet Data Convergence Protocol (PDCP) 156 exists in the user plane for services from the PS domain. Services offered by the PDCP can be called radio bearers. The Packet Data Convergence Protocol (PDCP) provides header compression services. The Packet Data Convergence Protocol (PDCP) 156 contains compression methods that can provide better spectral efficiency for services transmitting IP packets over the radio. Any of several header compression algorithms can be utilized. The PDCP compresses redundant protocol information at the transmitting entity and decompresses at the receiving entity. The header compression method can be specific to the particular network layer, transport layer, or upper layer protocol combinations, for example, TCP/IP and RTP/UDP/IP. The PDCP also transfers user data feat it receives in the form of a PDCP Service Data Units (SDU) from the non-access stratum and forwards them to the RLC entity, and vice versa. The PDCP also provides support for lossless SRNS relocation. When the PDCP uses an Acknowledged Mode (AM) RLC with in sequence delivery, PDCP entities which can be configured to support losses RSRNS relocation have Protocol Data Unit (PDU) sequence numbers, which together with unconfirmed PDCP packets can be forwarded to the new SRNC during relocation.

The RLC layer 150 offers services to higher layers (e.g., the non access stratum) via service access points (SAPs) which can be used by higher layer protocols is the UE side and by the IURNAP protocol in the UTRAN side. Service access points (SAPS) describe how the RLC layer handles the data packets. All higher layer signaling, such as mobility management, call control, session management etc., can be encapsulated in RLC messages for transmission of the radio interface. The RLC layer 150 includes various Radio Link Control Entities 152 coupled to the MAC layer 140 via logical channels that carry the signaling information and user date.

On the control plane 161, the RLC services can be used by the RLC layer for signaling transport. On the user plane 163, the RLC services can be used either by the service specific protocol layers PDCP or BMC or by other higher layer user plane functions. The RLC services can be called signaling radio bearers in the control plane 161 and radio bearers in the user plane 163 for services that do not utilize the PDCP 156 or user plane protocols. In other words, the RLC layer 150 provides services in the control plane 161 called signaling radio bearers (SRBs), and in the user plane 163 provides services called a radio bearers (RBs) if the PDCP and BMC protocols can not be used by that service. Otherwise, the RB service can be provided by the PDCP layer 156 or BMC layer 158.

The Radio Link Control (RLC) layer 150 performs framing functions to user and control data, that include segmentation/concatenation and padding functionality. The RLC layer 150 typically provides segmentation and retransmission services to the Radio Resource Control (RRC) 160 layer for control data in the control plane 161 and to the application layer for user data in the user plane 163. The RLC layer typically performs segmentation/reassembly of variable length higher layer Protocol Data Units (PDUs) into/from smaller RLC Protocol Data Units (PDUs). One Radio Link Control (RLC) Protocol Data Unit (PDU) typically carries one PDU. The Radio Link Control (RLC) PDU size can be set, for example, according to the smallest possible bit rate for the service using the Radio Link Control (RLC). As will be discussed below, for variable rate services, several Radio Link Control (RLC) PDUs can be transmitted during one transmission time interval (TTI) when any bit rate higher than the lowest one it used. The RLC transmitting entity also performs concatenation. If the contents of a Radio Link Control (RLC) Service Data Unit (SDU) do not fill an integer number of Radio Link Control (RLC) PDUs, the first segment of the next Radio Link Control (RLC) SDU may be put into the Radio Link Control (RLC) PDU in concatenation with the last segment of the previous RLC SDU. The RLC transmitting entity also typically performs a padding function. When the remaining data to be transmitted does not fill an entire Radio Link Control (RLC) PDU of a given size, the remainder of that data field can be filled with padding bits. According to aspects of the invention discussed below with reference to FIGS. 11-13, for example, techniques can be provided for reducing or eliminating the amount of padding that is utilized.

The RLC receiving entity detects duplicates of received Radio Link Control (RLC) PDUs and ensures that the result in the higher layer PDU is delivered once to the upper layer. The RLC layer also controls the rate at which the PRLC transmitting entity may send information to an RLC receiving entity.

Figure 5A:
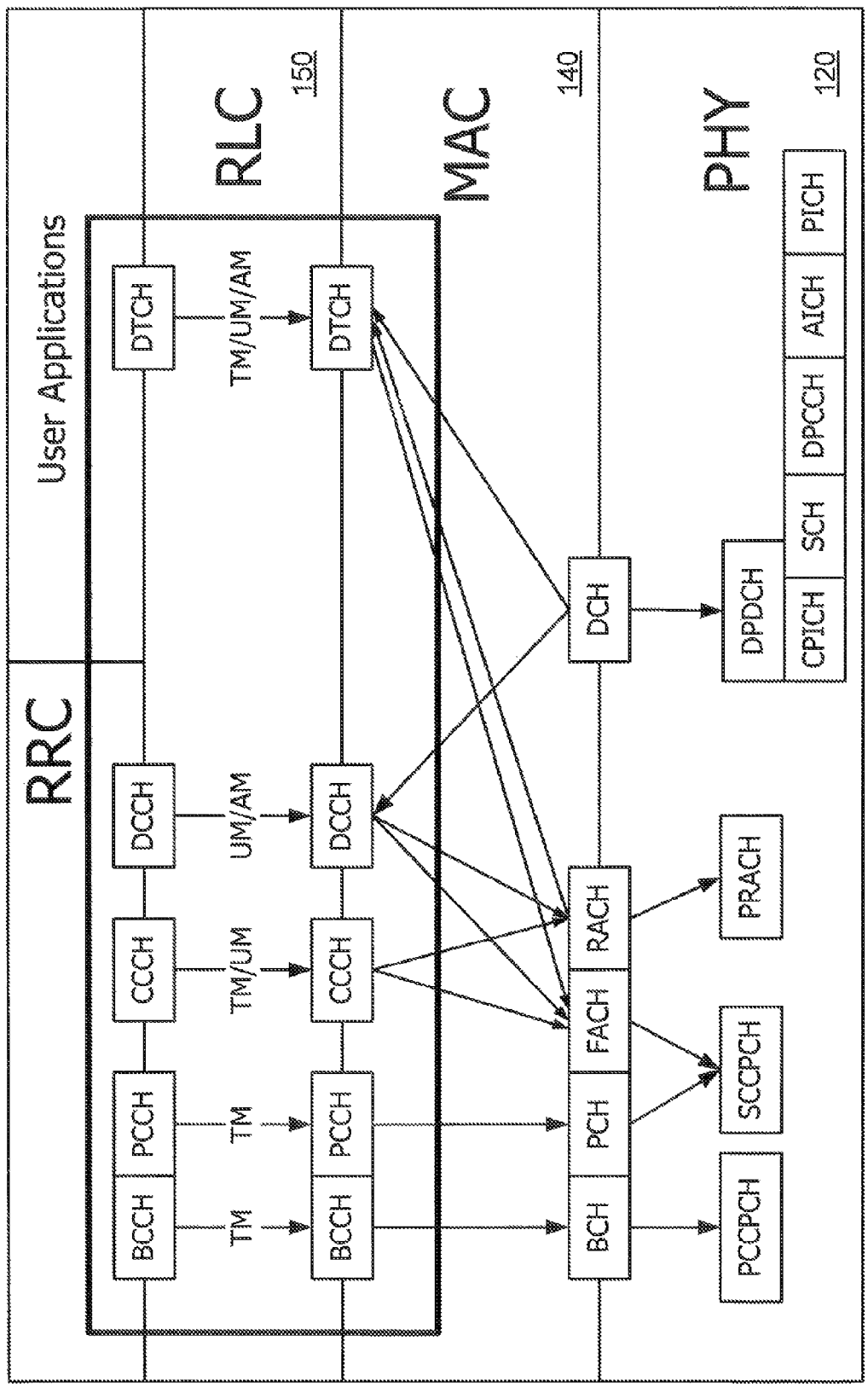
FIG. 5A is a block diagram of data transfer modes used in the Radio Link Control (RLC) layer of the UMTS signaling protocol stack, and various channels used in each layer.

FIG. 5A is a block diagram of that illustrates the data transfer modes used in the Radio Link Control (RLC) layer of the UMTS signaling protocol stack, and that shows possible mappings of logical, transport and physical UMTS channels with respect to the access stratum. One skilled in the art will appreciate that all mappings would not necessarily be defined at the same time for a given User Equipment (UE), and multiple instantiations of some mappings may occur simultaneously. For example, a voice call might use three Dedicated Traffic Channel (DTCH) logical channels mapped to three Dedicated Channel (DCH) transport channels. Moreover, some channels shown in FIG. 5, such as CPICH, SCH, DPCCH, AICH and PICH, exist in the physical layer context and do not carry upper layer signaling or user data. The contents of these channels can be defined at the physical layer 120 (L1).

Each RLC instance in the Radio Link Control (RLC) layer can be configured by the Radio Resource Control (RRC) layer 160 to operate in one of three modes: the transparent mode (TM), unacknowledged mode (UM), or acknowledged mode (AM), which are described in detail below with reference to FIG. 5B. The three data transfer modes indicate the mode in which the Radio Link Control (RLC) is configured for a logical channel. The transparent and unacknowledged mode RLC entities are defined to be unidirectional whereas the acknowledged mode entities are bi-directional. Normally, for all RLC modes, the CRC error detection is performed on the physical layer and the result of the CRC check is delivered to the RLC together with the actual data. Depending on the specific requirements of each mode, these modes perform some or all of the functions of the RLC layer 150, which include segmentation, reassembly, concatenation, padding, retransmission control, flow control, duplicate detection, in-sequence delivery, error correction and ciphering. These functions are described in more detail below with reference to FIGS. 5B and 5C. According to an aspect of the invention discussed herein, a new Radio Link Control (RLC) data transfer mode can be provided.

The MAC layer 140 offers services to the RLC layer 150 by means of logical channels that are characterized by the type of data transmitted. The Medium Access Control (MAC) layer 140 maps and multiplexes logical channels to transport channels. The MAC layer 140 identifies the User Equipment (UE) that are on common channels. The MAC layer 140 also multiplexes/demultiplexes higher layer PDUs into/from transport blocks delivered to/from the physical layer on common transport channels. The MAC handles service multiplexing for common transport channels since it can not be done in the physical layer. When a common transport channel carries data from dedicated type logical channels, the Medium Access Control (MAC) header includes an identification of the UE. The MAC layer also multiplexes and demultiplexes higher layer PDUs into/from transport block sets delivered to or from the physical layer on dedicated transport channels.

The MAC layer 140 receives RLC PDUs together with status information an the amount of data in the RLC transmission buffer. The MAC layer 140 compares the amount of data corresponding to the transport channel with thresholds set by the RRC layer 160. If the amount of data is too high or too low, then the MAC sends a measurement report on traffic volume status to the RRC. The RRC layer 160 can also request that the MAC layer 160 sends these measurements periodically. The RRC layer 160 uses these reports for triggering reconfiguration of the radio bearers and/or transport channels.

The MAC layer also selects an appropriate transport format (TF) for each transport channel depending on the instantaneous source rates of the logical channels. The MAC layer 140 provides priority handling of data flows by selecting "high bit rate" and "low bit rate" transport formats (TFs) for different data flows. Packet switched (PS) data is inherently bursty, and thus the amount of data available to send varies from frame to frame. When more data is available, the MAC layer 140 may choose one of the higher data rates, however, when both signaling and user data are available the MAC layer 140 chooses between them to maximize the amount of data sent from the higher priority channel. The transport format (TF) can be selected with respect to the transport format combinations (TFCs) which can be defined by admission control for each connection.

The Medium Access Control (MAC) layer also performs ciphering. Each radio bearer can be ciphered separately. The ciphering details are described in the 3GPP TS 33.102.

In a system such as WCDMA there are three types of transport channels that can be used to transmit packet data. These channels are known as a common transport channel a dedicated transport channel, and a shared transport channel. In the downlink, the transport channel packet data is selected by a packet scheduling algorithm. In the uplink, the transport channel is selected by the mobile 10 based on the parameters set by the packet scheduling algorithm.

Common channels can be, for example, the random access channel RACH in the uplink and the forward access channel FACH in the downlink. Both carry signaling data and user data. Common channels have a low set up time. Because common channels can be used for signaling before connections are set up, common channels can be used to send packets immediately without any long set up time. There are typically a few RACH or FACH per sector. Common channels do not have a feed back channel and therefore typically use open loop power control or fixed power. Moreover, common channels can not use soft handover. Thus, the link level performance of common channels can be worse than that of dedicated channels and more interference can be generated than with dedicated channels. Consequently, common channels can be more suitable for transmitting small individual packets. Applications to be used in common channels would be applications such as short message services, and short text emails. Sending a single request to a web page could also fit well into the concept of common channels however in the case of larger data amounts, common channels suffer from poor radio performance.

Dedicated channels can use fast power control and soft handover features that improve radio performance, and less interference is typically generated than with the common channels. However, setting up a dedicated channel takes more time than accessing common channels. Dedicated channels can have variable bit rates from a few kilobytes per second up to 2 megabytes per second. Because the bit rate changes during transmission, the downlink orthogonal code must be allocated according to the highest bit rate. Therefore, the variable hit rate dedicated channels consume valuable downlink orthogonal code space.

The physical layer (L1) 120 couples to the MAC layer 140 via transport channels that carry signaling information and user data. The physical layer 120 offers services to the MAC layer via transport channels that can be characterized by how and with what characteristics data is transferred.

The physical layer (L1) 120 receives signaling and user data over the radio link via physical channels. The physical layer (L1) typically performs multiplexing and channel coding including CRC calculation, forward-error correction (FEC), rate matching, interleaving transport channel data, and multiplexing transport channel data, as well as other physical layer procedures such as acquisition, access, page, and radio link establishment/failure. The physical layer (L1) may also be responsible for spreading and scrambling, modulation, measurements, transmit diversity, power weighting, handover, compressed mode and power control.

Figure 5B:
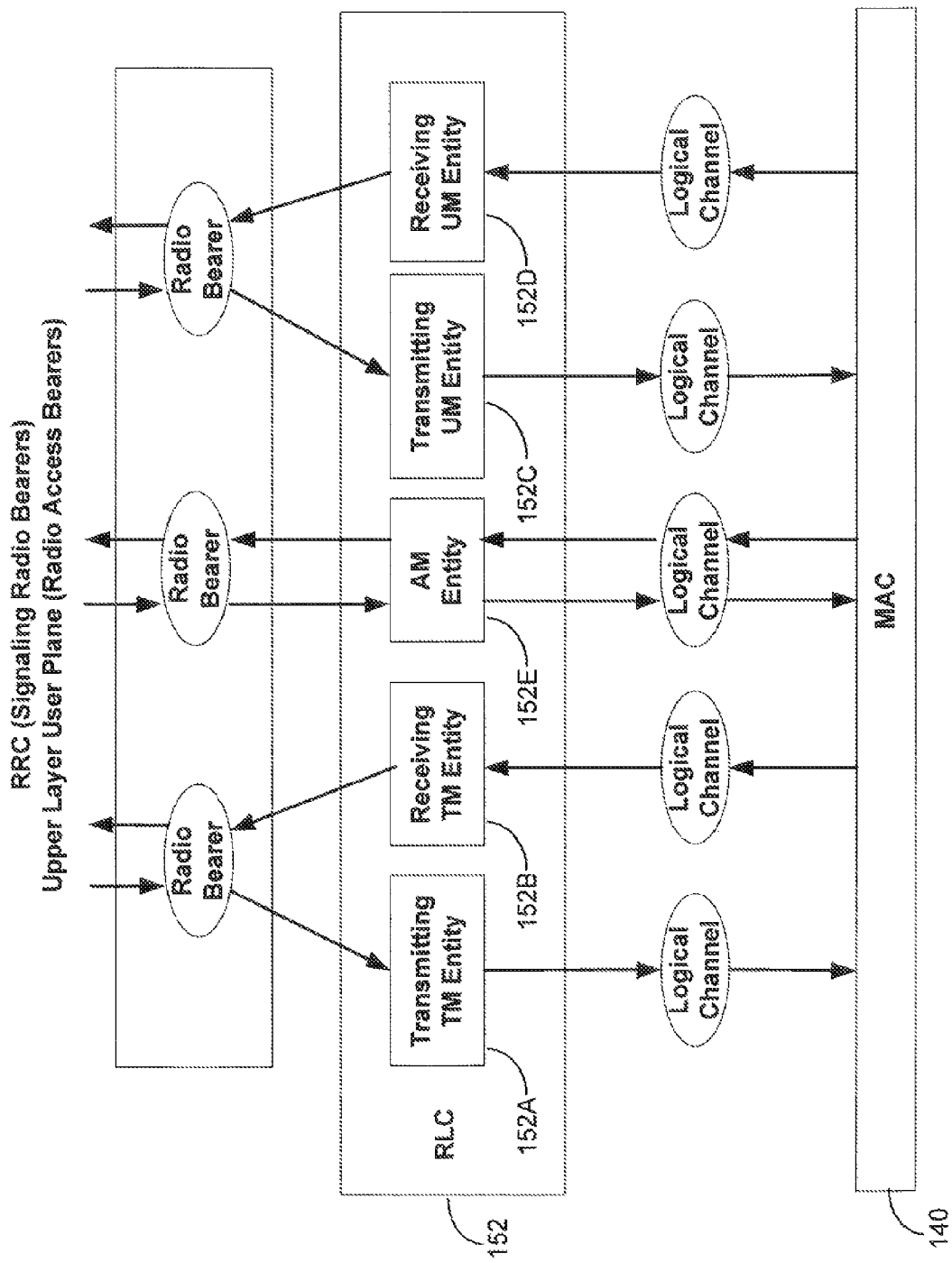
FIG. 5B is a block diagram showing the architecture of the Radio Link Control (RLC) layer including various RLC data transfer modes.

FIG. 5B is a block diagram showing the architecture of ate Radio Link Control (RLC) layer. As mentioned above, each RLC entity or instance 152 in the Radio Link Control (RLC) layer 150 can be configured by the Radio Resource Control (RRC) layer 160 to operate in one of three data transfer modes: the transparent mode (TM), unacknowledged mode (UM), or acknowledged mode (AM). The data transfer mode for the user data can be controlled by a Quality of Service (QoS) setting.

The TM is unidirectional and includes a transmitting TM entity 152A and an receiving TM entity 152B. In transparent mode no protocol order is added to higher layer data. Erroneous protocol date units (PDUs) can be discarded or marked erroneous. Streaming type transmission can be used in which higher layer data is typically not segmented, though in special cases, transmissions of limited segmentations/reassembly capability can be accomplished. When segmentation/reassembly is used, it can be negotiated in the radio bearer set up procedure.

The UM is also unidirectional and includes a transmitting UM entity 152C and a receiving UM entity 152D. An UM RLC entity is defined as unidirectional because no association between the uplink and downlink is needed. Data delivery is not guaranteed in UM. The UM can be used, for example, for certain RRC signaling procedures where the acknowledgment and retransmissions are not part of the RRC procedure. Examples of user services that utilize the unacknowledged mode RLC are the cell broadcast service and voice over IP. Received erroneous data can be either marked or discarded depending on the configuration. A timer-based discard without explicit signaling function can be applied, thus RLC PDUs which can not be transmitted within a specified time can simply be removed from the transmission butter. In the unacknowledged data transfer mode, the PDU structuring includes sequence numbers, and a sequence number check can be performed. The sequence number check helps guarantee the integrity of reassembled PDUs and provides a means of detecting corrupted Radio Link Control (RLC) SDUs by checking the sequence number in Radio Link Control (RLC) PDUs when they are reassembled into a Radio Link Control (RLC) SDU. Any corrupted Radio Link Control (RLC) SDUs can be discarded. Segmentation and concatenation can also be provided in the Unacknowledged Mode (UM).

Figure 5C:
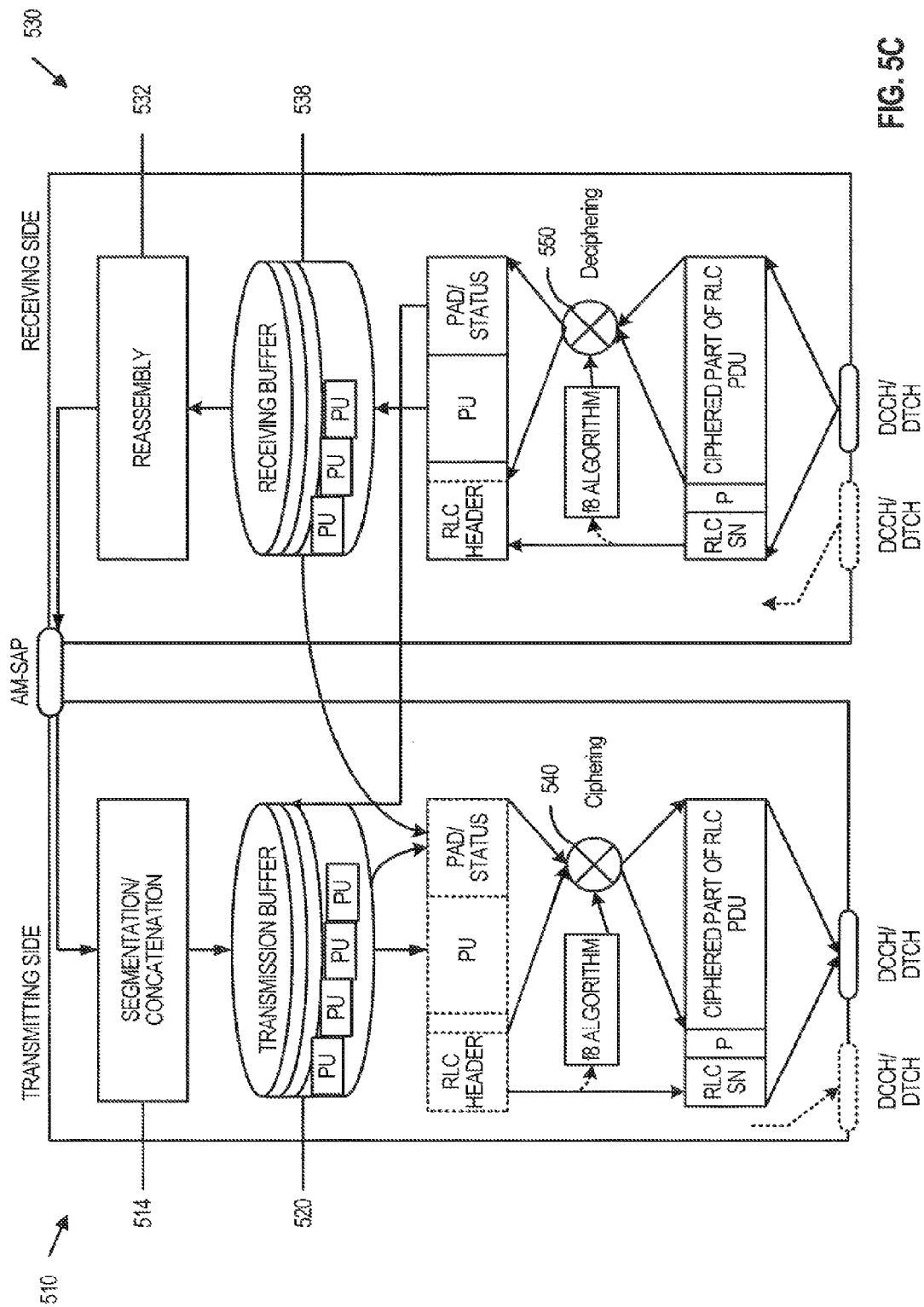
FIG. 5C is a block diagram showing an entity for implementing the Radio Link Control (RLC) Acknowledged Mode (AM).

In acknowledged mode, RLC AM entity is bi-directional and capable of piggybacking an indication of the status of the link in the opposite direction into user data. FIG. 5C is a block diagram showing an entity for implementing the Radio Link Control (RLC) Acknowledged Mode (AM) entity and how an AM PDU can be constructed. Data packets (RLC SDUs) received from higher layers via AM-SAP can be segmented and/or concatenated 514 to Protocol Data Units (PDU) of a fixed length. The length of the Protocol Data Unit is a semi-static value decided is the radio bearer set up, and can be changed through the RRC radio bearer reconfiguration procedure. For concatenation or padding purposes, bits carrying information on the length and extension can be inserted into the beginning of the last Protocol Data Unit or data from an SDU can be included. If several SDUs fit into one PDU, they can be concatenated in the appropriate length indicators (LIs) can be inserted in the beginning of the PDU. The PDUs can be then placed in the transmission buffer 520, which can also take care of retransmission management.

The PDU can be constructed by taking one PDU from the transmission buffer 520, adding a header for it, and if the data in the PDU does not fill the whole RLC PDU, a padding field or piggyback status message can be appended. The piggyback status message can originate either from the receiving side or from the transmitting side to indicate an RLCSDU discard. The header contains the RLC PDU sequence number (SN), a pollbit (P), which can be used to request status from the peer entity, and optionally a length indicator (LI) which can be used if concatenation of SDUs, padding, or a piggyback PDU takes place is the RLC PDU.

The Acknowledged Mode (AM) is typically used for packet type services, such as internet browsing and email downloading. In the acknowledged mode, an automatic repeat request (ARQ) mechanism can be used for error correction. Any received packets with errors can be retransmitted. The quality versus delay performance of the RLC can be controlled by the RRC through configuration of a number of retransmissions provided by the RLC. If the RLC can not deliver the data correctly, for example, if the maximum number of retransmission has been reached or the transmission time has been exceeded, men the upper layer is notified and the Radio Link Control (RLC) SDU can be discarded. The peer entity can also be informed of the SDU discard operation by sending a move receiving window command in a status message so that also the receiver removes all PDUs belonging to the discarded Radio Link Control (RLC) SDU.

The RLC can be configured for both in-sequence and out-of-sequence delivery. With in-sequence delivery the order of the higher layer of PDUs can be maintained, whereas out-of-sequence delivery forwards higher layer PDUs as soon as they are completely received. The RLC layer provides in sequence delivery of higher layer PDUs. This function preserves the order of higher layer PDUs that were submitted for transfer by the RLCs. If this function is not used, out of sequence delivery can be provided. In addition to data PDU delivery, status and reset control procedures can be signaled between peer RLC entitles. The control procedures can even use a separate logical channel, thus, one AM RLC entity can either use one or two logical channels.

Ciphering can be performed in the RLC layer for acknowledged and unacknowledged RLC modes. In FIG. 5C, the AM RLC PDU is ciphered 540, excluding the two first two bits which comprise the PDU sequence number and the pollbit. The PDU sequence number is one input parameter to the ciphering algorithm, and it must be readable by the peer entity to perform the ciphering. The 3GPP specification TS33.102 describes ciphering.

The PDU can be then forwarded to the MAC layer 140 via logical channels. In FIG. 5C, extra logical channels (DCCH/DTCH) are indicated by dash lines which illustrate that one RLC entity can be configured to send the control PDUs and data PDUs using different logical channels. The receive side 530 of the AM entity receives RLC AM PDUs through one of the logical channels from the MAC layer. Errors can be checked with the physical layer CRC which can be calculated over the whole RLC PDU. The actual CRC check can be performed in the physical layer and the RLC entity receives the result of the CRC check together with data after deciphering the whole header and possible piggyback status information can be extracted from the RLC PDU. If the received PDU was a strong message or if the status information is piggy-backed to an AM PDU, the control information (status message) can be passed to the transmitting side which checks its retransmission buffer against the received status information. The PDU number from the RLC header is used for deciphering 550 and also when storing the ciphered PDU into the receive buffer. Once all PDUs belonging to a complete SDU are in the receive buffer, the SDU can be reassembled. Although not shown, checks for is sequence delivery and duplicate detection can then be performed before the RLC SDU is delivered to a higher layer.

When the User Equipment (UE) or mobile station moves between PTM transmission and Point-to-Point (PTP) transmission (or changes cells), the RLC entity 152 is reinitialized. This can undesirably result in loss of any data sitting in Radio Link Control (RLC) buffers. As noted above, problems may arise when the mobile station moves from one cell to another or when the delivery of Multimedia Broadcast and Multicast Service (MBMS) content changes from a Point-to-Point (PTP) transmission mode to Point-to-Multipoint (PTM) transmission mode in the serving cell.

It is desirable to preserve continuity of Multimedia Broadcast and Multicast Service (MBMS) during transitions between Point-to-Point (PTP) transmission and Point-to-Multipoint (PTM) transmission, or during transitions that occur between different cells (e.g., handover), and to avoid the submission of duplicate information. To preserve continuity of MBMS service and to avoid the submission of duplicate information, the Layer 2 150 should be capable of re-aligning the data coming from the two streams. This synchronization cannot be provided by the physical layer since the network terminating point might be different in each mode. If Forward Error Correction (FEC) is performed below the RLC layer 150, as is the case in 3GPP2, data can be lost during any transition between Point-to-Multipoint (PTM) transmission and Point-to-Point (PTP) transmission, and vice-versa. In addition, this would require physical layer synchronization and sharing of the same Medium Access Control (MAC) among multiple cells (e.g., having common scheduling). As such, this can cause problems in 3GPP2 where such assumptions do not apply.

Point-to-Point (PTP) Transmission

Assuming that the application has a significant delay tolerance, the most efficient data transfer mode for Point-to-Point (PTP) transmissions is Radio Link Control (RLC) Acknowledged Mode (AM). For example, the RLC acknowledged mode (AM) is typically used for packet switched data transfer over dedicated logical channels (PTP). The RLC operates in acknowledged mode (AM) on dedicated logical channels. As shown in FIG. 5A, dedicated user traffic for one user service in the downlink direction can be sent through a logical channel known as the Dedicated Traffic Channel (DTCH).

In Acknowledged Mode (AM), the reverse link is available for retransmission requests if the data has errors. The RLC transmits Service Data Units (SDUs) and guarantees delivery to its peer entity by means of retransmission. If RLC can not deliver the data correctly, the user of RLC at the transmitting side is notified. Operating in RLC AM is generally much more power efficient at the expense of introducing additional delay.

Point-to-Multipoint (PTM) Transmission

The Common Traffic Channel (CTCH) is a unidirectional channel existing in the downlink direction and it can be used when transmitting information either to all terminals or a specific group of terminals. Both of these data transfer modes use unidirectional common channels that do not have a reverse-link channel set up.

It would be desirable to provide an architecture that allows MBMS service to switch transparently between Point-to-Point (PTP) and Point-to-Multipoint (PTM) modes of transmission. To obtain good performance when transitioning between Point-to-Point (PTP) and Point-to-Multipoint (PTM) modes of transmission, it would also be desirable to provide an architecture that allows switching between different Radio Link Control (RLC) modes. This can, for example, help reduce power requirements.

Aspects of the present invention will now be described with reference to embodiments shown and described with reference to FIGS. 6 through 19. These features, can among other things, help to preserve service continuity during such transitions by use of a new Forward Error Correction (FEC) layer.

Figure 6:
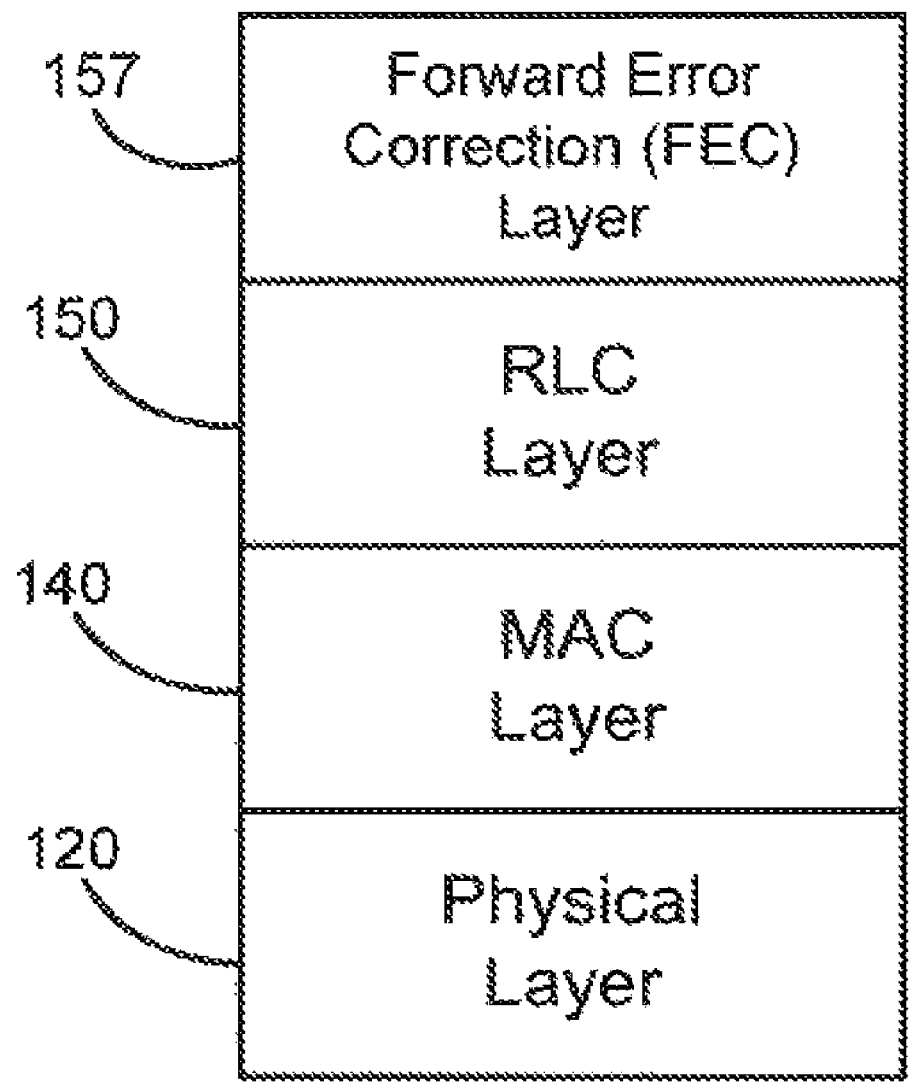
FIG. 6 is a diagram of a modified UMTS protocol stack having a Forward Error Correction Layer.

FIG. 6 is a diagram of a modified UMTS protocol stack having a Forward Error Correction (FEC) layer operable in a Forward Error Correction (FECd) mode and a Forward Error Correction (FECc) mode. The Forward Error Correction (FEC) layer allows the underlying Radio Link Control (RLC) entity 152 to change from one Radio Link Control (RLC) data transfer mode to another Radio Link Control (RLC) data transfer mode when the User Equipment (UE) changes from Point-to-Point (PTP) transmission to Point-to-Multipoint (PTM) transmission, while maintaining service continuity. According to this embodiment, the FEC Layer can operate in a first mode (FECc) or in a second mode (FECd). In one implementation, the first mode (FECc) can utilize parity blocks and the second mode (FECd) can operate without parity blocks. The impact of changing between the FECd and FECc modes can be much lower than changing between RLC modes and can be seamless such that no data loss occurs during the transition.

The Forward Error Correction (FECc) mode can utilize outer-coding techniques to protect user data. This can be particularly effective over common channels. The Forward Error Correction (FECc) mode allows functionality typically found in the Unacknowledged Mode (UM), such as framing (segmentation and concatenation) and sequence number addition, to take place above the Radio Link Control (RLC) layer. As a result, the Radio Link Control (RLC) layer can use transparent mode (TM) for Point-to-Multipoint (PTM) transmissions because traditional Unacknowledged Mode (UM) functions can be performed at the Forward Error Correction (FEC) layer. Although this functionality can be duplicated in Radio Link Control (RLC) Acknowledged Mode (AM), gains due to ARQ make up for this duplication.

By positioning the Forward Error Correction (FEC) or outer-coding layer above the Radio Link Control (RLC) layer, the sequence number can be added in a layer which is independent of Radio Link Control (RLC). Use of additional overhead, such as sequence number, with unacknowledged transmissions can enable realignment of the Protocol Data Units (PDUs) with an Encoder Packet (EP) during asynchronous transmission of MBMS data. Because the sequence numbers are added at a layer above Radio Link Control (RLC), the sequence numbers are common in both Point-to-Point (PTP) transmission and Point-to-Multipoint (PTM) transmission, and therefore when a transition occurs from Point-to-Multipoint (PTM) transmission to Point-to-Point (PTP) transmission, continuity of sequence numbers can be maintained. This allows data to be realigned so that duplication of data and/or missed data can be avoided.

Outer coding could also be used in Point-to-Point (PTP) transmission, which could potentially gain the system some power and/or reduce the delay for re-transmissions. Multimedia Broadcast and Multicast Service (MBMS) data can be delay tolerant to an extent. In Point-to-Point (PTP) transmissions, a feedback path is provided. This makes use of Radio Link Control (RLC) Acknowledged Mode (AM) more efficient due to use of ARQ retransmissions when needed that are generally more radio efficient than an FEC scheme in which additional parity blocks are always sent. As such, addition of parity blocks to the MBMS payload data is unnecessary on dedicated logical channels, for example, Point-to-Point (PTP).

Figure 7A:
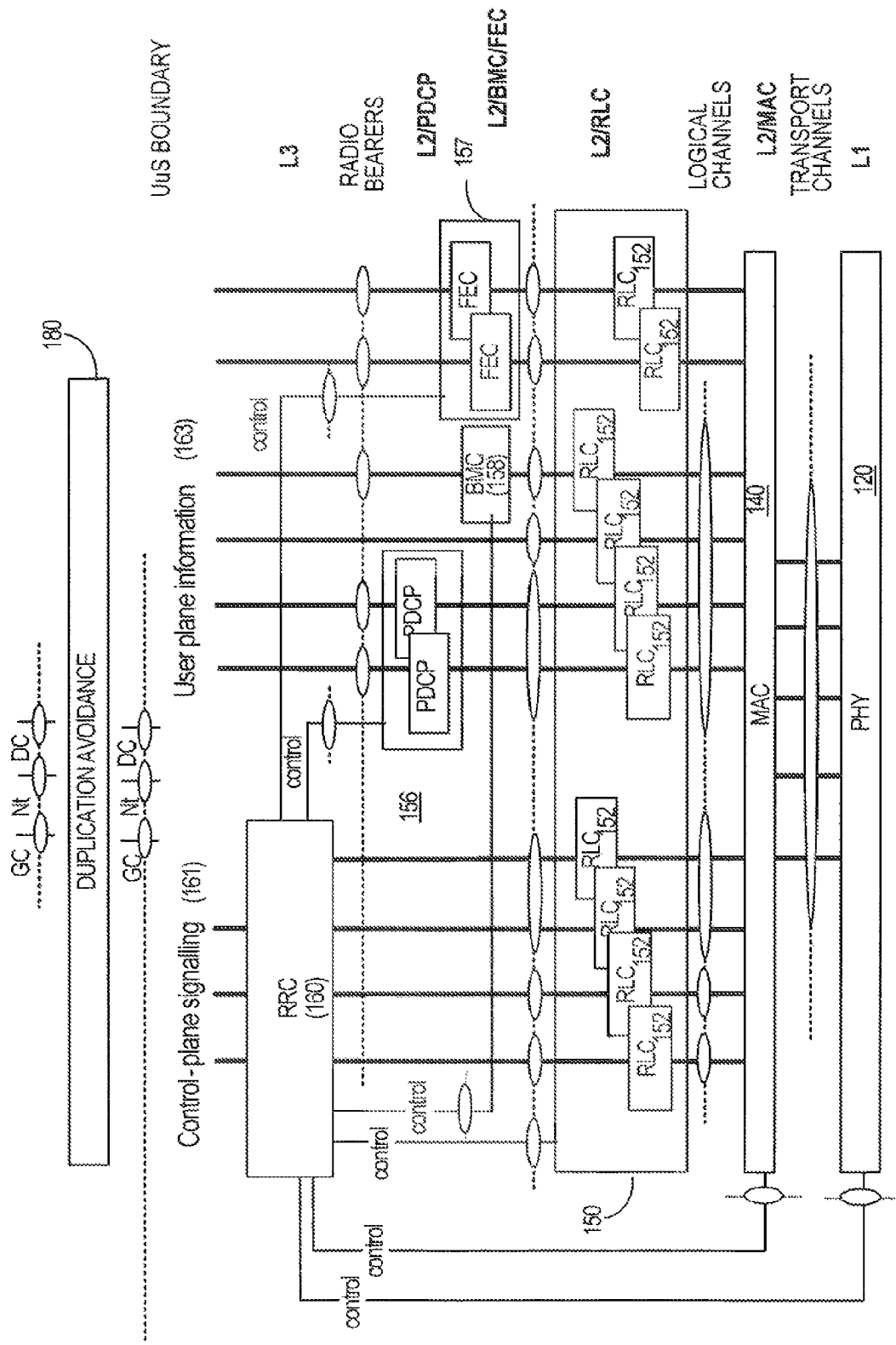
FIG. 7A shows an embodiment of a protocol structure of the access stratum that includes a forward error correction (FEC) layer.
Figure 7B:
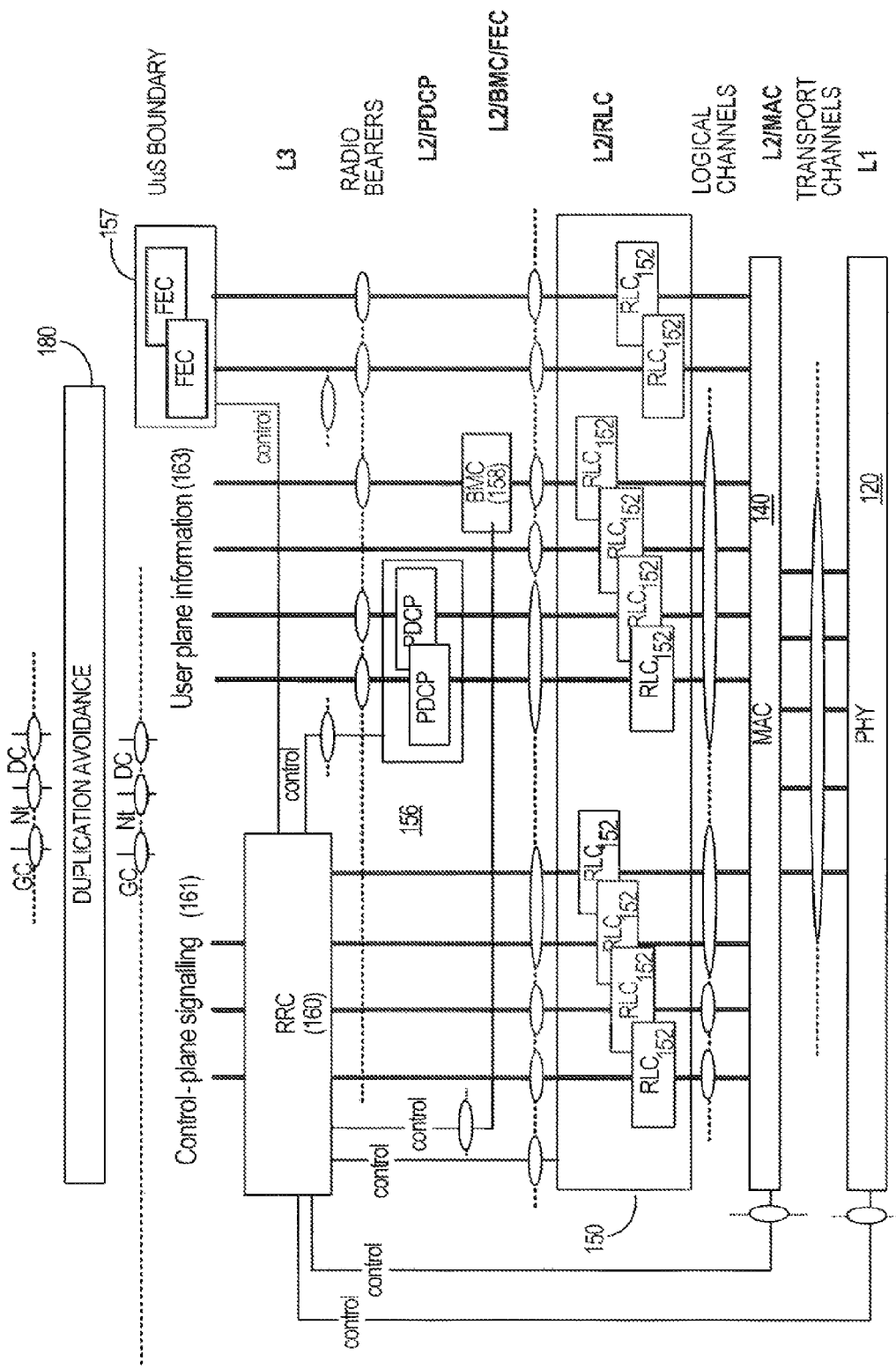
FIG. 7B shows another embodiment of a protocol structure of the access stratum that includes a forward error correction (FEC) layer.

FIGS. 7A and 7B show embodiments of a protocol structures of the access stratum that include a forward error correction (FEC) layer 157 disposed above the Radio Link Control (RLC) layer 150. An embodiment of the Forward Error Correction (FEC) layer is described with reference to FIG. 11.

The Forward Error Correction (FEC) layer 157 receives user-plane information 163 directly over the user plane radio bearers. Because the Forward Error Correction (FEC) layer sits on top of the Radio Link Control (RLC) layer, FEC-Protocol Data Units (PDUs) correspond to the RLC-Service Data Units (SDUs). The FEC layer preferably supports arbitrary SDU sizes (constrained to multiples of 8 bits), variable-rate sources, out-of-sequence reception of packets from lower layers, and reception of duplicate packets from lower layers. FEC PDU sizes can be constrained to multiples of 8 bits.

As described in greater detail below with reference to FIG. 9A, the FEC layer 157 segments and concatenates higher layer blocks of user data, such as SDUs, into equal size rows. Each row can also be referred to as an inner block. Each Protocol Data Unit (PDU) may include overhead. The overhead may include Length Indicators (LIs) that indicate the beginning of the last Protocol Data Unit (PDU) where data from a particular block of user data, such as a Service Data Unit (SDU), can be located. The collection of PDUs comprise an Encoder Packet (EP) or "encoder matrix." The number of PDUs included in an Encoder Packet (EP) depends, among other factors, on the outer-code feat is used. Packing each encoder "matrix" row into an independent or separate Transmission Timing Interval (TTI) can enhance physical layer performance. To reduce buffering burdens, shorter Transmission Timing Interval (TTI) durations can be used.

The Encoder Packet (EP) can then be passed through an outer-code encoder to generate the parity rows. As will be described in greater detail below with reference to FIG. 9A, the FEC layer 157 may perform outer-coding by providing the functionality of a Reed Solomon (RS) coder in the UMTS Terrestrial Radio Access Network (UTRAN) 20 and may perform outer-decoding by providing the functionality of a Reed Solomon decoder in the User Equipment (UE) 10.

The parity rows generated by the outer encoder can be added to the Encoder Packet (EP), and placed in a transmission buffer as a group of inner blocks. Each inner block has information added to it to produce a Protocol Data Unit (PDU). The group of PDUs can then be transmitted.

This FEC layer 157 also allows for the recovery of data belonging to a single EP, even if different inner blocks are received from different cells. This can be achieved through the transmission of a Sequence Number (SN) in the header of each Protocol Data Unit (PDU). In one embodiment, a System Frame Number (SFN) this can help maintain data alignment relative to the Encoder Packet (EP). Sequence numbers are discussed in greater detail throughout this document, for example, with reference to FIGS. 10A and 10B.

The FEC layer 157 may also perform padding and reassembly; transfer of user data; and perform in-sequence delivery of upper layer PDUs, duplicate detection, and sequence number checks.

In the embodiments shown in FIGS. 6 through 7A, the Forward Error Correction (FEC) layer 157 is shown between the Packet Data Convergence Protocol (PDCP) layer 156 and Radio Link Control (RLC) layer 150 (e.g., at the same level as (BMC) layer and below the Packet Data Convergence Protocol (PDCP) layer). By placing the Forward Error Correction (FEC) layer 157 just above the Radio Link Control (RLC) layer 150, performance of the outer code can be optimized since the inner block size matches the "gold" packet size of the packets that are sent over the air. Nevertheless, it should be appreciated that the Forward Error Correction (FEC) layer is shown here only for purposes of illustration and not limitation. Packet Data Convergence Protocol (PDCP) layer 156 may be used on top of Forward Error Correction (FEC) layer 157 for its header compression capabilities. It should be noted that currently the Packet Data Convergence Protocol (PDCP) layer 156 is defined for Point-to-Point (PTP) transmission that uses dedicated logical channels. As shown in FIG. 7B, the forward Error Correction (FEC) layer may be provided anywhere within the Access Stratum above the Radio Link Control (RLC) layer or in the application layer. The Forward Error Correction (FEC) layer may be below or above the Packet Data Convergence Protocol (PDCP) layer. If FEC is performed at the application layer 80, it can apply equally to GSM and WCDMA even though the "gold" packet size would be different for the two.

Outer Code Design

Figure 8:
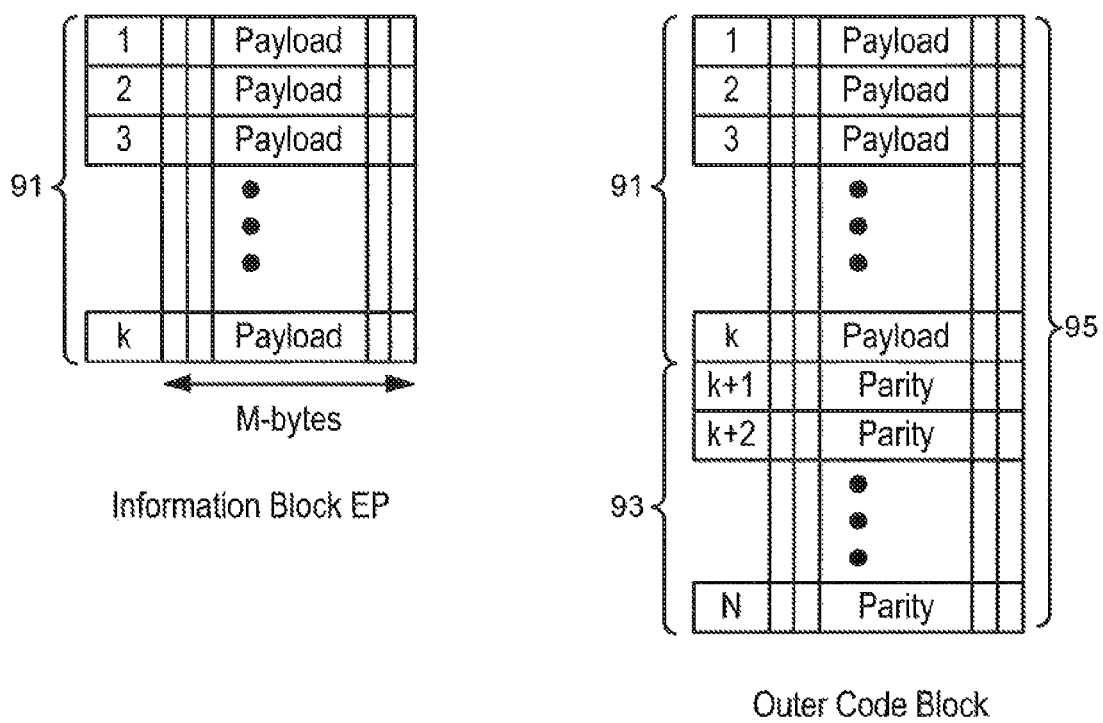
FIG. 8 is a diagram of an information block and outer code block corresponding to the information block.

The new Forward Error Correction (FEC) layer can perform outer-coding on user plane information. FIG. 8 is a diagram that shows an information block 91 and an outer code block 95 to illustrate the concept of outer block code structures. FIG. 9A is a diagram showing an example of how outer code block structures can be applied to Multimedia Broadcast and Multicast Service (MBMS) data 91. Outer-coding can improve physical layer performance when broadcasting delay-tolerant content over an entire cell. Outer codes can, for example, help avoid loss of data during transition between cells and during transitions between Point-To-Point (PTP) transmission mode and Point-To-Multipoint (PTM) transmission mode.

An outer code block 95 can be represented in the form of a matrix that includes k Protocol Data Units 91 and N−k parity rows 93. In outer block coding, data can be assembled into large encoder packet or information block 91 by organizing user data into k payload rows by segmenting, concatenating, and padding data (including insertion of over head into inner blocks), and then encoding the resulting information block 91 to generate N−k parity rows 93 that can be added to the information block 91 to produce an outer code block 95. The parity blocks 93 add redundancy information to the information block 91. The individual rows of the outer code block can then eventually be transmitted over single or multiple Transmission Timing Intervals (TTIs). Redundancy information for the set of Protocol Data Units (PDUs) can allow the original information to be reconstructed even if some of the PDUs are lost during transmission.

Figure 9A:
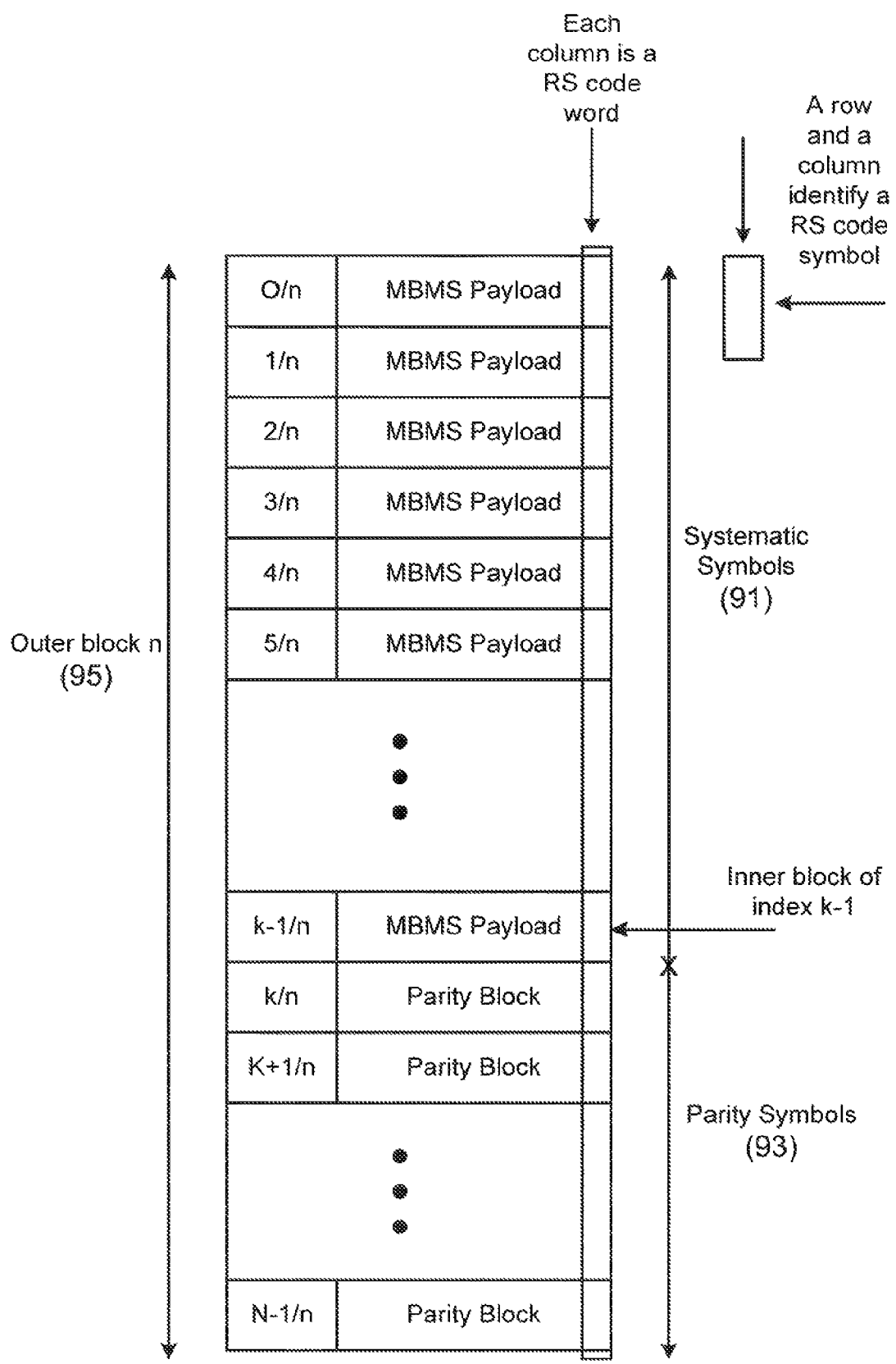
FIG. 9A is a diagram showing an outer code block structure that can be applied to Multimedia Broadcast and Multicast Service (MBMS) data.

FIG. 9A shows an exemplary outer code structure known as a Reed-Solomon (RS) block code. Reed-Solomon (RS) codes can be used to detect and correct channel errors. The outer-code shown in FIG. 9A is a systematic (n,k) block code, where each Reed-Solomon (RS) code symbol comprises a byte of information defined by a row and a column. Each column comprises a Reed-Solomon (RS) code word. If n lost blocks are to be recovered, then at least n parity blocks are required. As such, the amount of memory required increases as the number of parity blocks increases. In Reed-Solomon (RS) coding, N−k parity symbols can be added to the k systematic symbols to generate a code word. In other words, a code word of a Reed-Solomon (RS) code [N,k] has k information or "systematic" symbols and N−k parity symbols. N is the length of the code, and k is the dimension of the code. For every k information bytes, the code produces n coded symbols, the first k of which can be identical to the information symbols. Each row can be referred to as an "inner block," and represents the payload per Transmission Timing Interval (TTI). In regular WCDMA systems, transmission may occur, for example, over the basic WCDMA structure of 20 ms frames (TTIs). The parity symbols can be derived from the systematic symbols using a generator matrix $G_{k \times N}$ defined as:

$$m_{l \times k} \cdot G_{k \times N} = c_{l \times N} \quad \text{(Equation 1)}$$

$$m_{l \times k} = \text{Information word} = [m_0 m_1 \ldots m_{k-1}] \quad \text{(Equation 2)}$$

$$c_{l \times N} = \text{Code word} = [c_0 c_1 \ldots c_{N-1}] \quad \text{(Equation 3)}$$

where $m_i$, $c_i$ belong to an arbitrary Galois Field. For example, if the symbol of a Reed-Solomon (RS) code word is a bit, then the Galois Field of dimension 2 (GF(2)) would be used to describe the decoding operations. In one embodiment, if the symbol is an octet, then the Galois Field of dimension 256 GF(256) can be used to describe the decoding operations. In this case, each information column consists of 1-byte per row. Each information column can be encoded using a [N, k] Reed-Solomon (RS) code over the Galois Field of dimension 256 GF(256). If there are M-bytes per row, the outer block is encoded M times. Therefore, there are N*M bytes per outer block 95.

Erasure Decoding

The outer code structure allows for erasure correction. If the decoder already knows which symbols are in error, the reconstruction of the erroneous systematic symbols requires a relatively little amount of computation. An encoder packet (EP) or matrix refers to the entire set of data at the output of the outer encoder. Redundancy information is taken column wise from each row, and each row that is transmitted has a CRC appended to it that must check to confirm that the data has been sent correctly. In the case of MBMS transmissions, a CRC can be used in each transport channel block that indicates whether an inner block 91 is in error or not, and if the CRC fails, it can be assumed that all the symbols in the block are in error. In an embodiment, if a given inner block 97 is in error, then all bits for that block can be erased. The term "erasure" refers to each symbol belonging to an erroneous block whose CRC has failed. Symbols, which are not erasures, can be assumed correct. Neglecting the CRC undetected error probability, then, each N×1 column contains correct and erased symbols.

The received vector r can be written as:

$$r_{l \times N} = [c_0 e e c_3 c_4 e c_6 c_8 \ldots c_{N-1}] \quad \text{(Equation 4)}$$

where e identifies the erasures.

Erasure decoding allows up to N−k erroneous symbols to be corrected. Because symbols, which are not erasures, can be assumed to be correct, the error correction property of RS codes is typically much better than that of typical RS codes. The size of the CRC used in each inner block should be large enough to ensure that the probability of undetected errors does not exceed the residual outer block probability. For example, if a 16 bit. CRC is used in the inner blocks, then the lower bound of the residual outer block error rate will be $2^{-16} = 1.5 \cdot 10^{-5}$. If there can be no errors in the first k inner blocks, the RS decoding need not be performed since the systematic symbols are identical to the information symbols.

It can be noted that as soon as k blocks with good CRCs are received, the decoding of the outer block can be performed, without waiting for the reception of all the N inner blocks. In order to perform erasure decoding, the modified generator matrix $\Omega_{k \times k}$ can be derived from the generator matrix $G_{k \times N}$ by removing all the columns corresponding to erasures or unnecessary blocks, for example, only the first k good received symbols can be used to identify the modified generator matrix $\Omega_{k \times k}$. The original information word m can be recovered as follows:

$$m_{l \times k} = [\Omega_{k \times k}]^{-1} \cdot \hat{r}_{l \times k} \quad \text{(Equation 5)}$$

where $\hat{r}_{l \times k}$ is the modified received vector obtained with the first k good symbols. The erasure decoding complexity can therefore be reduced to the complexity of a k×k matrix inversion. Thus, use of RS erasure decoding can greatly simplify the computational complexity of RS decoding.

Impact of Data Packing on Outer Code Performance

As will be discussed below with reference to FIGS. 11-13, outer-coding may be used in conjunction wife variable-rate data sources without resulting in exceedingly large overhead if the amount of padding and overhead sent over the air is limited by the particular outer-coding scheme. In the outer-code scheme discussed above, data can be packed into blocks of a given size, and a shortened Reed-Solomon code can be run across the blocks. The encoded packet data can be packed into TTIs in at least two different ways that will now be described with reference to FIGS. 9A and 9B.

Figure 9B:
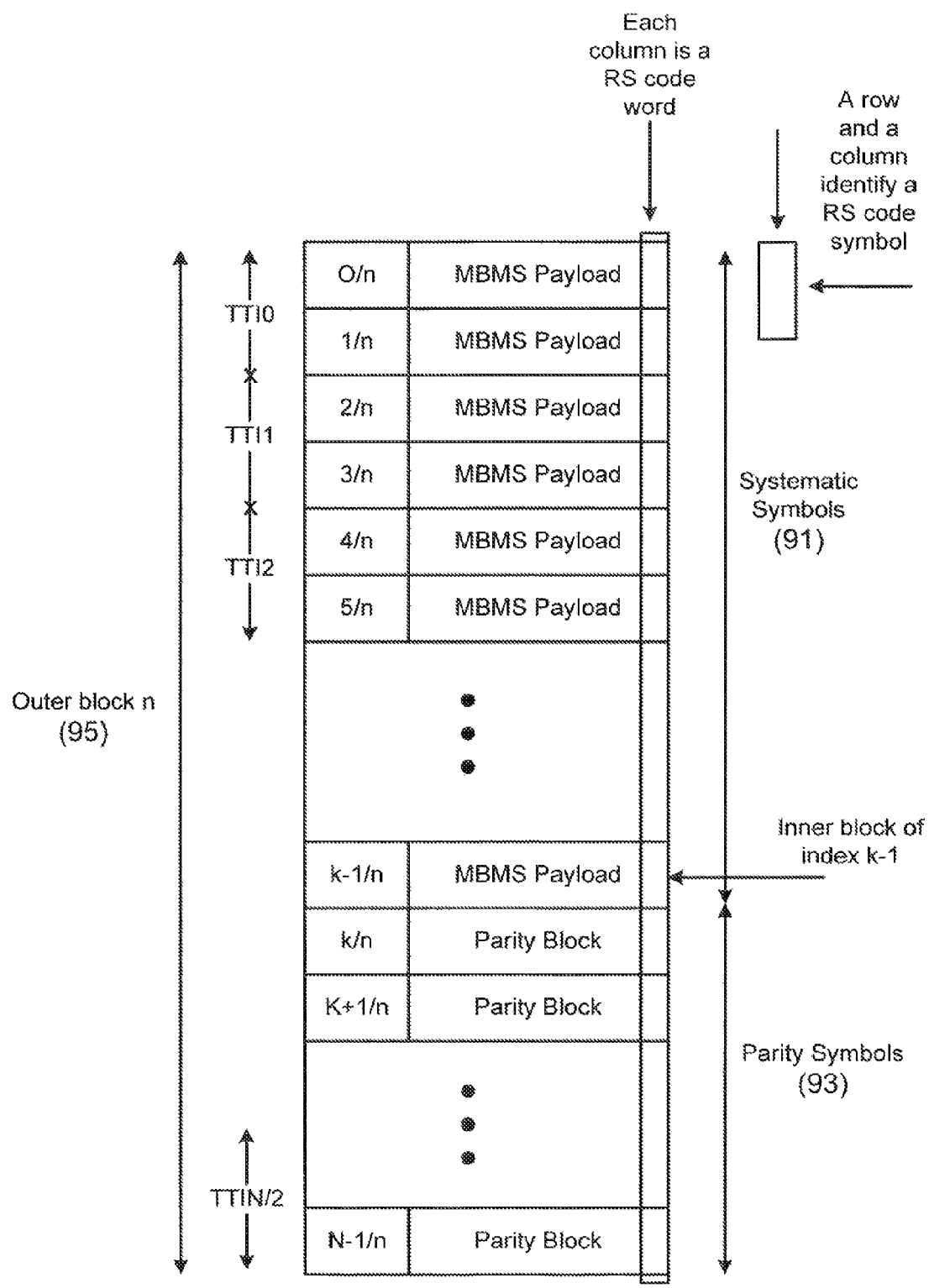
FIG. 9B is a diagram showing the outer code block structure of FIG. 9A in which multiple rows are sent per Transmission Time Interval (TTI).

FIG. 9B is a diagram showing the outer code block structure of FIG. 9A is which multiple rows can be sent per Transmission Time Interval (TTI). According to another aspect of the invention, the data from one row is transmitted in a single TTI. In another embodiment, data from one Encoder Packet (EP) row is put into one TTI such that each TTI contains data from that Encoder Packet (EP) row. As such, each of the rows can be transmitted in a separate WCDMA frame or Transmission Timing Interval (TTI). Transmitting each row in one TTI will provide better performance. In FIG. 9B, both k and n are divided by the number of rows per TTI, and the errors in a row can be totally correlated. This creates an appreciable difference when looking at the EP error rate versus the TTI error rate.

Figure 9C:
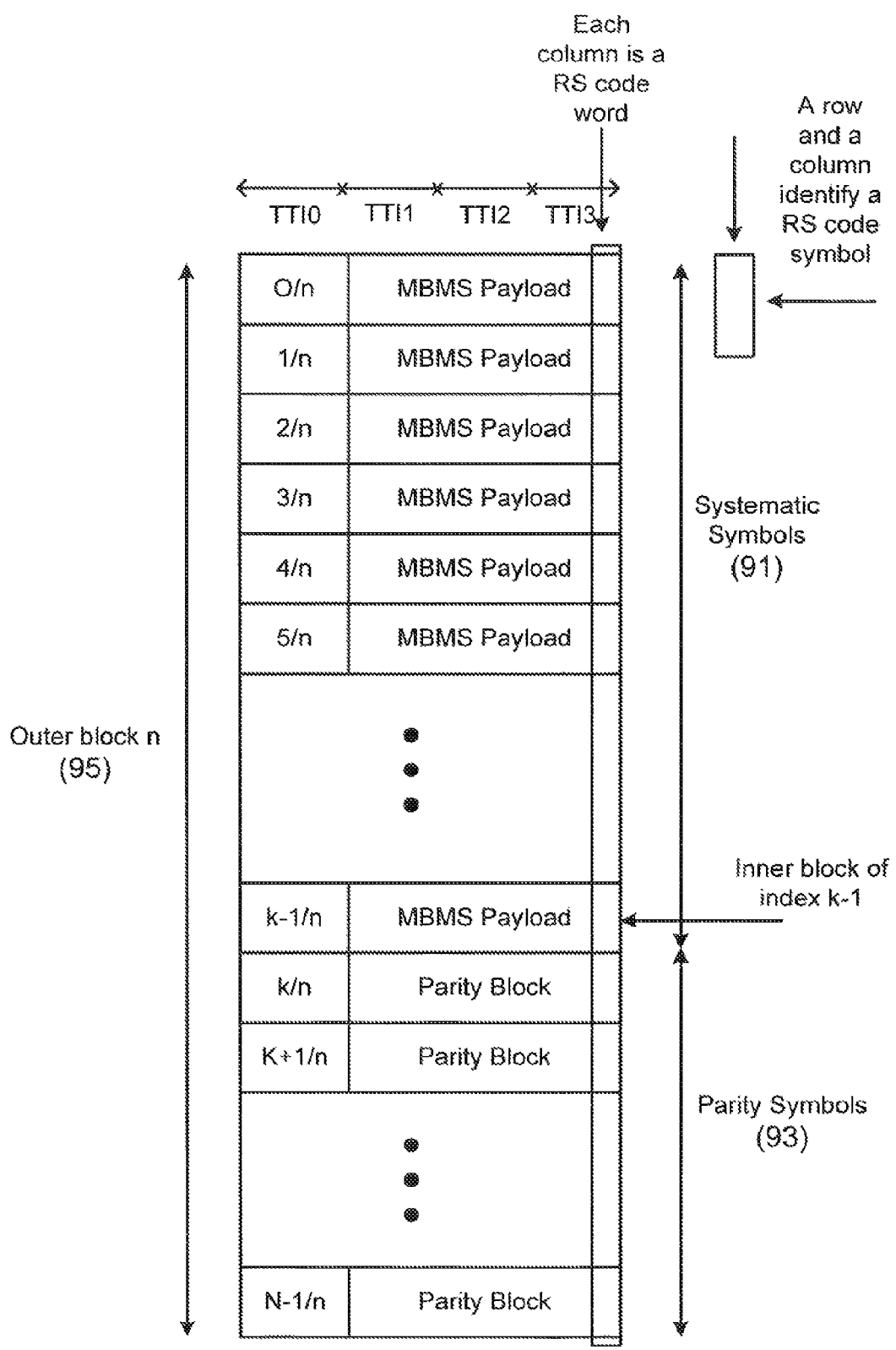
FIG. 9C is a diagram showing the outer block structure of FIG. 9A in which each row is sent in multiple TTIs.

FIG. 9C is a diagram showing the outer block structure of FIG. 9A in which each row can be sent in multiple TTIs. It should be appreciated that while FIG. 9C illustrates sending each row of the Encoder Packet (EP) over tour TTIs (TTI0-TTI3), in reality each row could be sent over any number of TTIs. Since each column is an outer code code-word, each of the four distinct transmission "phases" (TTI0-TTI3) amounts to an independent outer code. In order for the entire packet to be recovered it would be necessary that all of these independent outer codes decode correctly.

Figures 10A, 10B:
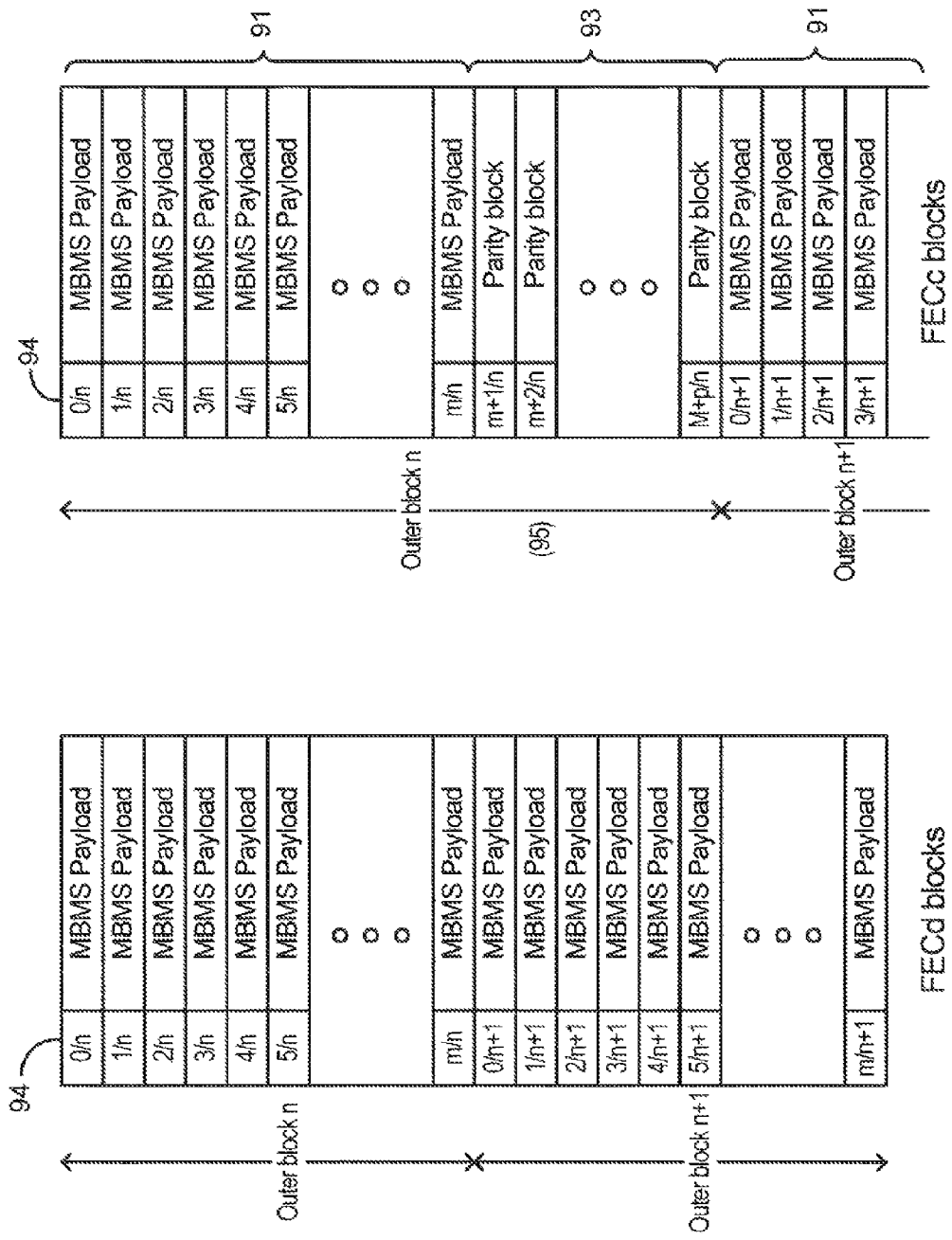
FIGS. 10A and 10B are diagrams that show the outer code blocks generated by the Forward Error Correction layer.

FIGS. 10A and 10B are diagrams that show the outer code blocks generated by the Forward Error Correction layer.

The FECc mode can be used on common or Point-to-Multipoint (PTM) logical channels to construct outer case blocks 95 by adding parity rows or blocks 93 to the MBMS payload data 91. Each outer block 95 includes a plurality of inner blocks 91, 93. Identifying the sequence of inner blocks and their position relative to encoder packets can allow each available inner block to be placed in the correct position so that outer-decoding can be done correctly. In one embodiment, each inner block includes a header 94 that identifies the inner block by an inner block number m and an outer block number n. For example, outer block n includes a data portion 91 with m inner Multimedia Broadcast and Multicast Service (MBMS) payload blocks, and a redundancy portion 93 having M−(m+1) inner parity blocks. According to this embodiment, the sequence number space can be optimized for MBMS and can be defined by a number of distinct sequence numbers, for example, 0 through 127. The sequence number space should be big enough so that the same sequence number will not appear after a reception gap caused by a transition of any kind. The receiving UE should be able to determine the order of the inner blocks, even if some inner blocks are lost. If the UE loses more inner blocks than can be identified by the whole sequence number space, the UE will not be able to reorder the inner blocks correctly. The sequence number of the same inner block is identical across the FECd blocks and FECc blocks. The FECd blocks do not include the redundancy portion 93 utilized in the FECc blocks. The FECd entity and FECc entity may use the same bit rate over the air.

Transmitting Side

The transmitting Forward Error Correction (FEC) entity 410 includes a Service Data Unit (SDU) buffer 412 for receiving SDUs, a segmentation and concatenation unit 414, an outer encoder 416 that performs Reed-Solomon (RS) encoding, a sequence number generator 418 that adds a sequence number to the encoded PDUs, a transmit buffer 420 transmits the PDUs over the logical channels 406, and a scheduling unit 422.

The Service Data Unit (SDU) buffer 412 receives user data (FEC SDUs) in the form of Service Data Units (SDUs) on radio bearer 402 as indicated by the arrow, and stores FEC SDUs from the higher layers. The receive buffer 412 communicates to the scheduling unit 422 how much date will be transmitted.

As discussed above, the amount of time it takes to fill-up an Encoder Packet (EP) will typically vary since the source data-rate typically varies. As explained with reference to FIG. 13, frame-fill efficiency can be improved by having flexibility in deciding when to start packing the data. The amount of padding introduced can be reduced by delaying the creation of the EP as much as possible based on the jitter tolerance of the receiving FEC entity 430.

The scheduling entity 422 can decide when to start the encoding. The scheduler 422 preferably determines how long it is possible to wait before a packet needs to be sent out, based on QoS profile for that particular service. Once the scheduler 422 establishes that enough data has accumulated, or that the maximum acceptable packet transmission delay has been exhausted, it triggers the creation of an Encoder Packet (EP) 91. The segmentation and concatenation unit 414 splits the Service Data Unit (SDU) into the various rows and generates the Length Indicators (LIs).

The scheduling unit 422 preferably decides the optimal row size of the EP or Protocol Data Unit (PDU) so that the SDUs fit exactly into the number of rows (e.g., 12). Alternatively, the scheduler 422 selects an FEC PDU size, from of those configured by the RRC, that will result in the least possible padding, and requests that the Segmentation & Concatenation function 414 formats the SDUs into k blocks of size PDU_size-FEC_Header_size. This formatting can vary. Examples of different types of formatting are discussed below with reference to FIGS. 12-13. The total amount of data considered should include the overhead that will be incorporated by the concatenation and segmentation function 414. To generate the Encoder Packet (EP), the scheduler 422 requests that the concatenation and segmentation function 414 produce k PDUs of that size. This size includes re-assembly information. In one embodiment, the PDUs can have sizes in multiples of 8 bits, and the data of consecutive PDUs correspond to different symbols in the code-words.

The k PDU blocks can then be run through the outer encoder 416 which performs, Reed-Solomon (RS) encoding. The outer encoder 416 encodes the data in the Encoder Packet (EP) matrix by generating and appending redundancy or parity information to the Encoder Packet (EP) matrix to create an outer code block. In an embodiment, the outer-code can be assumed to be an (n, k) erasure-decoding block code and the outer encoder generates n−k parity blocks. The encoder performs the encoding on k rows of information of equal length and delivers to the lower sub-layer n Protocol Data Units (PDUs) of that same size. The first k blocks are identical to the ones it receives, and the following n−k blocks correspond to the parity information.

The scheduler 422 also monitors time alignment or relative timing of PTM streams, and performs transmissions to adjust the alignment of different logical streams. For example, during re-configurations, the time alignment between PTP and PTM logical streams can be adjusted to benefit the service continuity. The best performance can be obtained when the streams are perfectly synchronous.

Different base stations (or different modes of transmission PTP, Point-to-Multipoint (PTM)) transmit the same content stream, but the streams can be misaligned. However, if the Encoder Packet (EP) format of the data streams is the same, then the information on each stream is exactly the same. Adding a sequence number to each outer block allows the User Equipment (UE) to combine the two streams since the User Equipment (UE) will know the relationship between the two streams.

The sequence number generator 418 appends a sequence number at the front of each block, in the same sequence as what was used in the encoder 416 to create PDUs. In an embodiment, the sequence number generator adds, for example, an eight bit sequence number at the front of each outer code block to generate PDUs. Additional overhead information can also be added to the outer code block. The sequence number space should be large enough to accommodate the worse case time-difference between streams. Therefore, in another embodiment, a sequence number space of 20 can be used, and at least 5 bits can be reserved in each header for the sequence number. This header can be appended to the outer code block after the Reed-Solomon (RS) encoding is performed, and therefore this "outer" header is not protected by the outer-code. Sequence numbers are preferably also added to for parity blocks, even if they can not be transmitted. In one embodiment, the sequence number phase can be aligned with the encoder packet boundary. A sequence number roll-over would correspond to the reception of a new encoder packet.

Forward Error Correction (FEC) Header Format

As noted above, synchronization of data streams can be achieved by introducing a sequence number that includes information associated with the PDU ordering. In addition to re-ordering and duplicate detection, the sequence number allows the data from respective sources that are included in an encoder packet to be realigned. This sequence number can explicitly identify the order in which each packet should be considered. This sequence number can make up an "FEC header" that can be appended to both information Payload Units (PDUs) and parity blocks after the encoding is performed. The sequence number should not be protected by the outer-code since it is needed for the decoding.

Figure 14:
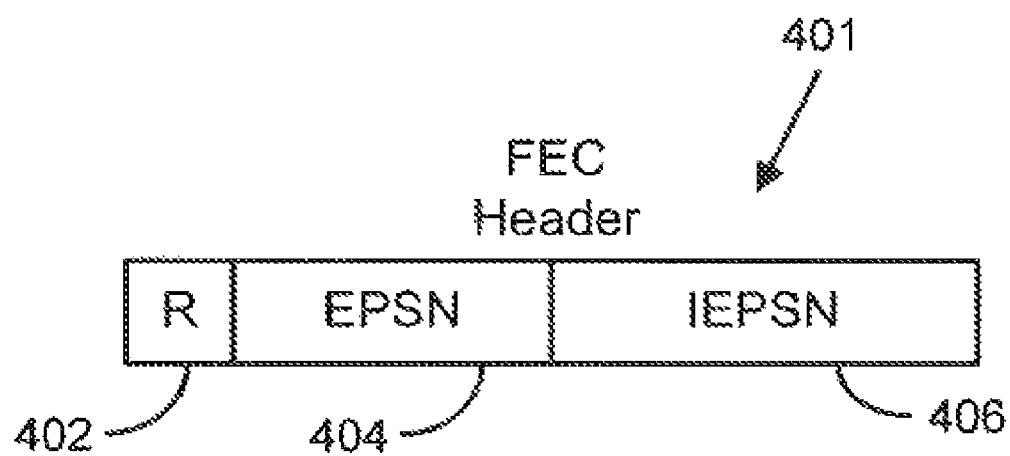
FIG. 14 is a diagram of an embodiment of a Forward Error Correction (FEC) header format.

FIG. 14 is a diagram of an embodiment of a Forward Error Correction (FEC) header format. To facilitate alignment of the data with the Encoder Packet (EP), the sequence number can be split to include a reserved portion (R) 402, a Encoder Packet (EP) portion 404 that identifies the EP (EPSN), and an intra Encoder Packet that identifies the location of a particular inner block within the Encoder Packet (IEPSN) 406.

It is desirable for the FEC layer 400 to be able to interoperate with all Radio Link Control (RLC) modes. Since Radio Link Control (RLC) AM and Radio Link Control (RLC) UM both require Service Data Units (SDUs) to have sizes in multiples of 8 bits, then it would be desirable for the FEC layer 400 to also adhere to this requirement. Because the outer-code for the FEC layer 400 operates on byte size increments of data, the Encoder Packet (EP) row size would also need to be an integer number of bytes. Hence, the FEC header size 401 should also be a multiple of 8 bits for the FEC Protocol Data Unit (PDU) size to be acceptable for Radio Link Control (RLC). In one embodiment in which the Forward Error Correction (FEC) header 401 can be one byte, with a reserved portion (R) 402 comprising a single bit, the portion that identifies the EP (EPSN) 404 comprising 3 bits, and the IEP portion that identifies the location of the PDU within the Encoder Packet (IEPSN) 406 comprising 4 bits. In this embodiment, an 8 bit sequence number is used since it is expected that one PDU will be sent per TTI and since the transmission timing of different cells is not expected to drift by more than 100 ms.

The transmit buffer 420 stores the PDUs until a frame of data accumulates. When the PDUs are requested, the transmit buffer 420 transmits the frames one by one over the radio interface (Uu) via a logical channel to MAC layer. The MAC layer then communicates the PDUs via transport channels to the physical layer where the PDUs can be eventually communicated to the UE 10.

Receiving Side

Figure 11:
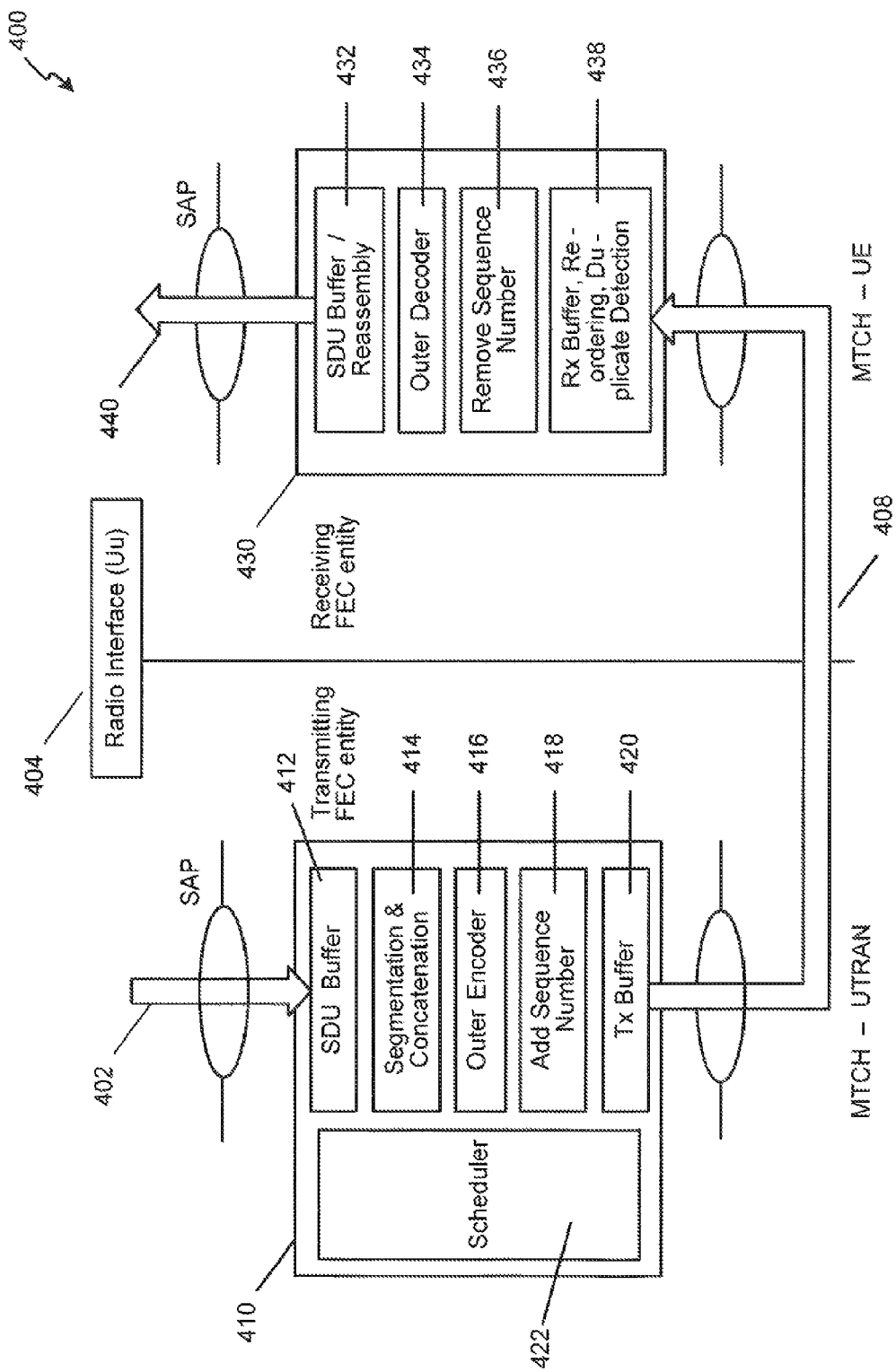
FIG. 11 is an embodiment of a Forward Error Correction (FEC) layer used in a RLC UM+ entity.

Still referring to FIG. 11, the receiving Forward Error Correction (FEC) entity 430 includes a receive buffer/reordering/duplicate detection unit 438, a sequence number removal unit 436, an outer decoder 434 that performs Reed-Solomon (RS) decoding, and a reassembly unit/Service Data Unit (SDU) transmit buffer 432.

Information rows of the EP matrix correspond to PDUs. To support outer coding the receiving Forward Error Correction (FEC) entity 430 accumulates a number of FEC PDUs before triggering the outer decoding. To achieve continuous reception, despite the need to decode encoder packets, the User Equipment (UE) buffers the incoming Protocol Data Units (PDUs) while performing the decoding.

The receive buffer 438 may accumulate PDUs until the entire Encoder Packet (EP) is received or until the scheduling unit (not shown) is satisfied that there are no more retransmissions for the Encoder Packet (EP). Once it is decided that there will be no more data received for a given encoder-packet, missing PDUs can be identified as erasures. In other words, PDUs that did not pass the CRC test will be replaced by erasures in the de-coding process.

Because some blocks could be dropped during transmission, and also because different data streams may have different delays, the receiving Forward Error Correction (FEC) entity 430 performs duplicate detection and potentially re-ordering of received blocks in the receive buffer/reordering/duplicate detection unit 438. The sequence number can be used in each FEC Protocol Data Unit (PDU) to assist with reordering/duplicate detection. The sequence number can be used in the receive buffer 438 to reorder the data received out of order. Once PDUs are reordered, the duplicate detection unit detects duplicate PDUs in the Encoder Packet (EP) based on their sequence numbers, and eliminates any duplicates.

The sequence numbers can then be removed. The sequence number removal unit 436 removes the sequence number from the Encoder Packet (EP) since the sequence number can not be part of the block sent to the Reed-Solomon (RS) decoder.

The data can then be passed to the outer-decoding function 434 to recover missing information. The outer decoder 434 receives the Encoder Packet (EP), and, if necessary, Reed-Solomon (RS) decodes the Encoder Packet (EP) by using the parity information to regenerate any erroneous or missing rows. For example, if all k Protocol Data Units (PDUs) containing information are not received correctly, or fewer than k out of n PDUs are not received correctly, then the Protocol Data Units (PDUs), up to the size of the parity PDUs, outer decoding can then be performed to recover the missing information PDUs. At least one parity PDU will be available at the receiver whenever outer decoding is performed. If all k Protocol Data Units (PDUs) containing information are received correctly, or fewer than k out of n PDUs are received correctly, then decoding is unnecessary. The information Protocol Data Units (PDUs) can then be delivered to the re-assembly function 432.

Independently of whether the outer decoding was successful or not, the information rows can then be delivered to the re-assembly unit/function 432. The reassembly unit 432 reassembles or reconstructs the SDUs from the information rows of the Encoder Packet (EP) matrix using the Length Indicators (LIs). Once SDUs are successfully put together, the Service Data Unit (SDU) transmit buffer 432 transmits the Service Data Units (SDUs) over the radio bearer 440 to deliver the SDUs to the higher layers.

At the receiving Forward Error Correction (FEC) entity 430, enabling UEs to delay the decoding by a time-offset between different logical streams can allow the system to take full advantage of potential out-of-sequence reception of data due to lack of synchronization between logical streams. This smoothes out service during hand-offs as well as transitions between PTP and PTM. An algorithm for enabling UEs to delay the decoding by the time-offset between different logical streams is discussed with reference to FIG. 15.

Encoder Packet (EP) Options: Fixed or Variable Row Size

The FEC or outer-code entity has flexibility as to when Protocol Data Units (PDUs) can be constructed since the Protocol Data Units (PDUs) do not need to be sent continuously at every Transmission Timing Interval (TTI). This can result in better frame-fill efficiency, and less padding overhead.

If desired, the outer-code entity can generate a payload at each Transmission Timing Interval (TTI). Protocol Data Units (PDUs) can be constructed in real-time as Service Date Units (SDUs) can be received from the higher layers. If there is not enough data to build a Protocol Data Unit (PDU), then the RLC can add padding.

Fixed Row Size Encoder Packets (EPs)

When encoding the SDUs 201-204 it is desirable to reduce amount of padding that will be transmitted as much as possible.

In one embodiment, the row size of the Encoder Packet (EP) matrix 205 may be of a fixed size. A priori knowledge of the Encoder Packet (EP) matrix 205 row size can allow alignment of the data back to their original configuration. Because the row size of SDUs 201-204 that will be sent within is known in advance, transmission can start as soon as the data is received without waiting to see how much data is to be sent.

Figure 12A:
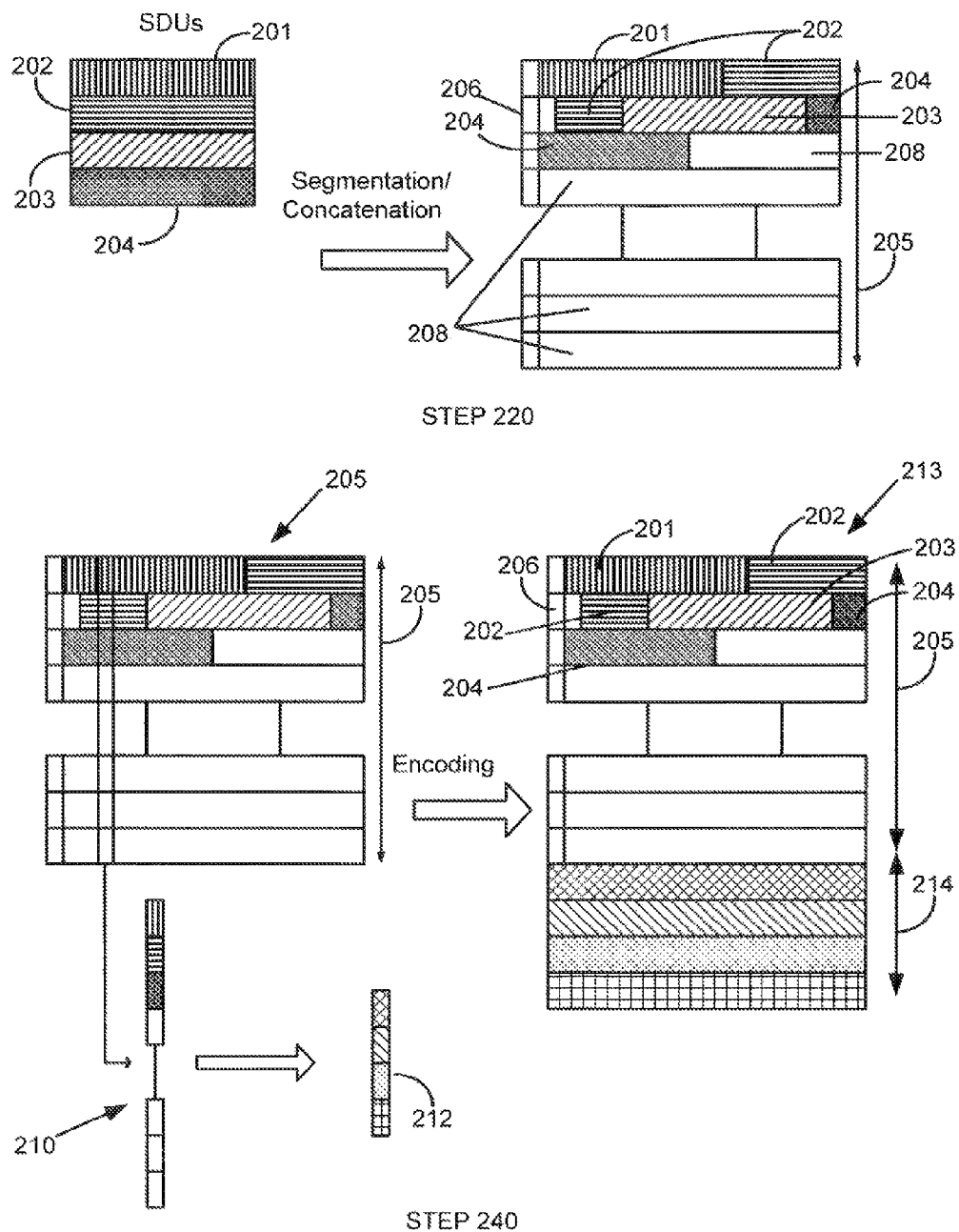
FIG. 12A shows an encoding process for creating an outer code block from data units in which row sizes of the outer code block are fixed.

FIG. 12A shows an example of an encoding process for creating an outer code block 214 from data units 201-204 in which row sizes of the outer code block 214 can be fixed. In this example, user data takes the form of a plurality of Service Data Units (SDUs) 201-204 that include an arbitrary size block of bits, the size of which depends upon the particular application (video, voice, etc.).

In order to be able to transmit FEC SDUs of arbitrary sizes, segmentation, concatenation and padding can be performed at FEC level. Although concatenation is not strictly necessary, its absence would lead to significant degradation in higher layer data throughput.

The higher layer SDUs 201-204 can first be formatted into this fixed PDU size. In this embodiment, a segmentation/concatenation function generates inner blocks of a fixed size that can be indicated to the subscriber unit. At step 220, the group of inner blocks can be segmented and concatenated to become part of an encoder packet matrix 205 that includes inner blocks, padding 208 to the extent necessary, and length indicators (LIs) 206 that can be used to point to an end of the Service Data Unit (SDU) 201-204 by indicating how many SDUs and in a given row of the EP. The outer encoder, discussed below, uses these inner blocks to produce redundancy blocks.

In the Radio Link Control (RLC), a Length Indicator (LI) indicates the end of each Service Data Unit (SDU) which is identified relative to the Protocol Data Unit (PDU), rather than the Service Data Unit (SDU). This helps in reducing the overhead since the PDU size is typically smaller than that of the Service Data Unit (SDU). For example, a Length Indicator (LI) can be used to indicate the last octet of each FEC Service Data Unit (SDU) ending within the Payload Data Unit (PDU). The "Length Indicator" can be set to the number of octets between the end of the FEC header and up to the last octet of an FEC SDU segment. The Length Indicator (LI) can be preferably included in the PDUs that that Length Indicator (LI) refers to. In other words, the Length Indicators (LIs) preferably refer to the same Payload Data Unit (PDU) and are preferably in the same order as the FEC SDUs that the Length Indicator (LI) refers to.

When the outer block is received, information, such as Length Indicators (LIs), can be used to let the receiver know where the Service Data Unit (SDU) and/or padding start and end.

Because it is not possible to use a bit in the FEC Header to indicate the presence of a Length indicator (LI), the FEC layer adds a fixed header within the payload that indicates the presence of Length Indicators (LIs). An inner header or LI provides ail the information seeded for re-constructing the SDUs 201-204. The LI can be included in the RLC-PDU to which it refers. The presence of the first LI can be indicated by a flag included in the sequence number header of the RLC-PDU. A bit in each LI can be used to indicate its extension. To allow the length of the Length Indicators (LIs) to change with FEC PDU size, a new special value for the one byte Length Indicators (LIs) may be introduced indicating that the previous SDU ended one byte short of filling the last PDU. The Length Indicators (LIs) presence bit can be implemented in a variety of ways, two of which are discussed below.

In one embodiment, a Length Indicator (LI) presence bit can be provided in each protocol data unit (PDU). For example, a byte can be added at the beginning of each Encoder Packet (EP) row, and a bit in that byte indicates the presence of the LI. The entire first byte of each Protocol Data Unit (PDU) may be reserved for this "presence bit." In order to accommodate this presence bit, the length indicator data can be shortened by one bit. Providing a presence bit in each Pocket Unit (PDU) allows SDUs to be decoded when the EP decoding fails, even if the first PDU is missing. This can result in lower residual error rate. Providing a presence bit in each PDU also allows for real-time concatenation/segmentation.

In another embodiment, a Length Indicator (LI) presence bits can be provided in the first PDU. Instead of adding the overhead at the beginning of each PDU, the presence bits for all k information PDUs can be added at the beginning of the first PDU of the EP. Providing the presence bit at the beginning of Encoder Packet (EP) results in less overhead when having large SDUs and/or small PDUs.

After segmentation and concatenation, the EP 205 includes a number of rows occupied by at least one of the plurality of Service Data Units (SDUs) 201-204 and padding blocks. The row size of an outer block can be designed so that each row can be transmitted during one Transmission Timing Interval (TTI) at a peak data rate. Service Date Units (SDUs) generally can not be aligned with the amount of data sent during a Transmission Timing Interval (TTI). Thus, as shown in FIG. 11, the second and fourth SDUs 202, 204 do not fit into the Transmission Timing Interval (TTI) of first and second rows, respectively, of the EP. In this example, the EP has 12 rows available for data, and the four SDUs 201-204 can be packed into the first three rows of these 12 rows. The remaining rows of the EP 205 can be occupied by padding blocks 208. Thus, the second SDU 202 can be split so that a first portion of the second Service Data Unit (SDU) 202 starts in the first row of "information block" and a second portion of the second SDU 202 ends in the second row. Similarly, the third SDU must be split so that a first portion of the third Service Data Unit (SDU) 203 starts in the second row and a second portion of the third SDU 203 ends in the third row. The fourth Service Data Unit (SDU) 204 fits within the third row, and the remainder of the third row can be filled with padding blocks 208. In this example, the Encoder Packet (EP) 213 is mostly made up of padding 208.

The encoder uses the EP to generate redundancy or parity information. At step 240, an encoder encodes the intermediate packet matrix 205 encoded by adding outer parity blocks 214 to generate an outer code block 213 that is 16 blocks in length. The encoder extracts 8 bits of data from each column of each block to create resulting data 210. A Reed-Solomon (RS) encoder encodes the resulting data 210 to obtain four rows of redundancy or parity information 212. The parity information 212 can be used to generate outer parity blocks 214 that can be appended to the EP matrix 205 to generate the 16 block outer code block 213.

Figure 12B:
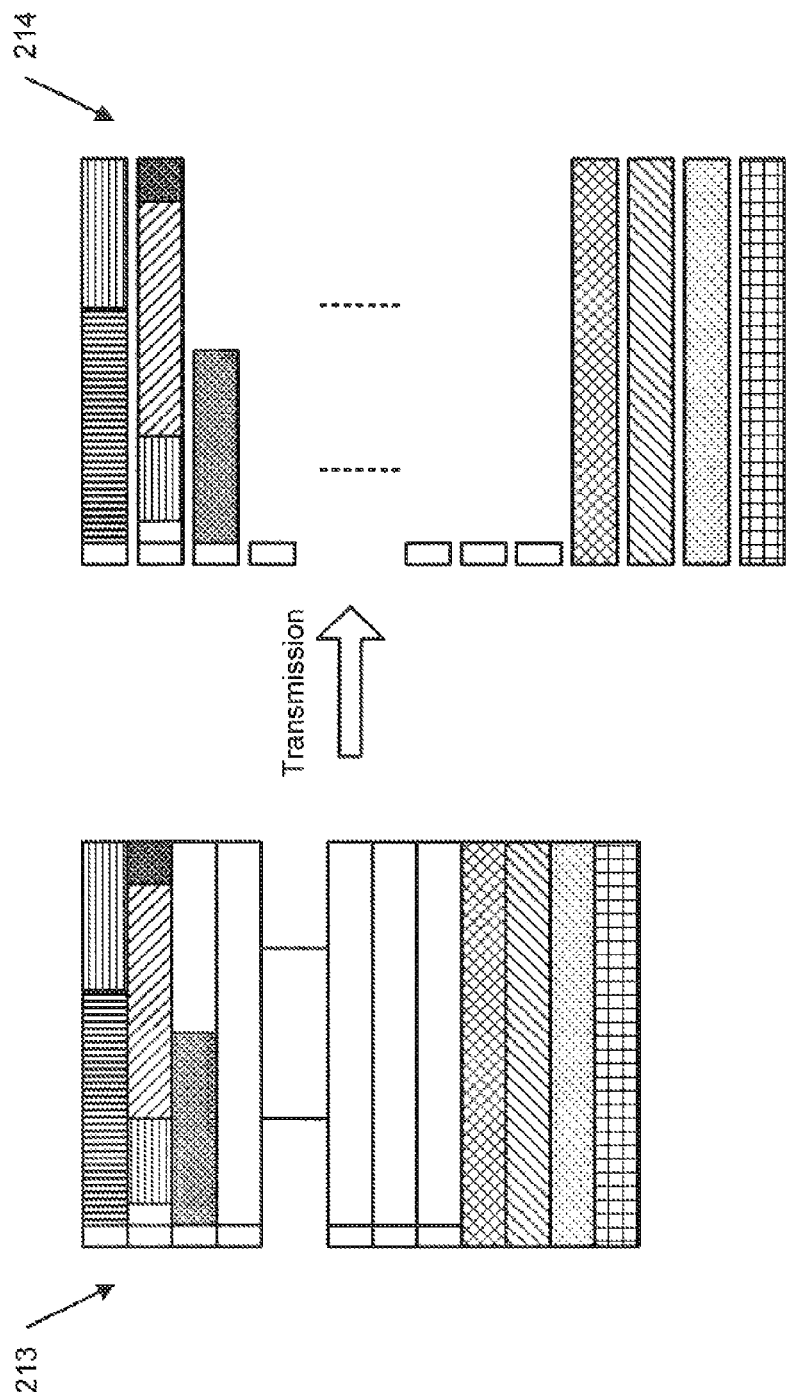
FIG. 12B shows an example of information transmitted over the air in FIG. 12A.

FIG. 12B shows an example of the information transmitted over the air in the example discussed above. At step 260, after adding additional overhead that includes the sequence number to each row of the EP 205, the 16 block outer code block 213 can be transmitted over the air as Protocol Data Units (PDUs) 214. The full or entire Encoder Packet (EP) 213 matrix is not transmitted in the Protocol Data Units (PDU) 214 sent on the downlink. Rather, the Protocol Data Units (PDU) include the information bits 201-204 and the length indicators (LIs) 206 of the Encoder Packet (EP) matrix 213. Since the Encoder Packet (EP) 213 row size is fixed and therefore known at the receiver, it is unnecessary to actually transmit the padding 208 over the air. Padding information 208 is not transmitted on the downlink since the padding values are known, and therefore there is no need to transmit the padding information 208. For example, if the padding can be made up of a known sequence of bits such as all zeros, all ones, or an alternate pattern of zeros and ones, the receiver can pad the Protocol Data Units (PDUs) 214 up to the nominal Encoder Packet (EP) 213 row length. Therefore, during transmission, instead of selecting the PDU size equal to the EP row size, the smallest available EP size that carries all the information bits 201-204 and re-assembly overhead (e.g., LIs) 206 can be utilized.

Although the encoder matrix row size is fixed, the FEC PDU size could be selected from a given set at each transmission such that each includes all the information part of a single encoder matrix row (the padding could be excluded). When receiving a PDU of size smaller than the encoder matrix row size, the UE can pad up to that size with a known bit sequence. This allows the inner block size to remain fixed, without increasing the load on the air interface. Using a fixed row size Encoder Packet (EP) 213 can thus eliminate the need to wait until all the data is available before starting to transmit Protocol Data Units (PDUs), and can also eliminate the need to send padding.

If the algorithm above is implemented to handle variable rate transmission, then a rate equalization scheme can be used in which all encoder packet matrix rows have constant size. Smaller PDUs could be used when padding makes up part of the PDU. The padding can be made up of a specific bit sequence, and can be located at the very end of the data. At the receiver, the size of the blocks received from the lower layers can be equalized to a base-line size by appending padding at the end.

If a predefined sequence of bits can be used for padding, this padding is not transmitted over the air. The receiver does not need to know the actual encoder packet row size unless the receiver needs to run the outer-decoding. Basic SDU re-assembly does not require knowledge of the amount of padding at the end of a PDU. If all the PDUs containing information from the first k Encoder Packet (EP) rows are received, then outer decoding is unnecessary. By contrast, if at least one PDUs containing information from the first k Encoder Packet (EP) rows is missing, then at least one of the PDUs containing the data from a parity row is needed. Since parity rows not generally padded, the size can be used as a reference for the actual encoder packet size that needs to be assumed.

Variable Row Size Encoder Packets (EPs)

Figure 13:
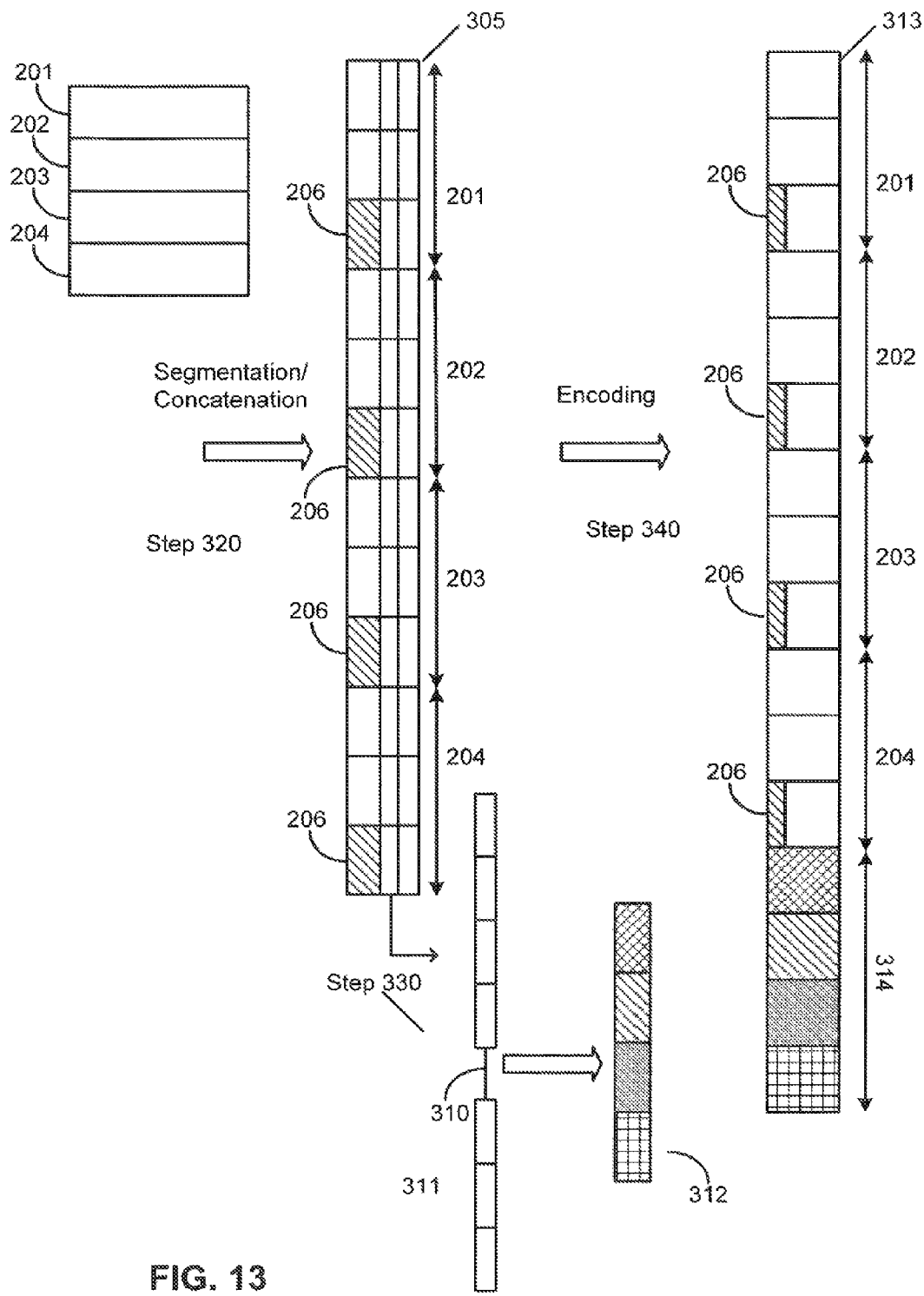
FIG. 13 shows an encoding process for creating an outer code block having a variable row size.

FIG. 13 shows an encoding process for creating an outer code block 313 having a variable row size.

This aspect of the invention relates to flexible outer block coding of data transmitted over the air interface. This encoding process results in less padding being transmitted so that frame fill efficiency increases. The Encoder Packet (EP) 305 rows can be variable size, and a different sized outer block can be sent for each Transmission Timing Interval (TTI). Preferably, the row size of the Encoder Packet (EP) 305 changes such that the SDUs fit exactly into the number of rows (e.g., 12) of the Encoder Packet (EP) matrix 305. In this embodiment, the FEC layer must wait for all of the data to be available before building the EP so that the FEC layer may determine the optimal row size. The row size can be selected from a number of different sizes based on the amount of data available so as to limit padding. The row size of the Encoder Packet (EP) can be linked to the set of PDU sixes that are configured for the S-CCPCH. Depending on the amount of data available at the time when the encoder packet 305 seeds to be generated, the row size that results in the least padding can be selected. By decreasing the size of the outer block 313 so that the block size can be smaller in each frame, data can be sent at a reduced transmission rate since less data is sent over the same TTI duration. Using a variable row size of the Encoder Packet (EP) 305 helps stabilize power requirements across all transmissions for Encoder Packets (EPs), and also utilizes less parity overhead 314. This embodiment works well with Point-to-Multipoint (PTM) transmissions in systems such as WCDMA in which the underlying wireless protocol allows the size of the transport block sent in each Transmission Timing Interval (TTI) to be varied.

At step 320, a plurality of Service Data Units (SDUs) 201-204 can be segmented and concatenated to generate an Encoder Packet (EP) matrix 305 in which length indicators (LIs) 206 can be used to point to an end of the Service Data Unit (SDU) 201-204. Length Indicators (LIs) can be included in the last row in which each Service Data Unit (SDU) terminates.

At step 330, redundancy or parity information is generated on a column basis by extracting eight bits of data from each data block, and the resulting data 310 can be sent to a Reed-Solomon (RS) encoder to obtain parity information 312. Because the rows of the Encoder Packet (EP) matrix 305 are smaller, less redundancy information can be generated.

At step 340 encoding continues, as the parity information 312 is used to generate outer parity blocks 314 that can be appended to the twelve block Encoder Packet (EP) matrix 305 to thereby generate an outer code block that in this example is 16 blocks in length. This embodiment avoids padding transmission which improves transmission efficiency since the entire outer code block 313 is occupied by either SDUs, Length Indicators (LIs) 206, and/or redundancy information 314. In this specific example no padding was needed. It should be appreciated that, however, in some cases because the number of configured sizes of the PDU will be limited, and some padding may be needed albeit a reduced amount of padding. This results in greater frame fill efficiency, and can also allow a more constant power to be maintained across the entire Encoder Packet (EP). This is desirable in CDMA systems that utilize power control schemes.

Although not shown, transmission of PDUs over the air would occur in a manner similar to that discussed above with respect to step 260 of FIG. 12.

FIG. 11 is an embodiment of an outer coding or Forward Error Correction (FEC) layer 400 having a RLC Unacknowledged Mode (UM)+ entity (RLC UM+) provided above the Radio Link Control (RLC) layer. Typically, the Radio Link Control (RLC) provides framing for higher layers. Here, the FEC layer that sits above Radio Link Control (RLC) performs framing.

Figure 15:
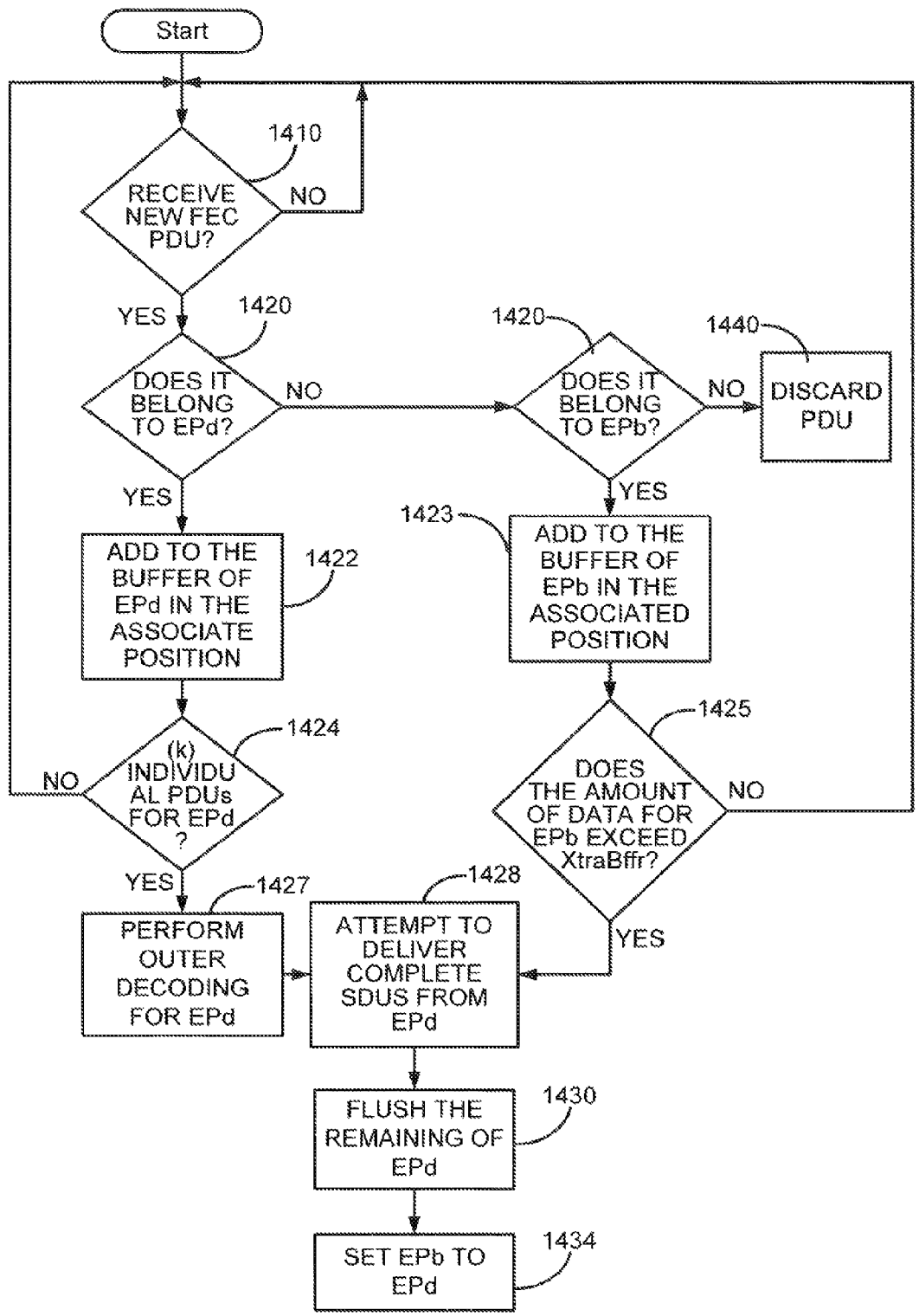
FIG. 15 is an algorithm for enabling mobile stations to delay decoding by the time-offset between different logical streams.

The outer coding layer 400 includes a transmitting Forward Error Correction (FEC) entity 410 that communicates over the radio interface (Uu) 404, via logical channels 406, with a receiving Forward Error Correction (FEC) entity 430.
Re-Ordering/Duplicate Detection FIG. 15 is a re-ordering protocol or algorithm for enabling mobile stations 10 to delay decoding by the time-offset between different logical streams.

The receiving Forward Error Correction (FEC) entity 430 uses the sequence number to determine the position of a given PDU within the EP matrix. For example, a part of the sequence number (PSN) identifies the position of the PDU in the Encoder Packet (EP).

This algorithm assumes that, at most, date from two encoder packets (EP) are received before decoding can be initiated. In the description below, the Encoder Packet (EPd) is the next Encoder Packet (EP) in sequence to be decoded, and the Encoder Packet (EPb) is the Encoder Packet (EP) that is being buffered. The Encoder Packet (EPb) follows Encoder Packet (EPd). UE Implementations needing the full encoder packet transmission time to perform the RS decoding will need to do double-buffering in order to be able to decode sequential packets. The UE therefore stores at least n+k of the maximum size rows of the encoder matrix (k and n being respectively the number of information rows and the total number of rows including parity ones). A UE having a faster decoding engine can reduce this requirement, though no lower than n+1. For example, if the UE has a certain amount of buffer space (XtraBffr) beyond that needed to receive sequential packets based on its decoding capability, and if a 64 kbps stream is assumed, delaying the decoding by 100 ms without increasing the computational requirements would require an 800 byte increase in buffer size.

At block 1410, it can be determined whether a new Forward Error Correction (FEC) Protocol Data Unit (PDU) is received. If a new Forward Error Correction (FEC) Protocol Data Unit (PDU) is not received, then the process restarts at block 1410. If a new Forward Error Correction (FEC) Protocol Data Unit (PDU) is received, at block 1420 a determination can be made whether the new Forward Error Correction (FEC) Protocol Data Unit (PDU) belongs to the next Encoder Packet (EPd) in sequence to be decoded.

If the Forward Error Correction (FEC) Protocol Data Unit (PDU) does not belong to the next Encoder Packet (EP) in sequence to be decoded, then at block 1421, a determination can be made whether the Forward Error Correction (FEC) Protocol Data Unit (PDU) belongs to the Encoder Packet (EPb) that is being buffered. If the Forward Error Correction (FEC) Protocol Data Unit (PDU) does not belong to the Encoder Packet (EPb) that is being buffered, then at block 1440 the Protocol Data Unit (PDU) can be discarded. If the Forward Error Correction (FEC) Protocol Data Unit (PDU) does belong to the Encoder Packet (EPb) that is being buffered, then at block 1423 the Protocol Data Unit (PDU) can be added to the buffer of EPb in the associated position. At block 1425, it can be determined whether the amount of data for EPb exceeds XtraBffr. If at block 1426 it is determined that the amount of data for EPb does not exceed XtraBffr, then the process restarts at block 1410. If the amount of data for EPb exceeds XtraBffr, then at block 1428, the transmitting entity attempts to deliver complete SDUs from EPd. Then, at block 1430, the remainder of EPd can be flushed from the buffer, and at block 1434 EPb can be set to EPd.

If it is determined at block 1420 that the Forward Error Correction (FEC) Protocol Data Unit (PDU) belongs to EPd, then at block 1422, the Protocol Data Unit (PDU) can be added to the buffer of EPd in the associated position. At block 1424, it can be determined whether the buffer has k individual PDUs for EPd. If the buffer does not have k individual PDUs for EPd, then at block 1426, the process restarts at block 1410. If the buffer does have k individual PDUs for EPd, then at block 1427 the decoder performs outer decoding for EPd, and then at block 1428, the transmitting entity attempts to deliver complete SDUs from EPd. Then, at block 1430, the remainder of EPd can be flushed from the buffer, and at block 1434 EPb can be set to EPd.

Figure 16:
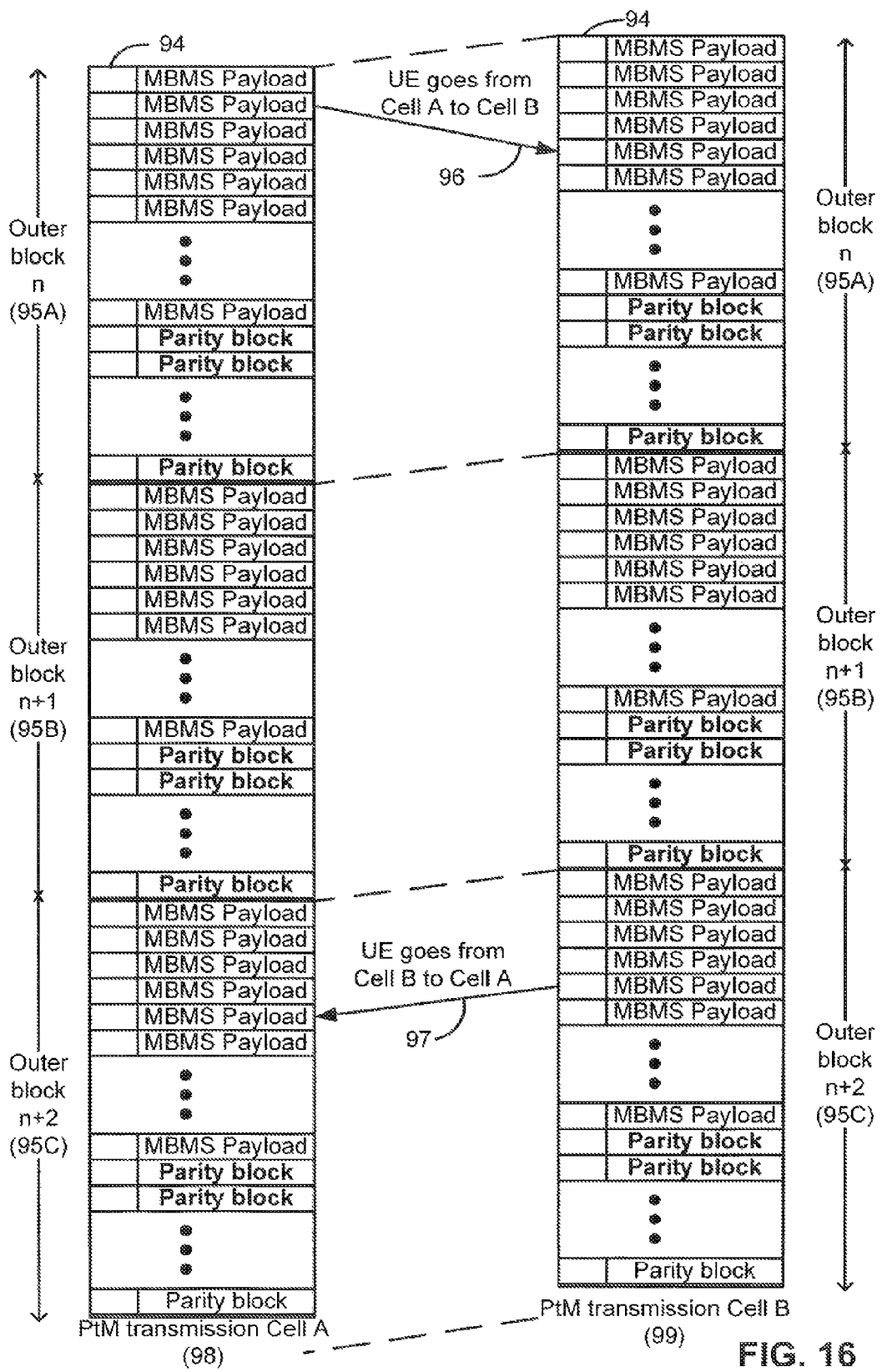
FIG. 16 is a diagram that shows a temporal relationship between outer code blocks received by a mobile station as the mobile station transitions between receiving a Point-To-Multipoint (PTM) transmission from cell A and another Point-To-Multipoint (PTM) transmission from cell B.

FIG. 16 is a diagram that shows a temporal relationship between outer code blocks received by a mobile station as the mobile station transitions between receiving a Point-To-Multipoint (PTM) transmission from cell A 99 and another Point-To-Multipoint (PTM) transmission from cell B 99. Some aspects of FIG. 16 are discussed further in United States Patent Applications US-2004-0037245-A1 and US-2004-0037246-A1 to Grilli, et al., filed Aug. 21, 2002, and United States Patent Application US-2003-0207696-A1 to Willenegger, et al, filed May 6, 2002, which are hereby incorporated by reference in their entirety.

The scenario depicted assumes certain UMTS Terrestrial Radio Access Network (UTRAN) 20 and User Equipment (UE) 10 requirements. For example, if the UTRAN 20 sends content using the same outer block coding across cells, then the same numbering should be used on blocks carrying the same data or payload in neighbor cells. Outer blocks of the same number have are transmitted relatively time-aligned. The maximum misalignment of PTM transmission across the cells is controlled by the Radio Network Controller (RNC) 24. The UTRAN 20 controls the delay jitter on Point-to-Multipoint (PTM) transmission across cells. The UE 10 should be capable of decoding as outer block while the next one is being received. Therefore, a buffer space is the UE should preferably accommodate at least two outer blocks 95A-95C since memory for one outer block is needed to accumulate the current outer block. Memory should also be capable of accumulating inner blocks of "rows" if the outer blocks during Reed-Solomon (RS) decoding, and to compensate for inaccuracies in the time alignment across base stations 22.

In cell A 98, during transmission of outer block n 95A, a transition occurs during transmission of the second inner Multimedia Broadcast and Multicast Service (MBMS) payload block. The slope of arrow 96, which illustrates the User Equipment (UE) 10 transition from cell A 98 to cell B 99, is non-horizontal since some time elapses during the transition. By the time the User Equipment (UE) 10 reaches cell B 99, the fifth block of Multimedia Broadcast and Multicast Service (MBMS) payload data is being transmitted. As such, the User Equipment (UE) 10 misses the second through fourth blocks due to the time misalignment of the respective transmissions and the time that elapses during the transition. If enough blocks are received in cell B 99, the outer block n 95A may nevertheless be decoded because the parity blocks can be utilized to reconstruct the missed blocks.

Later, during the transmission of outer block n+2 95C, the User Equipment (UE) 10 experiences another transition from cell B 99 to cell A 98, that occurs at the fifth inner Multimedia Broadcast and Multicast Service (MBMS) payload block of outer block n+2 95C. In this situation, fewer inner blocks are lost during the transition, and the outer blocks may still be recovered.

The use of outer code blocks can help reduce the likelihood of any service interruption. To ensure that the error recovery will work, the same blocks should be sent on each transmission path which means that the parity blocks should be constructed in the same way in each transmission path. (The Multimedia Broadcast and Multicast Service (MBMS) payload blocks are necessarily the same in each path since it is a broadcast transmission.) Performing Forward Error Correction (FEC) at the upper application layer 80 helps ensure that the parity blocks will be identical in each transmission path since the encoding is done in the Forward Error Correction (FEC) layer 157 and is therefore the same for each outer block. By contrast, if encoding is done in a lower layer, for example, at the individual Radio Link Control (RLC) entities 152, then some coordination is required since the parity blocks would be different in each transmission path.

Transition from Point-to-Multipoint (PTM) to Point-to-Point (PTP)

Figure 17:
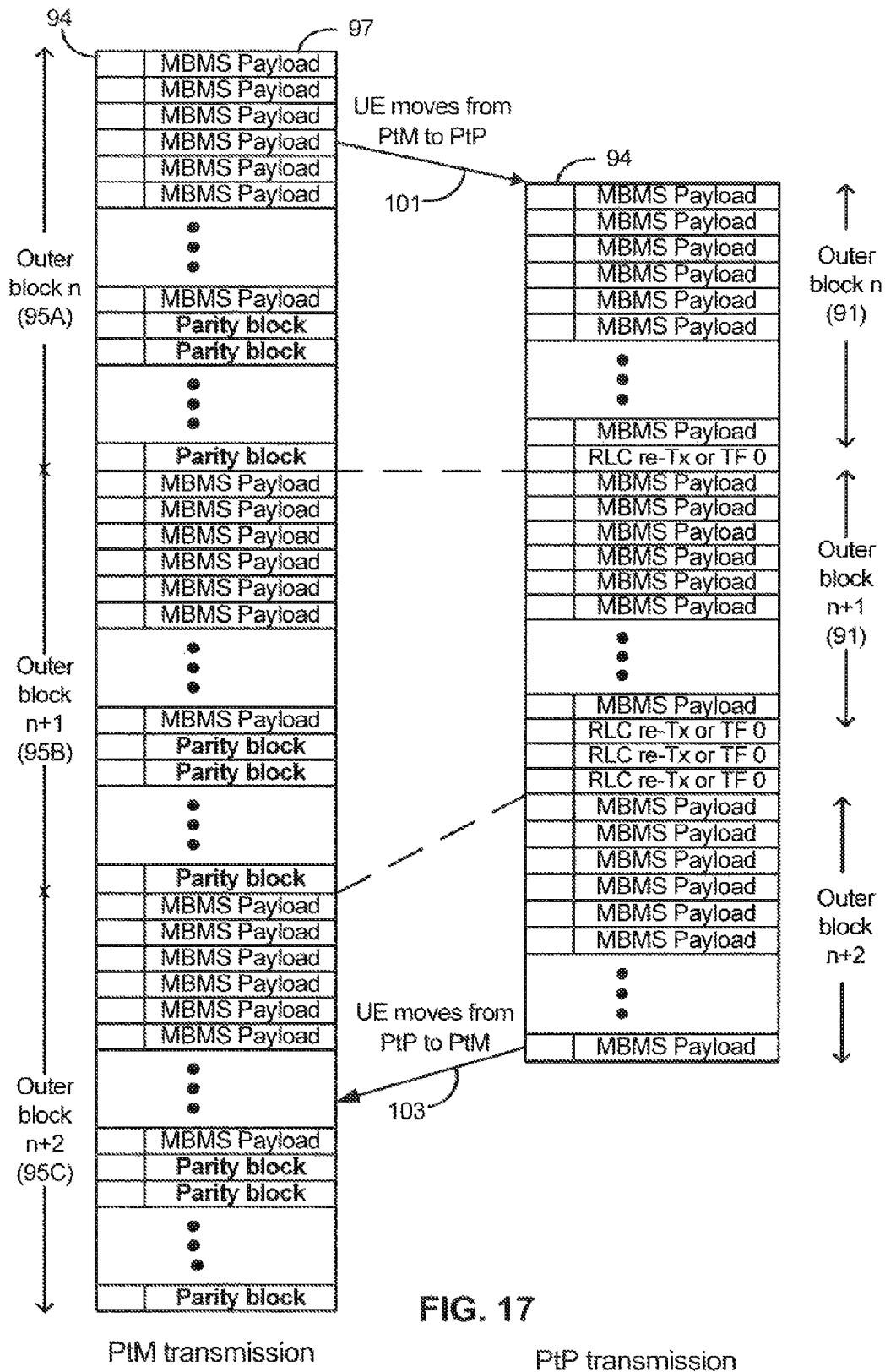
FIG. 17 is a diagram that shows a temporal relationship between outer code blocks received by a mobile station as a transition between a Point-To-Multipoint (PTM) transmission and a Point-To-Point (PTP) transmission occurs.

FIG. 17 is a diagram that shows a temporal relationship between outer code blocks received by a mobile station 10 as a transition between a Point-To-Multipoint (PTM) transmission and a Point-To-Point (PTP) transmission occurs. The scheme shown in FIG. 17 applies, for example, to systems that utilize Point-to-Point (PTP) transmissions, such as WCDMA and GSM systems.

An aspect of the present invention relates to forward error correction by adding parity information or blocks to inner MBMS "payload" or data blocks during PTM transmission. Each outer code block transmitted in a PTM transmission comprises at least one inner payload block and at least one of inner parity block. The error correcting capabilities of outer cods blocks can significantly reduce and tends to eliminate the loss of MBMS content or "payload" during transitions, such as when the UE moves from one cell to the other, or when the delivery of MBMS content changes from a PTM connection to a PTP connection in the same serving cell, and vice-versa.

As noted above, a given cell can transmit to a subscriber 10 using either a PTP or a PTM transmission scheme. For example, a cell that normally transmits a broadcast service in a PTM transmission mode may choose to set up a dedicated channel and transmit in a PTP mode (only to a certain subscriber 10) if the demand within that cell for the service falls below a certain threshold. Likewise, a cell that normally transmits content on a dedicated channel (PTP) to individual subscribers may decide to broadcast the content to multiple users over a common channel. In addition, a given cell might transmit content in PTP transmission mode whereas another cell might transmit the same content in a PTM transmission mode. A transition occurs when the mobile station 10 moves from one cell to another, or when the number of subscribers within a cell changes triggering a change in the transmission scheme from PTP to PTM or vice-versa.

During a Point-to-Multipoint (PTM) transmission of outer block n 95A, a transition occurs during transmission of the fourth inner Multimedia Broadcast and Multicast Service (MBMS) payload block. The slope of arrow 101, which illustrates the User Equipment (UE) transition from a Point-to-Multipoint (PTM) transmission to a Point-to-Point (PTP) transmission, is non-horizontal since some time elapses during the transition. When a transition from PTM 101 to PTP occurs, the over-the-air bit rate remains approximately the same. Point-to-Point (PTP) transmissions typically have a bit error rate of less than one percent (e.g., during transmission there is one error or less in every 100 payload blocks). By contrast, in Point-to-Multipoint (PTM) transmission a higher bit error rate can be assumed. For example, in one embodiment, the base station generates an outer block once for every 16 transmission time intervals (TTIs), and twelve of these TTIs can be occupied by payload blocks and four TTIs can be occupied by parity blocks. The maximum number of block errors that can be tolerated should be 4 inner blocks out of 16 (12 fundamental blocks +4 parity blocks). As such, the maximum tolerated block error rate would be ¼.

When the mobile station transitions 101 from a Point-to-Multipoint (PTM) transmission to Point-to-Point (PTP) transmission, some of the inner blocks can be lost. Assuming that Point-to-Multipoint (PTM) transmissions and Point-to-Point (PTP) transmissions have approximately the same bit rate at the physical layer (L1), then the PTP transmission will allow the MBMS payload blocks to be sent faster than PTM transmission since, on average, the percentage of retransmitted blocks would typically be lower than the percentage of parity blocks. In other words, Point-to-Point (PTP) transmissions are typically much faster than Point-to-Multipoint (PTM) transmissions since, statistically speaking, the number of parity blocks is much larger than the number of Radio Link Control (RLC) retransmissions (Re-Tx). Because the transition 101 is from a Point-to-Multipoint (PTM) transmission to Point-to-Point (PTP) transmission that is typically much faster, when the User Equipment (UE) 10 transitions 101 to a Point-to-Point (PTP) transmission, the first block of Multimedia Broadcast and Multicast Service (MBMS) payload data is being transmitted. As such, neither the time misalignment of the respective transmissions, nor the time that elapses during the transition 101, causes any of the blocks to be missed. Therefore, when moving from Point-to-Multipoint (PTM) transmission to Point-to-Point (PTP) transmission, the lost payload block may be made up by simply restarting from the beginning of the current outer block once the PTP link has been established on the target cell. The network can compensate by starting PTP transmission from the beginning of the same outer block, i.e. with the first inner block. The network can then recover the delay introduced by the transition due to the faster delivery of complete outer blocks. Reducing loss of data during transitions reduces interruptions in delivery of MBMS content that can be caused by such transitions.

Later, during the PTP transmission of outer block n+2, the User Equipment (UE) 10 undergoes another transition 103 to a Point-to-Multipoint (PTM) transmission mode. In FIG. 12, this transition 103 from Point-to-Point (PTP) to Point-to-Multipoint (PTM) occurs at the last inner Multimedia Broadcast and Multicast Service (MBMS) payload block of outer block n+2. In this situation, many of the inner Multimedia Broadcast and Multicast Service (MBMS) payload blocks in outer block n+2 have already been transmitted except for the last inner block. FEC is typically utilized in situations where feedback is not available. Because PTP transmissions utilize a dedicated channel, and therefore have feedback capability on the reverse link, use of FEC is not as beneficial. In order to minimize or eliminate the loss of data in the cross transitions, UMTS Terrestrial Radio Access Network (UTRAN) 20 preferably relies on the low residual block error rate of the RLC Acknowledged Mode (AM) in PTP transmission to recover all the inner blocks that could be lost during a transition to PTM transmission. In other words, normal layer 2 retransmissions can be utilized to retransmit any packets in which error(s) are detected in the original transmission. Thus, as shown in FIG. 17, parity blocks are not needed in PTP transmissions. If errors are present in the payload blocks during a Point-to-Point (PTP) transmission, the outer block may nevertheless be decoded because the Radio Link Control (RLC) layer will request retransmission of any erroneous blocks. That is, when there is an error during the PTP transmission, the mobile station 10 either requests retransmission (re-Tx) or when all of the blocks are correct, no retransmission takes place and a transport format zero (TF0) can be utilized. Outer coding is preferably done in layer 2 of the protocol stack so that the size of each inner block 97 fits exactly into one Transmission Timing Interval (TTI) since this can enhance coding efficiency.

If Forward Error Correction (FEC) outer coding is done at an upper layer of the protocol stack such as the application layer, then parity blocks will be sent regardless of the transmission scheme (Point-to-Point (PTP) or Point-to-Multipoint (PTM)). As such, parity blocks would also be appended to Point-to-Point (PTP) transmissions.

As noted above, in PTP transmission the use of parity blocks is not necessary, since more efficient retransmission schemes can be used in lieu of forward error correction. Since parity blocks are preferably not transmitted in PTP transmission, the delivery of a complete outer block can be on average faster than in PTM, assuming the same bit rate over the air. This allows the UE to compensate for the interruptions caused by the Point-to-Multipoint (PTM) to Point-to-Point (PTP) transitions, since the PTP transmission can be anticipated with respect to the PTM transmission. The User Equipment (UE) can recover the outer block correctly by combining (1) inner blocks received in Point-to-Point (PTP) transmission, either in the new cell or after transition, with (2) inner blocks received in Point-to-Multipoint (PTM) transmission, either in the old cell or before transition. The User Equipment (UE) can combine inner blocks received before the transitions and inner blocks received after the transition that belong to the same outer block. For example, User Equipment (UE) 10 can combine the inner Multimedia Broadcast and Multicast Service (MBMS) payload blocks in outer block n+2 that are received via Point-to-Point (PTP) transmission with the inner Multimedia Broadcast and Multicast Service (MBMS) payload blocks in outer block n+2 and parity blocks that are received via Point-to-Multipoint (PTM) transmission. UMTS Terrestrial Radio Access Network (UTRAN) 20 can facilitate this process by slightly "anticipating" the transmission of outer blocks to all the users that receive MBMS content from PTP links with respect to the transmission on PTM links.

Because the UTRAN anticipates the transmission of outer blocks with respect to the PTM transmission, "seamless" transitions from PTP to PTM are possible. As a result, delivery of MBMS content across cell borders and/or between different transmission schemes such as PTM and PTP is also "seamless." This "time anticipation," can be expressed in number of inner blocks. When the User Equipment (UE) 10 transitions to a PTM transmission, even if a communication link does not exist during the transition time, the User Equipment (UE) 10 can lose up to "time anticipation" number of inner blocks without compromising the QoS of the MBMS reception. If the UE starts MBMS reception directly in PTP, the UTRAN could apply the "time anticipation" immediately at the beginning of the PTP transmission since the UTRAN 20 can slowly anticipate the transmission of outer blocks by avoiding empty inner blocks (TF 0), until the anticipation reaches the required "time anticipation" number of inner blocks. From that point onward, UTRAN can keep the "time anticipation" constant.

In Point-to-Multipoint (PTM), UE specific feedback information available in the Radio Network Controller (RNC) can not be relied upon. In the Point-to-point (PTP) transmission, the UE 10 could inform the RNC of the number of last outer block correctly received before the transition. This should apply to any transition to PTP (from PTM or from PTP). If this feedback is not deemed acceptable, UTRAN 20 can estimate the last outer block that was most likely received by the User Equipment (UE) 10 before the state transition. This estimate could be based on the knowledge of the maximum time inaccuracy foreseeable between distinct cell transmissions, and based on the outer block currently being transmitted or that will soon be transmitted in the target cell.

The Forward Error Correction (FEC) can be performed so that any blocks lost during the transition can be recovered. This results in a "seamless" transition by reducing the likelihood that content will be lost during a transition. This scheme assumes that the transition from Point-to-Point (PTP) to Point-to-Multipoint (PTM) transmission occurs while the same outer block is being transmitted from each source, which typically occurs given the duration of an outer block with respect to the duration of a transition.

The amount of memory in the UE 10 can be traded off with the accuracy in the time alignment of PTM transmissions across neighboring cells. By relaxing the memory requirement in the User Equipment (UE) 10, the time accuracy of PTM UTRAN 20 transmissions can be increased.

Figure 18:
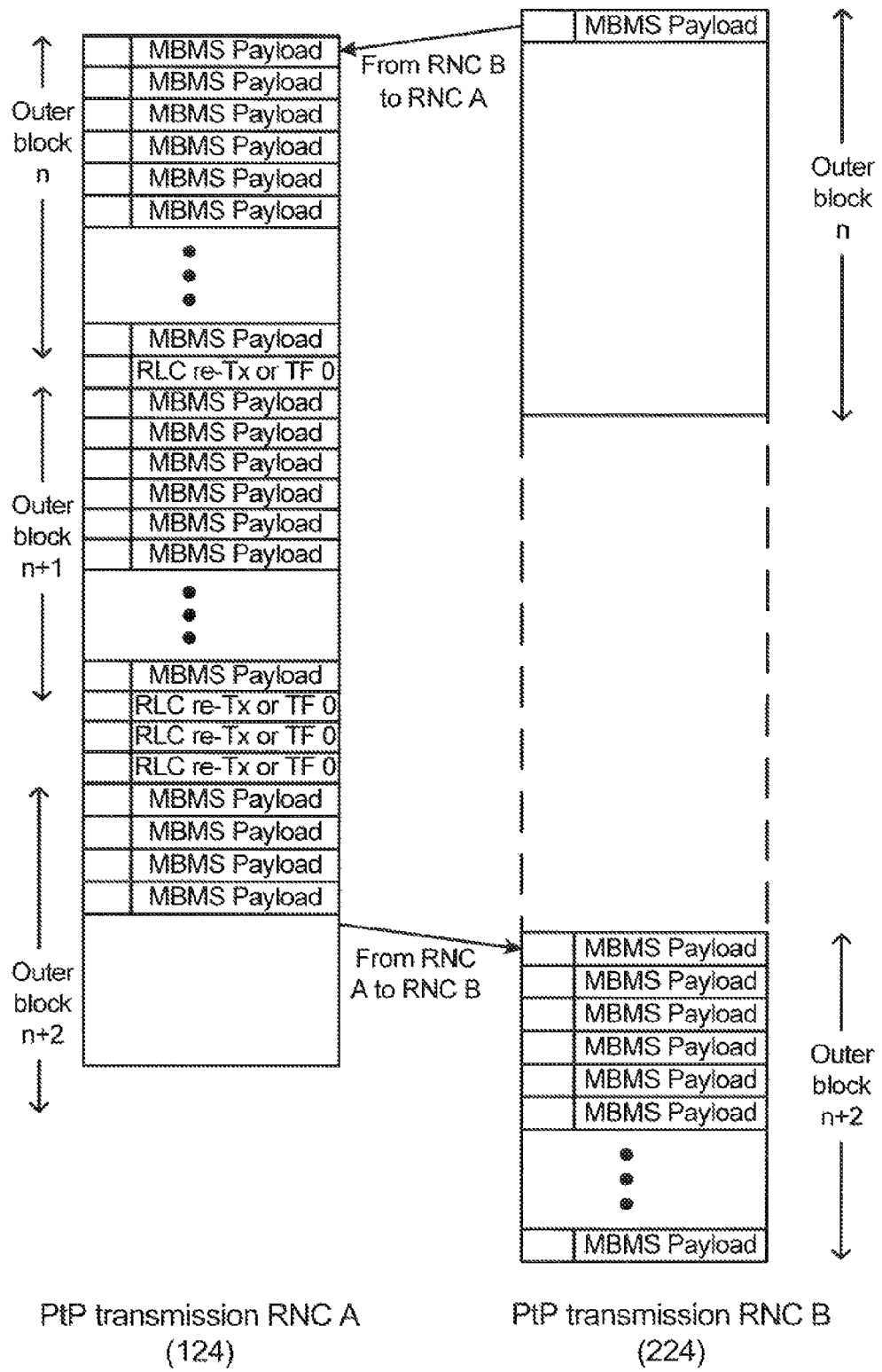
FIG. 18 is a diagram that shows a temporal relationship between outer code blocks received by a mobile station during a transition or relocation between a Point-To-Point (PTP) transmission from Radio Network Controller (RNC) A and another Point-To-Point (PTP) transmission from Radio Network Controller (RNC) B.

FIG. 18 is a diagram that shows a temporal relationship between outer code blocks received by a mobile station during a transition or relocation between a Point-To-Point (PTP) transmission from Radio Network Controller (RNC) A and another Point-To-Point (PTP) transmission from Radio Network Controller (RNC) B. The term RNC can be used interchangeably with the term "Base Station Controller (BSC)." During a "relocation" the User Equipment (UE) 10 transitions from a Point-to-Point (PTP) transmission of a content stream in an area controlled by a first RNC A 124 to Point-to-Point (PTP) transmission of the same content stream in an area controlled by a second RNC B 224. Retransmissions (re-Tx) can be used to compensate for any missed MBMS payload blocks. The direct transition from Point-to-Point (PTP) to Point-to-Point (PTP) between cells can be performed similarly to a Release '99 soft handover or hard handover. Even without coordination between the two RNCs A,B, the target RNC A 124 should be able to figure out the latest whole outer block received by the UE 10. This estimate could be based on the timing of the MBMS content received by the RNC 24 on the Iu interface 25. When using PTP transmission, the RNC 24 can make up an initial delay, and no part of the MBMS content will be lost even without requiring lossless SRNS relocation.

One skilled in the art will appreciate that although the flowchart diagrams can be drawn in sequential order for comprehension, certain steps can be carried out in parallel in an actual implementation. Furthermore, unless indicate otherwise, method steps can me interchanged without departing form the scope of the invention.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality can be implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium can be coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. For example, although the description specifies that the radio access network 20 can be implemented using the Universal Terrestrial Radio Access Network (UTRAN) air interface, alternatively, in a GSM/GPRS system, the access network 20 could be a GSM/EDGE Radio Access Network (GERAN), or in an inter-system case it could be comprise cells of a UTRAN air interface and cells of a GSM/EDGE air interface. Thus, the present invention is not intended to be limited to the embodiments shown herein but is to be accorded the widest scope consistent with the principles and novel features disclosed herein.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

What is claimed is:

1. A method of creating a variable row size outer code block having a plurality of rows, comprising:
   receiving rows of user information over a radio bearer, wherein the size of the rows of user information varies based on an application;
   once all rows of user information are received, determining a variable outer code block row size, based on the amount of user information received, wherein the size of the outer code block transmitted during a transmission timing interval varies based on the outer code block row size;
   segmenting and concatenating rows of user information to fit within variable-size outer code block rows;
   placing the rows of user information into outer code block rows to generate information blocks;
   adding at least one length indicator to each outer code block row to indicate that a row of user information ends within the outer code block row occupied by that information block, wherein the rows of user information fully occupy the plurality of outer code block rows, and wherein a encoder packet comprises the information blocks and length indicators;
   extracting a portion of each encoder packet to obtain extracted information;
   encoding the extracted information to generate rows of redundancy information;
   adding the rows of redundancy information to the encoder packet to generate an outer code block having the variable row size; and
   transmitting the encoder packet.

2. A method according to claim 1, wherein determining a variable outer code block row size, based on the amount of user information received, comprises:
   once all rows of user information are received or a determination is made that the outer code block is to be generated, determining a variable outer code block row size from a number of predetermined outer code block row sizes, based on the amount of user information received, that allows the portion of the outer code block occupied by non-user information to be minimized to thereby allow the user information rate to be reduced.

3. A method according to claim 1, wherein determining a variable outer code block row size, based on the amount of user information received, comprises:
   once all rows of user information are received, determining a variable outer code block row size, based on the amount of user information received, that allows the rows of user information to fully occupy the encoder packet, wherein the size of the outer code block that is transmitted during a transmission timing interval varies based on the outer code block row size.

4. A computer program product comprising a computer-readable medium including codes for causing a computer to:
- receive rows of user information over a radio bearer, wherein the size of the rows of user information varies based on an application;
- once all rows of user information are received, determine a variable outer code block row size, based on the amount of user information received, wherein the size of the outer code block transmitted during a transmission timing interval varies based on the outer code block row size;
- segment and concatenate rows of user information to fit within variable-size outer code block rows;
- place the rows of user information into outer code block rows to generate information blocks;
- add at least one length indicator to each outer code block row to indicate that a row of user information ends within the outer code block row occupied by that information block, wherein the rows of user information fully occupy the plurality of outer code block rows, and wherein a encoder packet comprises the information blocks and length indicators;
- extract a portion of each encoder packet to obtain extracted information;
- encode the extracted information to generate rows of redundancy information;
- add the rows of redundancy information to the encoder packet to generate an outer code block having the variable row size; and
- send the encoder packet.

5. The computer program product of claim 4, wherein the codes include codes for determining a variable outer code block row size, based on the amount of user information received, comprising:
- once all rows of user information are received or a determination is made that the outer code block is to be generated, determining a variable outer code block row size from a number of predetermined outer code block row sizes, based on the amount of user information received, that allows the portion of the outer code block occupied by non-user information to be minimized to thereby allow the user information rate to be reduced.

6. The computer program product of claim 4, wherein the codes include codes for determining a variable outer code block row size, based on the amount of user information received, comprising:
- once all rows of user information are received, determining a variable outer code block row size, based on the amount of user information received, that allows the rows of user information to fully occupy the encoder packet, wherein the size of the outer code block that is transmitted during a transmission timing interval varies based on the outer code block row size.

7. A communications apparatus for creating a variable row size outer code block having a plurality of rows, comprising:
- a memory;
- a processor module coupled to the memory, said processor module configured to:
  - receive rows of user information over a radio bearer, wherein the size of the rows of user information varies based on an application;
  - once all rows of user information are received, determine a variable outer code block row size, based on the amount of user information received, wherein the size of the outer code block transmitted during a transmission timing interval varies based on the outer code block row size;
  - segment and concatenate rows of user information to fit within variable-size outer code block rows;
  - place the rows of user information into outer code block rows to generate information blocks;
  - add at least one length indicator to each outer code block row to indicate that a row of user information ends within the outer code block row occupied by that information block, wherein the rows of user information fully occupy the plurality of outer code block rows, and wherein a encoder packet comprises the information blocks and length indicators;
  - extract a portion of each encoder packet to obtain extracted information;
  - encode the extracted information to generate rows of redundancy information;
  - add the rows of redundancy information to the encoder packet to generate an outer code block having the variable row size; and
- a transmitter module configured to send the encoder packet.

8. An apparatus in accordance with claim 7, wherein determining a variable outer code block row size, based on the amount of user information received, comprises:
- once all rows of user information are received or a determination is made that the outer code block is to be generated, determining a variable outer code block row size from a number of predetermined outer code block row sizes, based on the amount of user information received, that allows the portion of the outer code block occupied by non-user information to be minimized to thereby allow the user information rate to be reduced.

9. An apparatus in accordance with claim 7, wherein determining a variable outer code block row size, based on the amount of user information received, comprises:
- once all rows of user information are received, determining a variable outer code block row size, based on the amount of user information received, that allows the rows of user information to fully occupy the encoder packet, wherein the size of the outer code block that is transmitted during a transmission timing interval varies based on the outer code block row size.

* * * * *